US007145484B2

(12) United States Patent
Moriya et al.

(10) Patent No.: US 7,145,484 B2
(45) Date of Patent: Dec. 5, 2006

(54) DIGITAL SIGNAL PROCESSING METHOD, PROCESSOR THEREOF, PROGRAM THEREOF, AND RECORDING MEDIUM CONTAINING THE PROGRAM

(75) Inventors: Takehiro Moriya, Tokyo (JP); Noboru Harada, Tokyo (JP); Akio Jin, Tokyo (JP); Kazunaga Ikeda, Fujisawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/535,708

(22) PCT Filed: Nov. 20, 2003

(86) PCT No.: PCT/JP03/14814

§ 371 (c)(1), (2), (4) Date: May 20, 2005

(87) PCT Pub. No.: WO2004/047305

PCT Pub. Date: Jun. 3, 2004

(65) Prior Publication Data

US 2006/0087464 A1 Apr. 27, 2006

(30) Foreign Application Priority Data

Nov. 21, 2002 (JP) ............................ 2002-338131

(51) Int. Cl.
*H03M 7/30* (2006.01)

(52) U.S. Cl. .......................................... 341/76; 341/50

(58) Field of Classification Search ............ 341/50–82; 375/100–136

See application file for complete search history.

(56) References Cited

U.S. PATENT DOCUMENTS 5,884,269 A * 3/1999 Cellier et al. ............... 704/501

FOREIGN PATENT DOCUMENTS

| | | |
|---|---|---|
| EP | 1 292 036 | 3/2003 |
| JP | 10-116096 | 5/1998 |
| JP | 2000-216981 | 8/2000 |
| JP | 2000-307654 | 11/2000 |
| JP | 2001-144847 | 5/2001 |
| JP | 2002-232384 | 8/2002 |

OTHER PUBLICATIONS

T. Moriya: "Sampling Rate Scalable Lossless Audio Coding" 2000 IEEE Speech Coding Workshop Proceedings, Oct. 2002.

(Continued)

*Primary Examiner*—Lam T. Mai
(74) *Attorney, Agent, or Firm*—Oblon, Spivak, McClelland, Maier & Neustadt, P.C.

(57) ABSTRACT

A sample sequence ΔS similar to a first or last sample sequence of the current frame is extracted from its samples $S_{FC}$ and concatenated, as an alternative sample sequence AS, to each of the front and back of the current frame, and the current frame with the alternative sample sequence concatenated thereto is subjected to filtering or prediction coding to obtain processing result $S_{OU}$ of the current frame. In the case of prediction coding, auxiliary information, which indicates which part of the current frame was used as the alternative sample sequence, is also output. By this, filtering, autoregressive prediction coding and decoding, which require processing extending over preceding and succeeding frames as in an interpolation filter, can be concluded in the current frame with substantially no degradation of the continuity and coding efficient of the reconstructed signal.

4 Claims, 41 Drawing Sheets

OTHER PUBLICATIONS

C.R. Watkins et al: "Improving 16 KB/S G. 728 LD-CELP Speech Coder for frame Erasure Channels," IEEE, 1995, pp. 241-244, XP10625214 "No Month".

"A high quality low-complexity algorithm for packet loss concealment with G. 711," International Telecommunication Union, Sep. 1999, p. i-iii and 1-18, XP17400851.

E. Gündüzhan et al.: "A Linear Prediction Based Packet Loss Concealment Algorithm for PCM Coded Speech, "IEEE Transactions on Speech and Audio Processing, vol. 9, No. 8, Nov. 2001, pp. 778-785, XP11054140.

A Husain et al: "Reconstruction of Missing Packets for Celp-Based Speech Coders," IEEE 1995, pp. 245-248, XP10625215 "No Month".

D.J. Goodman et al.: "Waveform Substitution Techniques for Recovering Missing Speech Segments in Packet Voice Communications," ICASSP.Tokyo, 1986, pp. 105-108, XP615777 "No Month".

* cited by examiner

| n | $\alpha^{(n)}_1$ | $\alpha^{(n)}_2$ | | - - - - - - - - - | $\alpha^{(n)}_{p-1}$ | $\alpha^{(n)}_p$ |
|---|---|---|---|---|---|---|
| 0 | 0 | 0 | | - - - - - - - - - | 0 | 0 |
| 1 | $\alpha^{(1)}_1$ | 0 | | - - - - - - - - - | 0 | 0 |
| ⋮ | ⋮ | ⋮ | | | ⋮ | ⋮ |
| p-2 | $\alpha^{(p-2)}_1$ | $\alpha^{(p-2)}_2$ | $\alpha^{(p-2)}_3$ | - - - - - | 0 | 0 |
| p-1 | $\alpha^{(p-1)}_1$ | $\alpha^{(p-1)}_2$ | $\alpha^{(p-1)}_3$ | - - - - - | $\alpha^{(p-1)}_{p-1}$ | 0 |
| p | $\alpha^{(p)}_1$ | $\alpha^{(p)}_2$ | $\alpha^{(p)}_3$ | - - - - - | $\alpha^{(p)}_{p-1}$ | $\alpha^{(p)}_p$ |
| p+1 | $\alpha^{(p)}_1$ | $\alpha^{(p)}_2$ | $\alpha^{(p)}_3$ | - - - - - | $\alpha^{(p)}_{p-1}$ | $\alpha^{(p)}_p$ |
| ⋮ | ⋮ | ⋮ | ⋮ | | ⋮ | ⋮ |
| L-1 | $\alpha^{(p)}_1$ | $\alpha^{(p)}_2$ | $\alpha^{(p)}_3$ | - - - - - | $\alpha^{(p)}_{p-1}$ | $\alpha^{(p)}_p$ |

FIG. 19

| n | $k_1$ | $k_2$ | | $k_{p-1}$ | $k_p$ |
|---|---|---|---|---|---|
| 0 | 0 | 0 | - - - - - | 0 | 0 |
| 1 | $k_1$ | 0 | - - - - - | 0 | 0 |
| 2 | $k_1$ | $k_2$ | - - - - - | 0 | 0 |
| ⋮ | ⋮ | ⋮ | | ⋮ | ⋮ |
| p-1 | $k_1$ | $k_2$ | - - - - - | $k_{p-1}$ | 0 |
| p | $k_1$ | $k_2$ | - - - - - | $k_{p-1}$ | $k_p$ |
| p+1 | $k_1$ | $k_2$ | - - - - - | $k_{p-1}$ | $k_p$ |
| ⋮ | ⋮ | ⋮ | | ⋮ | ⋮ |
| L-1 | $k_1$ | $k_2$ | - - - - - | $k_{p-1}$ | $k_p$ |

FIG. 22

| n \ h | $h_0$ | $h_1$ | $h_2$ | $h_3$ | $h_4$ |
|---|---|---|---|---|---|
| 0 | $h_0$ | 0 | 0 | 0 | 0 |
| 1 | $h_0$ | $h_1$ | $h_2$ | 0 | 0 |
| 2 | $h_0$ | $h_1$ | $h_2$ | $h_3$ | $h_4$ |
| 3 | $h_0$ | $h_1$ | $h_2$ | $h_3$ | $h_4$ |
| ⋮ | ⋮ | ⋮ | ⋮ | ⋮ | ⋮ |
| L-3 | $h_0$ | $h_1$ | $h_2$ | $h_3$ | $h_4$ |
| L-2 | $h_0$ | $h_1$ | $h_2$ | 0 | 0 |
| L-1 | $h_0$ | 0 | 0 | 0 | 0 |

DIGITAL SIGNAL PROCESSING METHOD, PROCESSOR THEREOF, PROGRAM THEREOF, AND RECORDING MEDIUM CONTAINING THE PROGRAM

CROSS REFERENCE TO RELATED APPLICATION

This application is a national phase application based on on PCT/JP03/14814, filed on Nov. 20, 2003, the content of which is incorporated herein by reference.

TECHNICAL FIELD

The present invention relates to methods and apparatuses for frame-wise coding and decoding of digital signals and associated signal processing, programs therefor and a recording medium having recorded thereon the programs.

PRIOR ART

Frame-wise processing of digital signals of speech, image or the like frequently involves processing which extends over frames, such as prediction or filtering. The use of samples of preceding and succeeding frames increases the continuity of reconstructed speech or image and the compression coding efficiency thereof. In packet communications, however, samples of the preceding and succeeding frames may sometimes be unavailable, and in some cases it is required that processing be started from only a specified frame. In these cases the continuity of reconstructed speech or image and the compression coding efficiency decrease.

A description will be given first, with reference to FIG. 1, of coding and decoding methods that are considered as an example which partly utilizes digital signal processing to which the digital signal processing method of the present invention can be applied. (Incidentally, this example is not publicly known.)

A digital signal of a first sampling frequency from an input terminal 11 is divided by a frame dividing part 12 on a frame-by-frame basis, for example, every 1024 samples, and the digital signal for each frame is converted by a down-sampling part 13 from the first sampling frequency to a lower second sampling frequency. In this case, a high-frequency component is removed by low-pass filtering so as not to generate an aliasing signal by the sampling at the second sampling frequency.

The digital signal of the second sampling frequency is subjected to irreversible or reversible compression coding in a coding part 14, from which it is output as a main code Im. The main code Im is decoded by a local signal decoding part 15, and the decoded local signal of the second sampling frequency is converted by an up-sampling part 16 to a local signal of the first sampling frequency. Naturally enough, interpolation processing is performed in this instance. An error in the time domain between the local signal of the first sampling frequency and the branched digital signal of the first sampling frequency from the frame dividing part 12 is calculated in an error calculating part 17.

The error signal thus produced is provided to a prediction error signal generating part 51, wherein a prediction error signal of the error signal is generated.

The prediction error signal is provided to a compression coding part 18, wherein bits of its bit sequence are rearranged, and from which they are output intact as an error code Pe or after being subjected to reversible (Lossless) compression coding. The main code Im from the coding part 14 and the error code Pe are combined in a combining part 19, from which the combined output is provided in packetized form at an output terminal 21.

For the above-mentioned rearrangement of bit sequence and reversible compression coding, refer to, for example, JP Application Kokai Publication No. 2001-144847 Gazette (pages 6 to 8, FIG. 3), and for the packetizing, refer to, for example, T. Moriya and four others, "Sampling Rate Scalable Lossless Audio Coding," 2002 IEEE Speech Coding Workshop Proceedings 2002, October.

In a decoder 30 the code from an input terminal 31 is separated by a separating part 32 into the main code Im and the error code Pe, and the main code Im is irreversibly or reversibly decoded into a decoded signal of the second sampling frequency by decoding that corresponds to coding in the coding part 14 of the coder 10. The decoded signal of the second sampling frequency is up-sampled in an up-sampling part 34, by which it is converted to a decoded signal of the first sampling frequency. Naturally enough, interpolation processing is performed to raise the sampling frequency in this instance.

The separated error code Pe is decoded in a decoding part 35 to reconstruct the prediction error signal. A concrete configuration of the decoding part 35 and its processing are described, for example, in the above-mentioned official gazette. The sampling frequency of the reconstructed prediction error signal is the first sampling frequency.

The prediction error signal is subjected to prediction synthesis in a prediction synthesis part 63, by which the error signal is reconstructed. The prediction synthesis part 63 corresponds in configuration to the prediction error signal generating part 51 of the coder 10.

The sampling frequency of the reconstructed error signal is the first sampling frequency, and the error signal and the decoded signal of the first sampling frequency, provided from the up-sampling part 34, are added together in an adding part 36 to reconstruct the digital signal, which is supplied to a frame combining part 37. The frame combining part 37 concatenates such digital signals sequentially reconstructed frame by frame and provides the concatenated signal to an output terminal 38.

In each of the up-sampling parts 16 and 34 in FIG. 1, one or more 0-value samples are inserted into the sample sequence of the decoded signal every predetermined number of samples to provide a sample sequence of the first sampling frequency, and the sample sequence with the 0-value samples inserted therein is fed to an interpolation filter (usually a low-pass filter) formed by an FIR filter, such as shown in FIG. 2A, by which each 0-value sample is interpolated with one or more samples preceding and succeeding it. That is, the interpolation filter is composed of a series connection of delay parts D each having a delay equal to the period of the first sampling frequency; a zero-filled sample sequence x(n) is input to one end of the series connection of delay parts, then the inputs to and outputs from the delay parts D are multiplied by filter coefficients $h_1, h_2, \ldots, h_m$, respectively, in multiplying parts $\mathbf{22}_1$ to $\mathbf{22}_m$ and the multiplied outputs are added together in an adding part 23 to provide a filter output y(n).

As a result, the 0-value samples inserted into the solid-line sample sequence of the decoded signal, such as shown in FIG. 2B, become samples that have values linearly interpolated as indicated by the broken lines.

In such FIR filtering, each sample x(n) (where n=0, . . . , L−1) in the frame consisting of L samples as shown in FIG. 2C and samples at points T preceding and succeeding said each sample, that is, a total of 2T+1=m samples, are convoluted with the coefficient $h_n$ to obtain the output y(n), that is, by implementing the following calculation.

$$y(n)=\sum_{i=-T}^{T} h_{n-i}x(i) \tag{1}$$

Accordingly, the first output sample y(0) of the current frame is dependent on T samples x(−T) to x(−1) of the immediately preceding frame. Similarly, the last output sample y(L−1) of the current frame is dependent on T values x(L) to x(L+T−1) of the immediately succeeding frame. The multiplying parts 22$_1$ to 22$_m$ in FIG. 2A are referred to as filter taps and the number m of multiplying parts is referred to as the tap number.

In such a coding/decoding system as shown in FIG. 1, samples of the preceding and succeeding frames are known in almost all cases, but in the case of a packet loss during transmission or in the case of making random access (for reconstruction of speech or image signal at some midpoint) it may sometimes be required that information be concluded in each frame. In this instance, unknown values of the preceding and succeeding samples can be assumed as being zeros, but this scheme impairs the continuity and coding efficiency of the reconstructed signal.

In the prediction error generating part 51 of the coder 10 in FIG. 1, during autoregressive linear prediction, for example, as shown in FIG. 3A, the input sample sequence x(n) (the error signal from the error signal calculating part 17 in this example) is fed to one end of a series connection of delay parts D each having a delay equal to the sample period, while at the same time it is input to a prediction coefficient determining part 53. In the prediction coefficient determining part 53 a set of linear prediction coefficients, $\{\alpha_1, \ldots, \alpha_p\}$, is determined for each sample from a plurality of input samples and the output prediction error y(n) in the past such that the prediction error energy of the latter is minimized, then these prediction coefficients $\alpha_1, \ldots, \alpha_p$ are set in multiplying parts 24$_1$ to 24$_p$ for multiplying the outputs from the delay parts D corresponding to them, respectively, then the multiplied outputs are added together in an adding 25 to provide a prediction value, and in this example it is rendered by a rounding part 56 into an integer value. The prediction signal of this integer value is subtracted from the input sample by a subtracting part 57 to obtain a prediction error signal y(n).

In such autoregressive prediction processing, a sample at a point p preceding each sample x(n) (where n=0, . . . , L−1) in the frame consisting of L samples as shown in FIG. 3B is convoluted with the prediction coefficient $\alpha_1$ to obtain a prediction value, and the prediction value is subtracted from the sample x(n) to obtain the prediction error signal y(n); that is, the following equation is calculated.

$$y(n)=x(n)-\left[\sum_{i=1}^{p} \alpha_i x(n-i)\right] \tag{2}$$

In the above [*] represents rounding of the value *, for example, by omitting fractions. Accordingly, the first prediction error signal y(0) of the current frame is dependent on p input samples x(−p) to x(−1) of the immediately preceding frame. Incidentally, no rounding is required in the coding that allows distortion. The rounding may be done during calculation.

In the prediction synthesis part 63 of the decoder 30 in FIG. 1, during autoregressive prediction synthesis, for example, as shown in FIG. 4A, the input sample sequence y(n) (the prediction error signal reconstructed in the decoding part 35 in this example) is fed to an adder 65, from which a prediction synthesis signal x(n) is output as will be understood later on, and the prediction synthesis signal x(n) is fed to one end of a series connection of delay parts D each having a delay equal to the sample period of the sample sequence of the prediction synthesis signal, while at the same time it is input to a prediction coefficient determining part 66. The prediction coefficient determining part 66 determines prediction coefficients $\alpha_1, \ldots, \alpha_p$ so that the error energy between a prediction error signal x'(n) and the prediction synthesis signal x(n) is minimized, and the prediction coefficients $\alpha_1, \ldots, \alpha_p$ are set in multiplying parts 26$_1$ to 26$_p$ for multiplying the outputs from the delay parts D corresponding to them, respectively, and the multiplied outputs are added together in an adding part 27 to generate a prediction signal. The prediction signal thus obtained is rendered by a rounding part 67 into an integer, then the prediction signal x(n)' of the integer value is added in an adding part 65 to the input prediction error signal y(n) to provide the prediction synthesis signal x(n).

In such autoregressive prediction synthesis, the prediction value is obtained by convoluting a sample at a point p preceding each input sample y(n) (where n=0, . . . , L−1) in a frame consisting of L samples as shown in FIG. 4B with the prediction coefficient $\alpha_1$, and the prediction value is added to the prediction error signal y(n), that is, the following equation is calculated, to obtain the prediction synthesis signal x(n).

$$x(n)=y(n)+\left[\sum_{i=1}^{p} \alpha_i x(n-i)\right] \tag{3}$$

Accordingly, the first prediction synthesis sample x(0) of the current frame is dependent on p prediction synthesis samples x(−p) to x(−1) of the immediately preceding frame.

As described above, autoregressive prediction processing and prediction synthesis processing require input samples of the preceding frame and prediction synthesis samples of the preceding frame; in such a coding/decoding system as shown in FIG. 1, when it is required, in the case of a packet loss or random access, that information be concluded in the frame, all unknown values of preceding samples can be assumed as being zeros, but this scheme degrades the continuity and the prediction efficiency.

In JP Application Kokai Publication No. 2000-307654 there is proposed a scheme by which, in a conventional voice packet transmission system in which a speech signal is transmitted in packet form only during a speech-active duration but no packet transmission takes during a silent duration and at the receiving side a pseudo background noise is inserted in the silent duration, discontinuity of level between the speech-active duration and the silent duration is corrected to thereby prevent a conversation from starting or ending with a feeling of unnaturalness. According, to this scheme, at the receiving side an interpolation frame is inserted between a decoded speech frame of the speech-active duration and a pseudo background noise frame; in the case of using a hybrid coding system, filter coefficients or noise codebook index of the speech-active duration is used as the interpolation frame, and the gain coefficient used is one that takes an intermediate value of the background noise gain.

With the scheme set forth in the above-mentioned Japanese Application Kokai Publication No. 2000-307654, the speech signal is transmitted only during the speech-active duration, and the beginning and end of the speech-active duration are processed in the state in which preceding and succeeding frames do not exist originally.

In the processing for each frame, in the case of using a scheme that enhances the continuity, quality and coding efficiency of the reconstructed signal by processing the current frame through utilization of samples preceding and succeeding the current frame, it is desirable that degradation of the continuity, quality and coding efficiency be suppressed even if preceding and succeeding frames are unavailable at the receiving side (at the decoding side), or that even if only one frame is processed independently of other frames, the continuity, quality and efficiency can be provided ay substantially the same level as in the case where the preceding and succeeding frames are present. Such signal processing according to the present invention is applicable not only to part of coding processing for transmission or storage of a digital signal by coding it on a frame-by-frame basis and to part of decoding of a received code or code read out of a storage unit but also generally to frame-wise digital signal processing intended to provided enhanced quality and efficiency by utilization of samples of preceding and succeeding frames as well.

In other words, an object of the present invention it to provide a digital signal processing method, processor and program which, in the frame-wise processing of a digital signal by use of samples of its current frame alone, make it possible to achieve performance (continuity, quality, efficiency, etc.) substantially equal to that obtainable with the use of samples of preceding or/and succeeding frames as well.

DISCLOSURE OF THE INVENTION

A method for processing a digital signal on a frame-wise basis according to the invention of claim 1, comprises the steps of:

(a) modifying a sample sequence of a frame neighboring its first sample and/or a sample sequence of said frame neighboring its last sample in accordance with a consecutive-sample sequence consisting of consecutive samples forming part of said frame, thereby forming a modified sample sequence; and (b) processing a series of sample sequence of said frame over said modified sample sequence.

The digital signal processing method according to the invention of claim 2 is a modification of the method of claim 1, wherein said step (a) includes a step of concatenating an alternative sample sequence, formed by using said series of sample sequences, to the front of the first sample of said frame and/or to the back of the last sample of said frame, thereby forming said modified sample sequence.

The digital signal processing method according to the invention claim 3 is a modification of the method of claim 2, wherein said step (a) includes a step of providing said alternative sample sequence by reversing the order of arrangement of samples of said consecutive-sample sequence.

The digital signal processing method according to the invention of claim 4 is a modification of the method of any one of claims 1, 2 and 3, wherein said step (a) of modifying a partial sample sequence in said frame containing the first sample and/or partial sample sequence in said frame containing the last sample by a calculation with said consecutive-sample sequence, thereby forming said modified sample sequence.

The digital signal processing method according to the invention of claim 5 is a modification of the method of claim 4, wherein said step (a) includes a step of concatenating a predetermined fixed sample sequence to the front of the first sample of said frame and/or to the back of said last sample.

The digital signal processing method according to the invention of claim 8 is a modification of the method of claim 2 or 3, which further comprises a step of providing, as a part of a code for the digital signal of said frame, auxiliary information indicating any one of a plurality of methods for using said consecutive-sample sequence as said alternative sample sequence and/or indicating the position of said consecutive-sample sequence The digital signal processing method according to the invention of claim 9 is a modification of the method of claim 1, wherein:

said step (a) includes: a step of retrieving a sample sequence similar to a leading sample sequence or rear-end sample sequence of said frame and using said similar sample sequence as said consecutive-sample sequence; and a step of multiplying said similar sample sequence by a gain and the multiplied output is subtracted from said leading or rear-end sample sequence to form said modified sample sequence;

said step (b) a step of performing said processing to calculate a prediction error of the digital signal of said frame; and a step of providing, as a part of a code of said frame, auxiliary information indicating the position of said similar sample sequence in the frame and said gain.

The digital signal processing method according to the invention of claim 10 is a modification of the method of claim 1, wherein said step (a) includes the steps of:

(a-1) reconstructing the sample sequence of said frame by autoregressive prediction synthesis from a prediction error signal obtained from a code, and replicating said consecutive-sample sequence at the position in said frame specified by auxiliary information provided as part of said code; and (a-2) multiplying said replicated sample sequence by a gain in said auxiliary information and adding the multiplied output to the first or last sample sequence of said frame to provide said modified sample sequence.

A digital signal processing method according to the invention of claim 11 is a method that performs filter or prediction processing of a digital signal on a frame-wise basis, the method comprising the step of:

(a) processing said digital signal by use of a tap number of prediction order dependent only on usable samples in a frame without using samples preceding a first sample of said frame and/or samples succeeding a last sample of said frame.

The digital signal processing method according to the invention of claim 15 is a modification of the method of claim 14, wherein said autoregressive linear prediction error generation processing is an operation using PARCOR coefficients.

A digital signal processing method according to the invention of claim 16 is a method that is used in frame-wise coding of an original digital signal and performs processing by use of samples of a frame preceding or/and succeeding the frame concerned, the method comprising the step of:

coding the first sample sequence of the frame concerned or the last sample sequence of said preceding frame separately of coding of said frame concerned, and providing auxiliary information as part of the code of said frame concerned.

A digital signal processing method according to the invention of claim 19 is a method that is used in frame-wise decoding of an encoded code of an original digital signal and performs processing by use of samples of a frame preceding or/and succeeding the frame concerned, the method comprising the step of:

(a) decoding an auxiliary code of said frame to obtain a first sample sequence of said frame or the last sample sequence of the preceding frame; and (b) processing, for said frame, said first or last sample sequence as a decoded sample sequence at the end of the preceding frame.

A digital signal processor according to the invention of claim 22 is a processor for processing a digital signal on a frame-wise basis, the processor comprising:

means for forming a modified sample sequence by modifying a sample sequence of a frame neighboring its first sample and/or a sample sequence of said frame neighboring its last sample by using a consecutive-sample sequence consisting of consecutive samples forming part of said frame; and means for processing said digital signal over said modified sample sequence.

The digital signal processor according to the invention of claim 23 is a modification of the processor of claim 22, wherein:

said modified sample sequence forming means includes: means for generating, as an alternative sample sequence, a consecutive-sample sequence consisting of consecutive samples forming part of the frame; and means for concatenating said alternative sample to at least one of the front of the first sample of the digital signal of the frame concerned and the back of the last sample of said digital signal of said frame; and said processing includes means for performing linear coupling of the digital signal having concatenated hereto said alternative sample sequence.

The digital signal processor according to the invention of claim 24 is a modification of the processor of claim 22, wherein:

said modified sample sequence forming means includes: means selecting a consecutive-sample sequence, which consists of consecutive samples forming part of said frame, similar to the first or last sample sequence of the frame; means for multiplying said selected consecutive-sample sequence by a gain; and means for subtracting said gain-multiplied consecutive-sample sequence from the first or last sample sequence of said frame; and said processing means includes: means for generating a prediction error of the digital signal of said subtracted frame by autoregressive prediction; and means for providing, as a part of code of the current frame, auxiliary information indicating the position of said consecutive-sample sequence in said frame and said gain.

The digital signal processor according to the invention of claim 25 is a modification of the processor of claim 22, which further comprises:

means for reconstructing a sample sequence of one frame by autoregressive synthesis filter on the basis of a prediction error signal obtained from a code; means for extracting the consecutive-sample sequence from said reconstructed sample sequence on the basis of position signal in auxiliary information used as a part of a code of said frame; means for multiplying said extracted consecutive-sample sequence by a gain contained in said auxiliary information; means for forming said modified sample sequence by adding said gain-multiplied consecutive-sample sequence to the first or last sample sequence of said reconstructed sample sequence; and said processing means is means for performing autoregressive prediction synthesis for the digital signal over said modified sample sequence.

A readable recording medium, which has recorded a computer-executable program for implementing said digital signal processing method according to the present invention, is also included in the present invention.

According to the inventions of claims 1 and 22, the digital signal processing is performed extending over a modified sample sequence, by which it is possible to suppress discontinuity of a reconstructed signal due to a sharp change of the first or last sample of the current frame and hence improve the quality of the reconstructed signal.

According to the inventions of claims 2 and 23, an alternative sample sequence consisting of samples of only the current frame is concatenated to the frame, by which it is possible to achieve processing equivalent to digital signal processing that extends over the preceding and succeeding frames.

According to the invention of claim 3, the alternative sample sequence is formed by reversing the order of arrangement of the sample of a sample sequence, by which it is possible to increase the symmetry at the head and end of the frame, providing for increased continuity.

According to the invention of claim 4, a sample sequence in the current frame is used as high-reliability data, by which the first or last sample sequence of the frame can be modified through calculation.

According to the invention of claim 5, the digital signal processing can be simplified by using a fixed sample sequence as the alternative sample sequence.

According to the invention of claim 8, the optimum alternative sequence generating method is selected, and/or information on the position of the sample sequence used is sent to the receiving side, enabling it to achieve reconstruction with less distortion.

According to the inventions of claims 9 and 24, by modifying a sample sequence of the frame neighboring its first or last sample by using a sample sequence similar to the lading or rear-end sample sequence of the frame, it is possible to flatten the leading portion or rear-end portion of the signal and hence provide increased continuity.

According to the inventions of claims 10 and 25, at the decoding side a sample sequence of the position specified by auxiliary information to modify the first or last sample sequence by a specified gain, by which it is possible to implement processing that corresponds to the processing t the transmitting side.

According to the invention of claim 11, by performing digital signal processing while changing the tap number or prediction order according to the number of usable samples at each sample position in the frame, processing can be concluded within the frame.

According to the invention of claim 15, the use of the PARCOR coefficient permits reduction of the computational complexity involved.

According to the invention of claim 16, the first or last sample sequence of the frame is prepared separately as auxiliary information, which can be used as an alternative sample sequence immediately at the occurrence of a frame dropout at the receiving.

According to the invention of claim 19, the first sample sequence of the frame or the last sample sequence of the preceding frame, received as auxiliary information, is used as an alternative sample sequence, by which it is possible to facilitate random access to the frame.

BRIEF DESCRIPTION OF THE FRAWINGS

FIG. 19 is a table showing setting of prediction coefficients in Embodiment 6.

FIG. 22 is table showing setting of coefficients in Embodiment 9.

BEST MODE FOR CARRYING OUT THE INVENTION

First Mode of Working

Figure 5A:
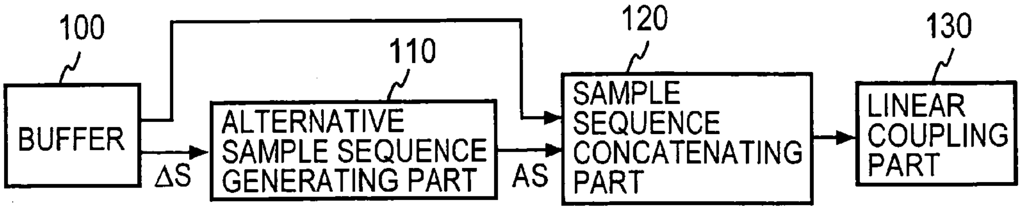
FIG. 5A is a block diagram illustrating an example of the functional configuration of a first embodiment.
Figure 5B:
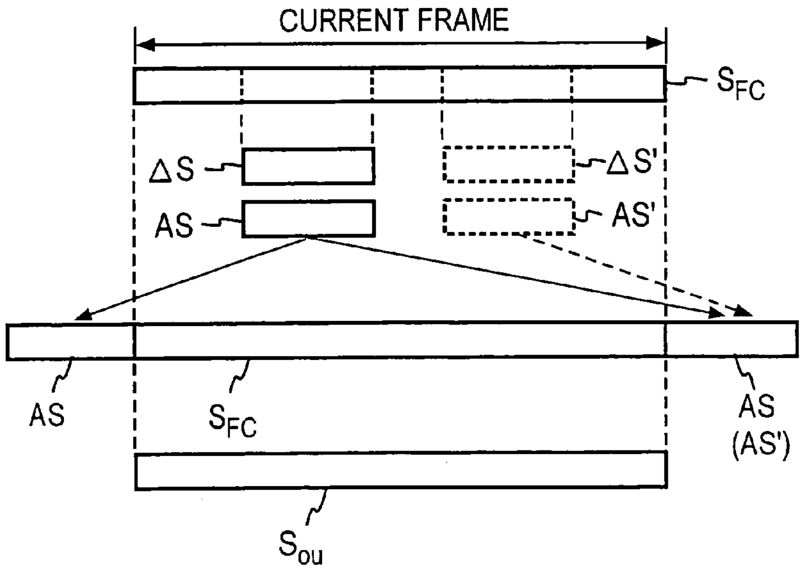
FIG. 5B is a diagram explanatory of its processing.

In the first mode of working of the present invention, as shown in FIGS. 5A and 5B, a sample sequence ΔS consisting of consecutive samples which form part of a digital signal (a sample sequence) $S_{FC}$ of one frame, for example, stored in a buffer 100, that is, the sample sequence ΔS in the buffer 100, is read out intact by an alternative sample sequence generating part 110, which outputs the sample sequence ΔS intact, or processes it as required, to provide an alternative sample sequence AS, then the alternative sample sequence AS is provided to a sample sequence concatenating part 120, wherein it is concatenated to the front of the lead sample of the current frame FC in the buffer 100 and the back of the last sample of the current frame FC, respectively, and the resulting concatenated sample sequence PS (=AS+$S_{FC}$+AS, hereinafter referred to as a processed sample sequence) is provided to a linear coupling part 130, such as an FIR filter, wherein it is subjected to linear coupling. Of course, the alternative sample sequences AS need not always to be pre-concatenated directly to the current frame in the buffer 100 to form a series of processed sample sequences, but instead the alternative sample sequence AS to be concatenated to the current frame FC may be stored in the buffer 100 independently of the current-frame sample sequence so that they are read out in a sequential order AS-$S_{FC}$-AS.

As indicated by the broken lines in FIG. 5B, the alternative sample sequence AS to be concatenated to the back of the end sample of the frame may be a sample sequence ΔS' which consists of consecutive samples different from those of the sample sequence ΔS of the current-frame digital signal $S_{FC}$ and is used as an alternative sample sequence AS' for concatenation. According to the contents of processing by the linear coupling part 130, the alternative sample sequence AS needs only to be concatenated to the front of the lead sample or the back of the last sample alone.

In the linear coupling part 130 samples of the preceding and succeeding frames are required, but a sample sequence consisting of samples forming part of the current frame is replicated and used as an alternative sample sequence in place of the required sample sequence of the preceding or succeeding frame; by this scheme, a processed digital signal (a sample sequence) $S_{OU}$ of one frame can be obtained with only the current-frame sample sequence $S_{FC}$ without using samples of the preceding and succeeding frames. In this instance, since the alternative sample sequence is formed by samples forming part of the current-frame sample sequence $S_{FC}$, the continuity, quality and coding efficiency of the reconstructed signal become higher than in the case where the alternative sample sequences concatenated to the front and back of the current frame are processed as zeros.

Embodiment 1

A description will be given of Embodiment 1 in which the first mode of working is applied to the FIR filtering shown in FIG. 2A.

Figure 6A:
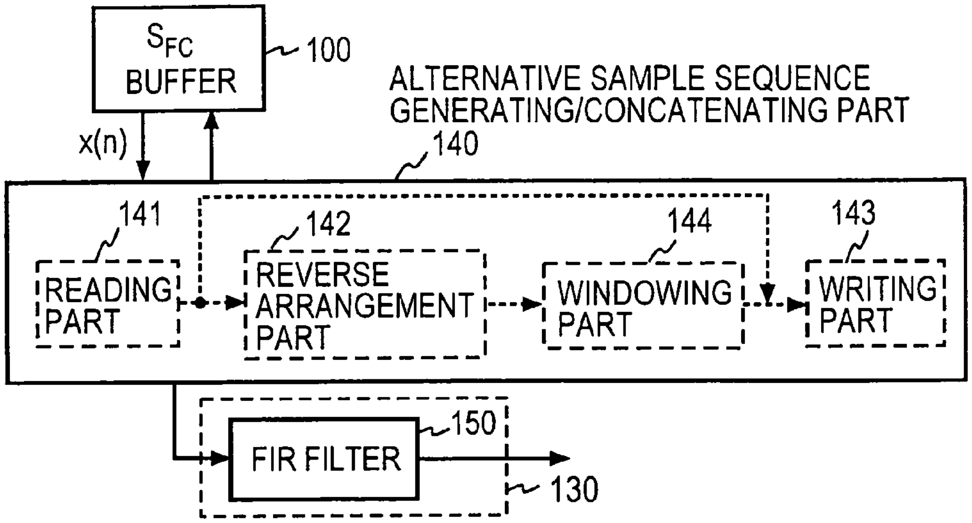
FIG. 6A is a block diagram illustrating an example of the functional configuration of a digital signal processor according to Embodiment 1.
Figure 6B:
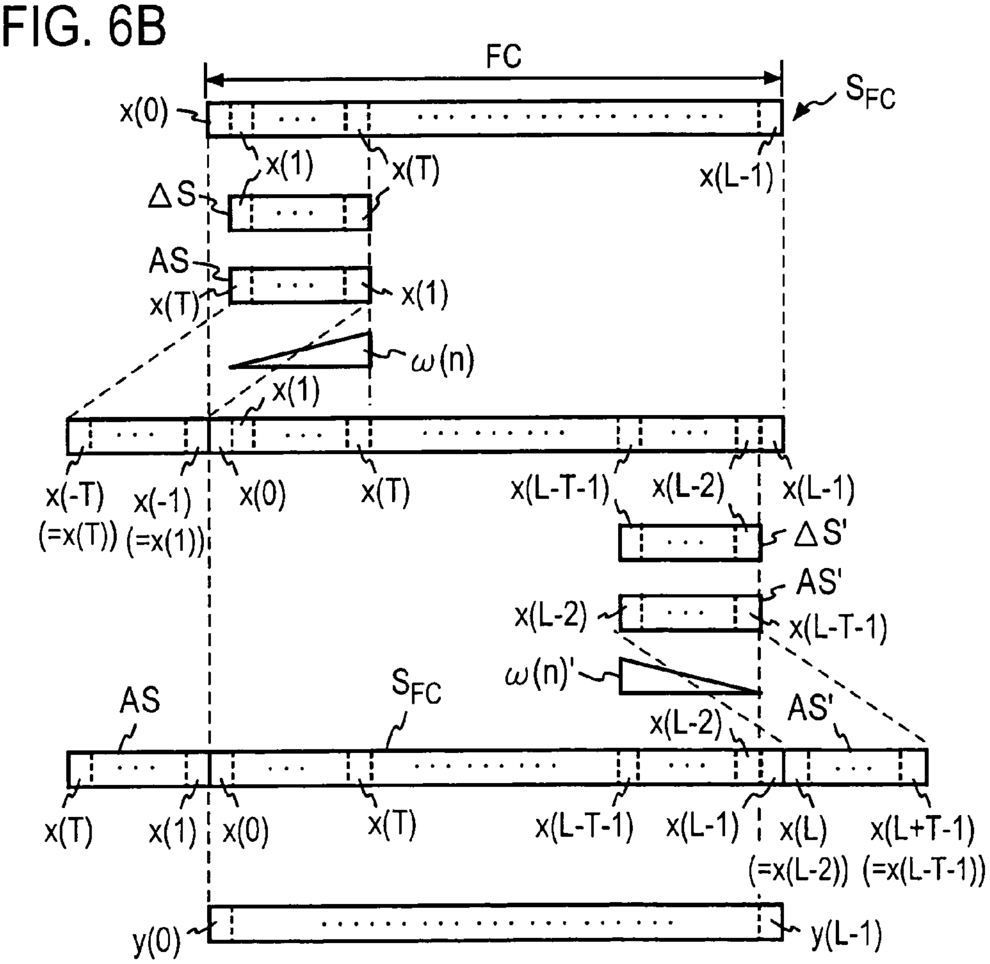
FIG. 6B is a diagram explanatory of its processing.

In the buffer 100 in FIG. 6A there is stored a digital signal (a sample sequence) $S_{FC}$ of the current frame shown in FIG. 6B. Each sample of the digital signal $S_{FC}$ will hereinafter be identified by x(n) (where n=0, . . . , L−1). By a reading part 141 in the alternative sample sequence generating/concatenating part 140, T samples, x(1) second from the forefront to x(T) of the current frame FC, are read out from the buffer 100 as a sample sequence ΔS consisting of T consecutive samples forming part of the current frame, and the T-sample sequence ΔS is provided to a reverse arrangement part 142, wherein the order of sequence is reversed to provide a sample sequence, x(T), . . . , x(2), x(1), as an alternative sample sequence AS. The alternative sample sequence AS is stored by a writing part 143 in the buffer 100 so that it is concatenated to the front of the lead sample x(0) of the frame FC of the digital signal $S_{FC}$ in the buffer 100.

By the reading part 141, T samples x(L−T−1) to x(L−2) preceding the last sample x(L−1) are read out of the buffer 100 as the sample sequence ΔS' consisting of consecutive samples forming part of the current frame, then the sample sequence ΔS' is rearranged in a reverse order in a reverse arrangement part 142, from which the samples x(L−2), x(L−3), . . . , x(L−T−1) are provided as an alternative sample sequence AS', and the alternative sample sequence AS' is stored by the writing part 143 in the buffer 100 so that it is concatenated to the last sample x(L−1) of the current frame.

Thereafter, a sequence of processed samples n=−1 to n=L+T−1, that is, x(−T), . . . , x(−1), x(0), x(1), . . . , x(L−2), x(L−1), x(L), . . . , x(L+T−1), is read out by the reading part 141 from the buffer 100 and supplied to an FIR filter 150. The filter provides its filtered output y(0), . . . , y(L−1). In this example, the alternative sample sequence AS consists of the forward samples in the frame FC arranged symmetrically with respect to the first sample x(0), and the alternative sample sequence AS' similarly consists of the samples in the frame FC arranged symmetrically with respect to the last sample x(L−1). In the forward and rearward end portions of the filter output, signal waveforms are symmetrical about the first and last samples x(0) and x(L−1), respectively, and hence frequency characteristics in front of and behind each of the first and the last samples bear similarity to each other; therefore, it is possible to obtain filter outputs y(0), . . . , y(L−1) which are smaller in variations of their frequency characteristics than in the case of the alternative sample sequences AS and AS' being used and consequently smaller in errors than in the case where the preceding and succeeding frames are present.

Incidentally, in a windowing part 144 indicated by the broken line in FIG. 6A, the waveform may be blunted by multiplying the alternative sample AS by a window function ω(n) whose weight decreases with distance from the first sample x(0) forwardly thereof; similarly, the waveform may be blunted by multiplying the alternative sample sequence AS' by a window function ω(n)' whose weight decreases with distance from the last sample x(L−1) rearwardly thereof.

As regards the alternative sample sequence AS', the sample sequence ΔS' prior to the reverse arrangement may be multiplied by the window function ω(n).

The configuration of FIG. 6A has been described above for use in the case where the processed sample sequence PS is generated by adding the alternative sample sequences AS and AS' to the current frame in the buffer 100 and the thus generated processed sample sequence PS is read out and fed to the FIR filter 150. As is evident from the above, however, since it is essential only that the alternative sample sequences AS and AS', generated from the sample sequences forming different parts of the current frame, respectively, and the current-frame sample sequence $S_{FC}$ be subjected to FIR filtering in a sequential order AS-$S_{FC}$-AS', the processed sample sequence PS added with the alternative sample sequences AS and AS' need not always be generated in the buffer 100, in which case samples of the current frame FC may be taken out one by one in the order [sample sequence ΔS–current-frame sample sequence $S_{FC}$-sample sequence ΔS'] and fed to the FIR filter 150.

Figure 7:
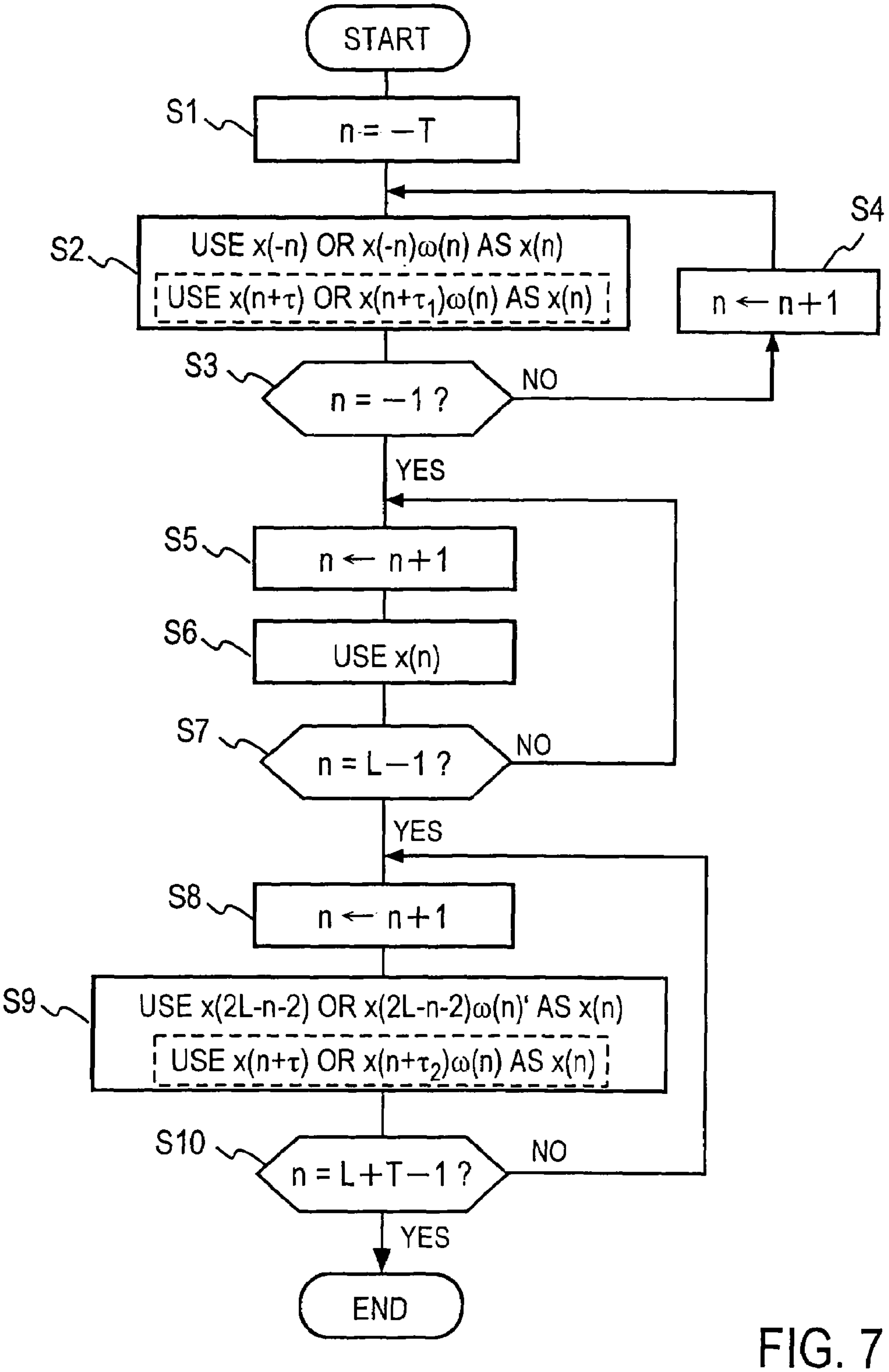
FIG. 7 is a diagram showing an example of the procedure of a digital signal processing method according Embodiment 1.

For example, as shown in FIG. 7, n=−T is initially set (S1), then x(−n) is read out from the buffer 100 and provided intact to the FIR filter 150, or if necessary, it is multiplied by the window function ω(n) to obtain x(n), which is fed to the FIR filter (S2), then a check is made to see if n=−1 (S3), and if not, then n is incremented by one, followed by a return to step S2 (S4). If n=−1, n is incremented by one (S5), then x(n) is read out from the buffer 100 and fed to the FIR filter 150 (S6), then a check is made to see if n=L−1, and if not, the procedure returns to step S5 (S7). If n=L−1, then n is incremented by one (S8), then x(2L−n−2) is read out from the buffer 100 and fed intact to the FIR filter, or if necessary, it is multiplied by the window function ω(n)' to provide x(n), which is fed to the FIR filter (S9), after which a check is made to see if n=L+T−1), and if not, the procedure returns to step S8, and if n=L+T−1, the procedure ends (S10).

Embodiment 2

A description will be given of Embodiment 2 in which the first mode of working of the invention is applied to the FIG. 2A configuration. In this embodiment the sample sequence ΔS, which consists of consecutive samples forming part of the current frame FC, is concatenated to the front of the first sample x(0) of the frame FC and the back of the last sample x(L−1) thereof.

Figure 8A:
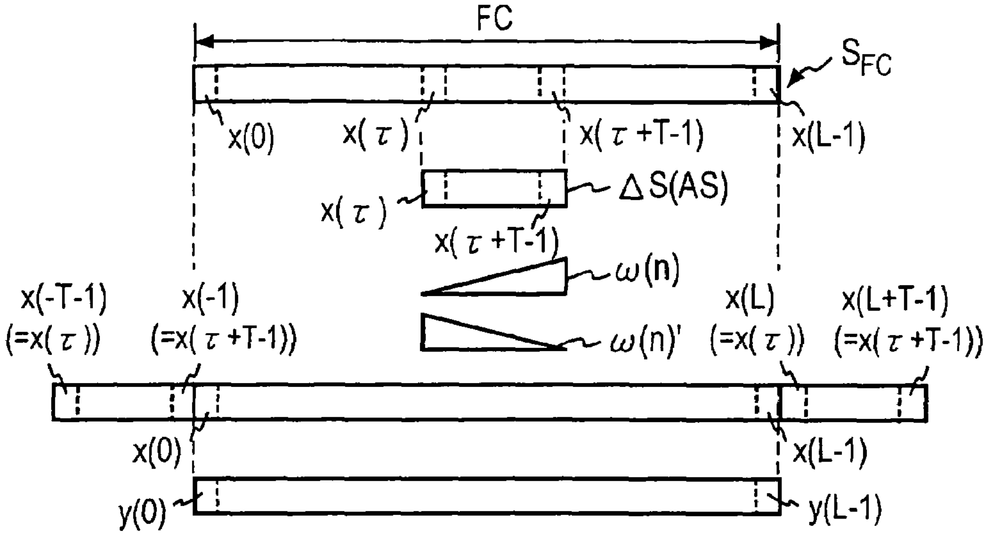
FIG. 8A is a diagram showing examples of respective signals in the processing in Embodiment 2.

That is, as shown in FIG. 8A, a sample sequence, which consists of consecutive samples x(τ), . . . , x(τ+T−1) forming part of the frame FC, is read out from the buffer 100 in FIG. 6A, then this sample sequence ΔS is stored in the buffer for concatenation as the alternative sample sequence AS to the front of the first sample x(0), while at the same time the sample sequence ΔS is stored in the buffer 100 for concatenation as the alternative sample sequence AS' to the back of the last sample x(L−1). In other words, in the alternative sample sequence generating/concatenating part 140 in FIG. 6A the output from the reading part 141 is provided directly to the writing part 143 as indicated by the broken line. With this method, it can be said that a replica of the sample sequence ΔS is shifted forward by τ+T+1 for use as the alternative sample AS and that a replica of the sample sequence Δs is shifted rearward by L−τ for use as the alternative sample AS'. In this case, too, it is possible to use the alternative sample sequences AS and AS' after multiplying them by the window functions ω(n) and ω(n)', respectively in the windowing part 144. The sample sequence $S_{FC}$ of the current frame FC concatenated with the alternative sample sequences AS and AS' is read out with the alternative sample sequence AS first and input to the FIR filter 150, from which the filtered output y(0), . . . , y(L−1) is obtained.

Figure 8B:
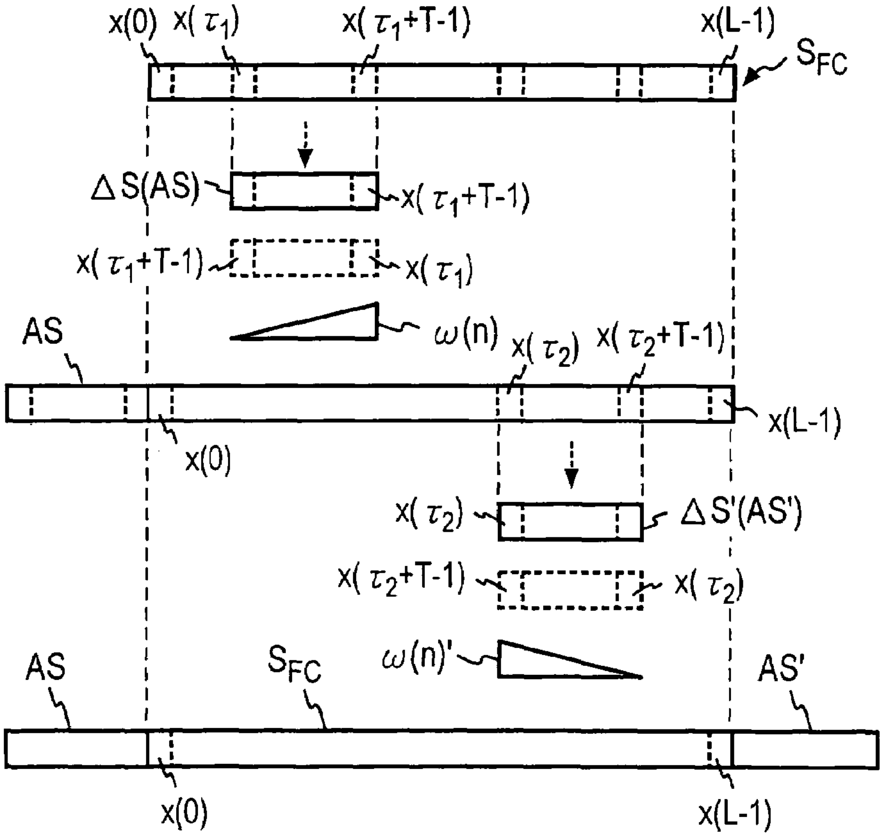
FIG. 8B is a diagram showing a modified form of FIG. 8A.

FIG. 8B shows a modification of the above method; after concatenation of the alternative sample sequence AS to the front of the first sample x(0) as depicted in FIG. 8A, consecutive samples $x(\tau_2)$, . . . , $x(\tau_2+T-1)$, which forms part of the frame FC different from the part formed by the samples $x(\tau_1)$, . . . , $x(\tau_1+T-1)$, are taken out as the sample sequence ΔS', which is concatenated to the back of the last sample x(L−1). In this instance, too, the alternative sample sequence AS' may be multiplied by the window function ω(n)'.

Also in Embodiment 2, the samples can be read out one by one and fed to the FIR filter 150. For example, as parenthesized in step S2 of FIG. 7, x(n+τ) and $x(n+\tau_1)$ are used as x(n) in the cases of FIGS. 8A and 8B, respectively; and as parenthesized in step S9, $x(n+\tau_1)$ and $x(n+\tau_2)$ are used as x(n) in the cases of FIGS. 8A and 8B, respectively.

As described above, according to Embodiments 1 and 2, it is possible to perform, by use of the sample sequence SFC of one frame, the digital processing that requires samples which form part of each of the preceding and succeeding frames—this provides enhanced signal continuity, quality and coding efficiency.

Embodiment 3

Embodiment 3 of the first mode of working of the invention provides auxiliary information representing either predetermined various alternative sample sequence generating methods or the most desirable alternative sample generating method by changing the position of taking out the sample sequence ΔS (or ΔS, ΔS'), or/and auxiliary information indicating the position where to take out the sample sequence ΔS. This embodiment is applied to, for example, the coding/decoding system shown in FIG. 1. The method for selecting the sample sequence take-out position will be described later on.

The following is a list of examples of possible alternative sample sequence generating methods.

1. In FIG. 8A of Embodiment 2: τ changed, no window function used;
2. In FIG. 8A of Embodiment 2: τ changed, no window function used, reverse arrangement involved;
3. In FIG. 8A of Embodiment 2: τ changed, window function used;
4. In FIG. 8A of Embodiment 2: τ changed, window function used, reverse arrangement involved;
5. In FIG. 8B of Embodiment 2: $\tau_1$, $\tau_2$ changed, no window function used;
6. In FIG. 8B of Embodiment 2: $\tau_1$, $\tau_2$ changed, no window function used, reverse arrangement involved;
7. In FIG. 8B of Embodiment 2: $\tau_1$, $\tau_2$ changed, window function used;
8. In FIG. 8B of Embodiment 2: $\tau_1$, $\tau_2$ changed, window function used, reverse arrangement involved;
9. In Embodiment 1: no window function used;
10: In Embodiment 1: window function used;
11. In FIG. 8A of Embodiment 2: τ fixed, no window function used;
12. In FIG. 8A of Embodiment 2: τ fixed, no window function used, reverse arrangement involved;
13. In FIG. 8A of Embodiment 2: τ fixed, window function used;
14. In FIG. 8A of Embodiment 2: τ fixed, window function used, reverse arrangement involved;
15. In FIG. 8B of Embodiment 2: $\tau_1$, $\tau_2$ fixed, no window function used;
16. In FIG. 8B of Embodiment 2: $\tau_1$, $\tau_2$ fixed, no window function used, reverse arrangement involved;
17. In FIG. 8B of Embodiment 2: $\tau_1$, $\tau_2$ fixed, window function used;
18. In FIG. 8B of Embodiment 2: $\tau_1$, $\tau_2$ fixed, window function used, reverse arrangement involved.

Since methods 9 and 10 are contained in methods 6 and 8, respectively, methods 9, 10 and methods 6, 8 are not selected at the same time. In general, methods 1 to 4 generate favorable alternative pulse sequences than do methods 11 to 14, and hence they are not selected at the same time. Similarly, methods 5 to 8 and methods 15 to i 8 are not selected at the same time. Accordingly, a plurality of kinds of methods is predetermined as methods 1, . . . , M which includes, for example, one or more of methods 1 to 8 or one of more of methods 1 o 4 and either one of methods 9 and 10. Only one of methods 1 to 8 may sometimes be selected.

Figure 9A:
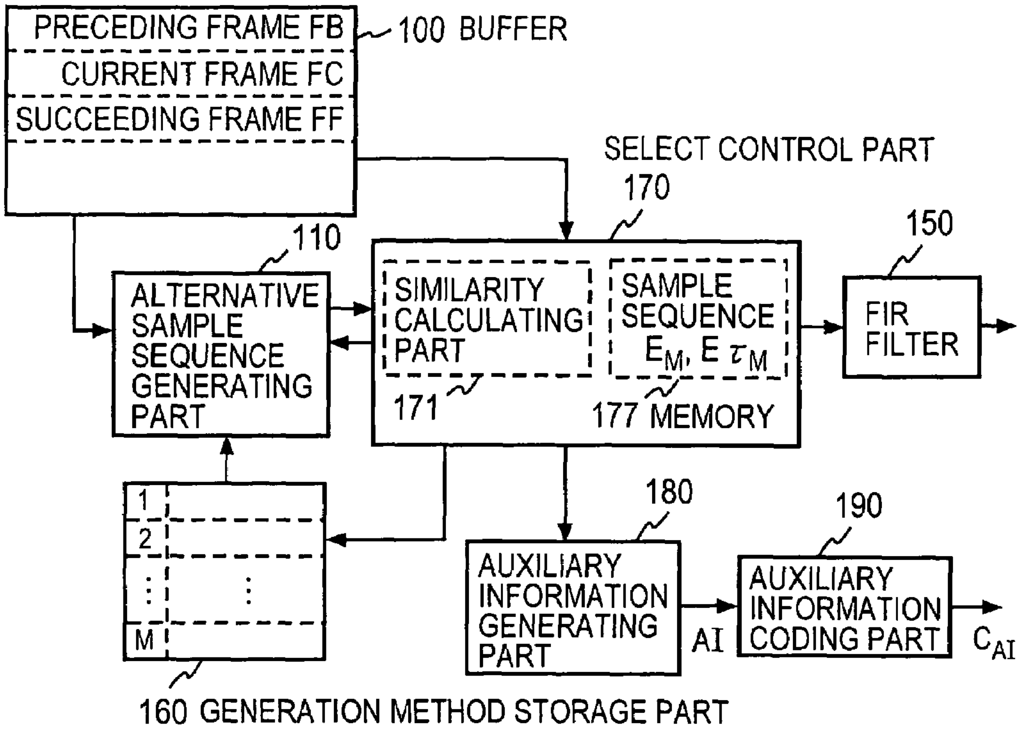
FIG. 9A is a block diagram illustrating an example of the functional configuration of a digital signal processor according to Embodiment 3.

These predetermined generating methods are prestored in a generation method storage part 160 in FIG. 9A, and under the control of a select control part 170, one of the alternative sample sequence generating method is read out from the generation method storage part 170 and set in an alternative sample sequence generating part 110; the alternative sample sequence generating part 110 begins to operate, and follows the generating method set therein to take out of the buffer 100 a sample sequence ΔS, which consists of consecutive samples forming part of the current frame, and to generate an alternative sample sequence (a candidate), which is provided to the select control part 170.

Figure 9B:
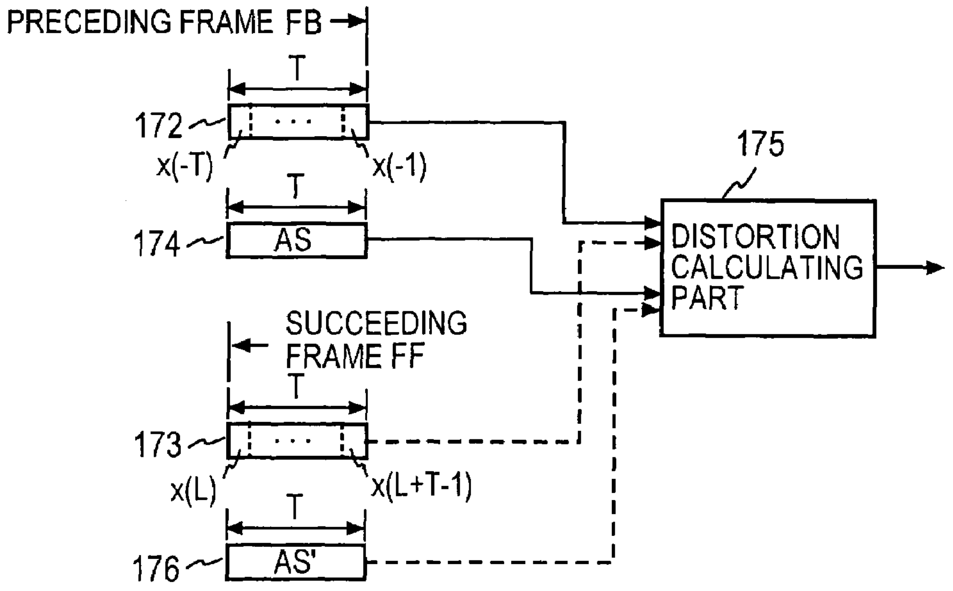
FIG. 9B is a diagram showing an example of the functional configuration of its similarity calculating part.

The select control part 170 calculates, in a similarity calculating part 171, calculates similarity between the candidate alternative sample sequence in the current frame FC and the corresponding sample sequence in the preceding frame FB or succeeding frame FF. In the similarity calculating part 171, as shown, for example, in FIG. 9B, the rear-end sample sequence x(−T), . . . , x(−1) in the preceding frame FB, which it to be subjected to FIR filtering (FIR filtering in the up-sampling part 16 in FIG. 1, for instance) that extends over the samples of the current frame FC, is read out of the buffer 100 and prestored in a register 172; and the lead sample sequence x(L), . . . , x(L+T−1) in the succeeding frame FF, which is to be subjected to FIR filtering that extends over the samples of the current frame FC, is read out of the buffer 100 and prestored in a register 173.

If the input candidate alternative sample sequence is the sample sequence AS corresponding to that of the preceding frame, it is stored in a register 174, and the square error between the sample sequence AS and the sample sequence x(−T), . . . , x(−1) stored in the register 172 is calculated in a distortion calculating part 175. If the input candidate alternative sample sequence is the sample sequence AS' corresponding to that of the succeeding frame, it is stored in a register 176, and the square error between the sample sequence AS' and the sample sequence x(L), . . . , x(L+T−1) stored in the register 173 is calculated in the distortion calculating part 175.

It can be said that the smaller the calculated square error (or weighted square error) is, the smaller the distortion of the candidate alternative sample sequence, that is, the greater its similarity to the corresponding to the last sample sequence of the preceding frame or the first sample sequence of the succeeding frame. The similarity may also be judged on the basis of the inner product (or cosine) of the vectors of each sample sequence and the vector of the corresponding sample sequence in such a manner that the similarity increases with an increase in the value of the inner product. In any of methods 1 to 8, the positions $\tau_1$ and $\tau_2$ are changed, for example, to τ=0, . . . , L−1, and the sample sequences at the position where the similarity is maximum is used as the candidate alternative sample sequences of the maximum similarity by that method. In the case of selecting two or more of methods 1 to 8, candidate alternative sample sequences of the maximum similarity are selected among those of the maximum similarity by the respective methods.

The alternative sample sequences AS and AS' of the maximum similarity among the alternative sample sequences thus obtained by the respective methods are concatenated to the front and back of the sample sequence $S_{FC}$ of the current frame FC, thereafter being provided to the FIR filter 150. And information $AI_{AS}$ indicating the method used for generating the adopted alternative sample sequences AS and AS', in the case of using methods 1 to 8, auxiliary information AI composed of information $AI_P$ indicating the position τ (or $\tau_1$ and $\tau_2$) of the taken-out sample sequence ΔS (or this taken-out sample sequence and ΔS'), and in the case of using only one of methods 1 to 8, only information $AI_P$, is generated in an auxiliary information generating part 180, and if necessary, the auxiliary information AI is encoded in an auxiliary information coding part 190 into an auxiliary code $C_{AI}$. The auxiliary information AI or auxiliary code $CA_I$ is transmitted or stored after being added to part of the current frame FC generated in the coder 10 shown in FIG. 1, for instance.

In Embodiments 1 and 2, when τ (or $\tau_1$, $\tau_2$) is fixed, a pre-notification to that effect is provided to the decoding side, no auxiliary information is required.

Figure 10:
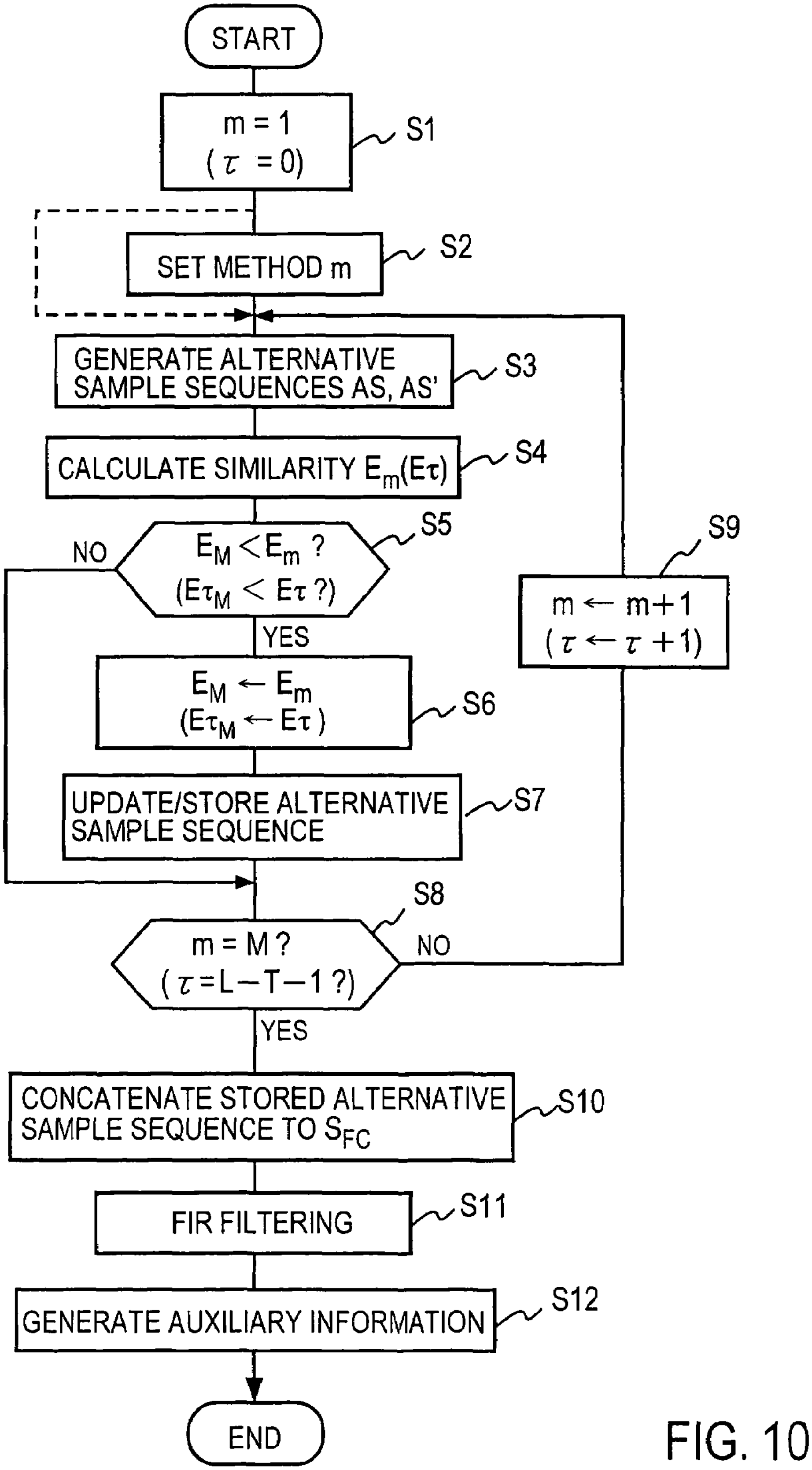
FIG. 10 is a flowchart showing an example of the procedure of the digital signal processing method of Embodiment 3.

A description will be given, with reference to FIG. 10, of the procedure of the processing method shown in FIG. 9A.

In the first place, the parameter m indicating the generating method is initialized at 1 (S1), then the method m is read out of the storage part 160 and set in the alternative sample sequence generating part 110 (S2), and the alternative sample sequences (candidates) AS and AS' (S3). The similarity $E_m$ between the alternative sample sequences AS, AS' and the preceding and succeeding frame sample sequences is obtained (S4), then a check is made to see if the similarity $E_m$ is higher than the maximum similarity $E_M$ until then (S5), and if so, $E_M$ is updated with $E_m$ (S6), after which the alternative sample sequence AS (or this sample sequence and AS') prestored in the memory 177 (FIG. 9A) is updated with the alternative sample sequence (candidate) 'S7). In the memory 177 there is also stored the maximum similarity $E_M$ in the past.

When $E_m$ is not greater than $E_M$ in step S5, and after step S7, a check is made to see if m=M (S8), and if so, m is incremented by one in step S9, followed by a return to step S3 to proceed to the generation of the alternative sample sequence by the next method. If m=M in step S8, the alternative sample sequence AS (or AS and AS') stored at that time is concatenated to the front and back of the sample sequence $S_{FC}$ of the current frame FC (S10), then the combined sample sequence is subjected to FIR filtering (S11), and the information $AI_{AS}$ indicting the method of generating the adopted alternative sample sequence or/and the auxiliary information AI indicating the position information $AI_P$ are generated (S12).

In the methods 1 to 8 for changing the position τ or $\tau_1$, $\tau_2$, the alternative sample sequence of the greatest similarity can be generated by the same steps as those S1 to S9 shown in FIG. 19. For example, in the cases of methods 1 to 4, as indicated in the parentheses for each m, τ=1 is initialized in step S1, then m is set in step S2, then the alternative sample sequence is generated in step S3, then the similarity Eτ is calculated in step S4, then a check is made to see if Eτ is greater than $E\tau_M$ in step S5, and if so, then $E\tau_M$ is updated with Eτ in-step S6, then the alternative sample sequence is updated with the newly generated one in step S7, then a check is made to see if τ=L−T−1 in step S8, and if not so, the τ is incremented by one in step S9 and the procedure returns to step S3; if τ=L−T+1 in step S8, then in step S10, when M=1, the prestored alternative sample sequence AS is adopted, and if M is equal to or greater than 2, $E\tau_M$ stored at that time is used as the similarity $E_m$ in the method m.

As described above, the most desirable alternative sample sequence is generated from the sample sequence $S_{FC}$ of the current frame FC and the auxiliary information AI is output as part of the code of the frame FC; therefore, in the case where digital signal processing for decoding the code of this frame requires samples of the preceding (past) and succeeding (future) frames (for example, the up-sampling part 34 of the decoder 30 in FIG. 1), a sequence of consecutive samples is taken out, by the method indicated by the auxiliary information AI, from the sample sequence $S_{FC}$ (decoded) of the frame FC obtained in the course of decoding, then the alternative sample sequences AS and AS' are generated from the taken-out sample sequence and concatenated to the front and back of the decoded sample sequence SFC, respectively, prior to the digital signal processing—this enables the digital signal of one frame to be decoded (reconstructed) by only the code of one frame, and provides increased continuity, quality and coding efficiency of the signal.

Embodiment 4

This embodiment is applied to one portion of coding of a digital signal, for instance; a sample sequence similar to the leading portion (the leading sample sequence) in a frame is taken out therefrom, then similar sample sequence is multiplied by a gain (including a gain 1), and the gain-multiplied similar sample sequence is subtracted from the leading sample sequence is subjected to autoregressive prediction to generate a prediction error signal, thereby preventing the prediction efficiency from impairment by discontinuity. Incidentally, the smaller the prediction error, the high the prediction efficiency.

Figure 1:
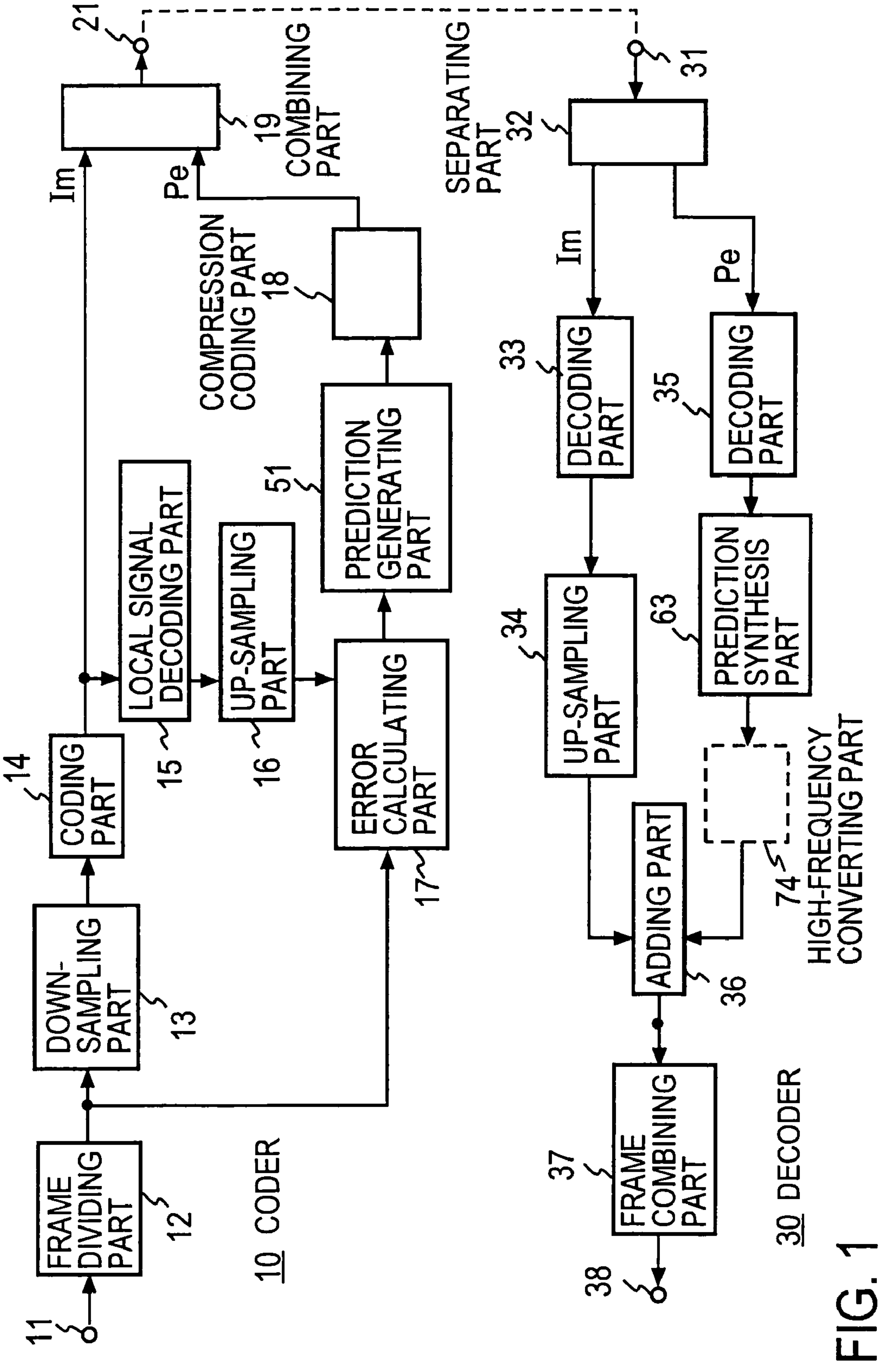
FIG. 1 is a block diagram illustrating, by way of example, a coder and a decoder that contain parts to which the digital signal processor of the present invention is applicable.
Figure 11:
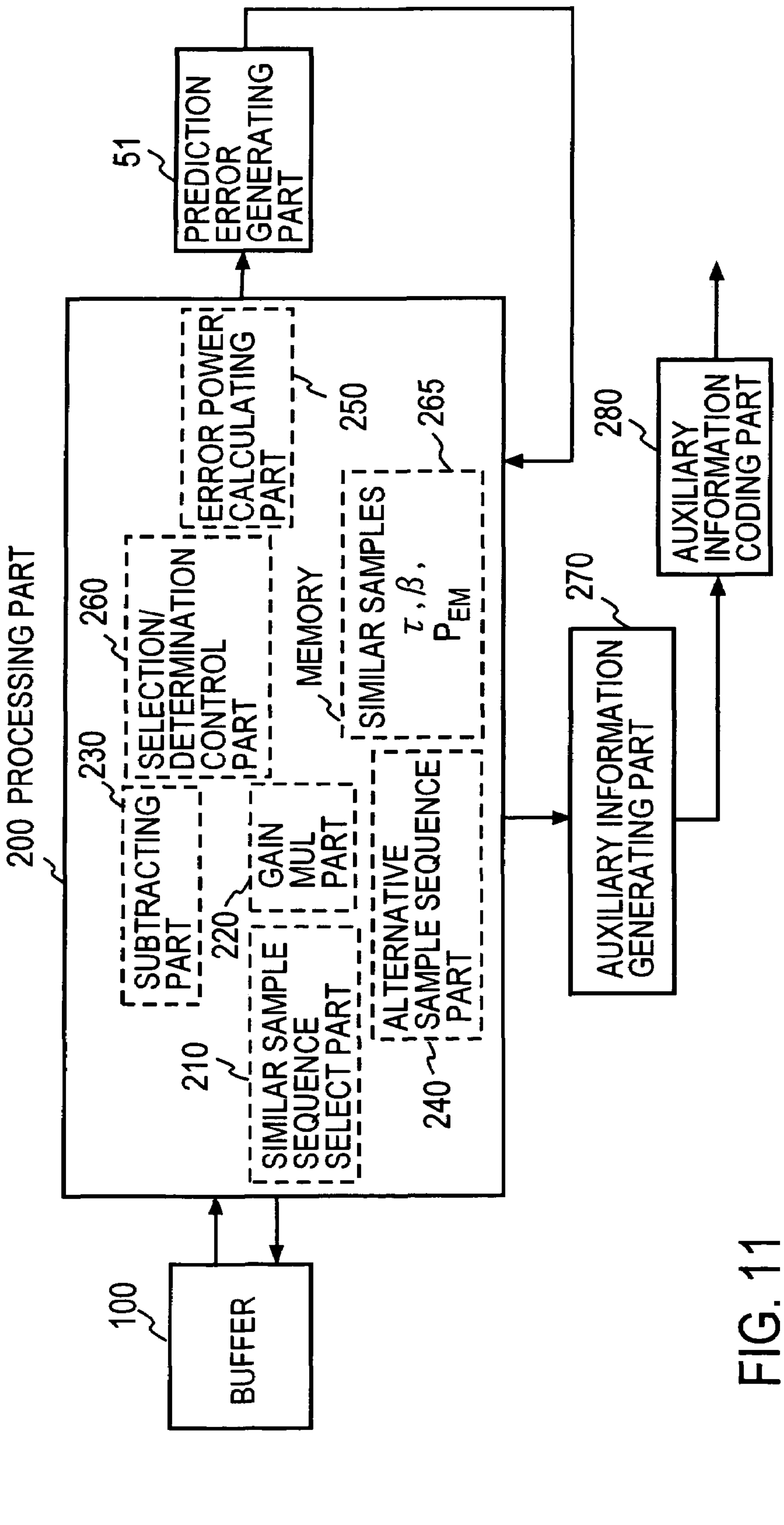
FIG. 11 is a block diagram illustrating an example of the functional configuration of a digital signal processor according to Embodiment 4.

Embodiment 4 is applied, for example, to the prediction error generating part 51 in the coder 10 in FIG. 1. FIG. 11 shows an example of its functional configuration, FIG. 12 examples of sample sequences in respective processing, and FIG. 13 an example of the flow of processing.

Figure 12:
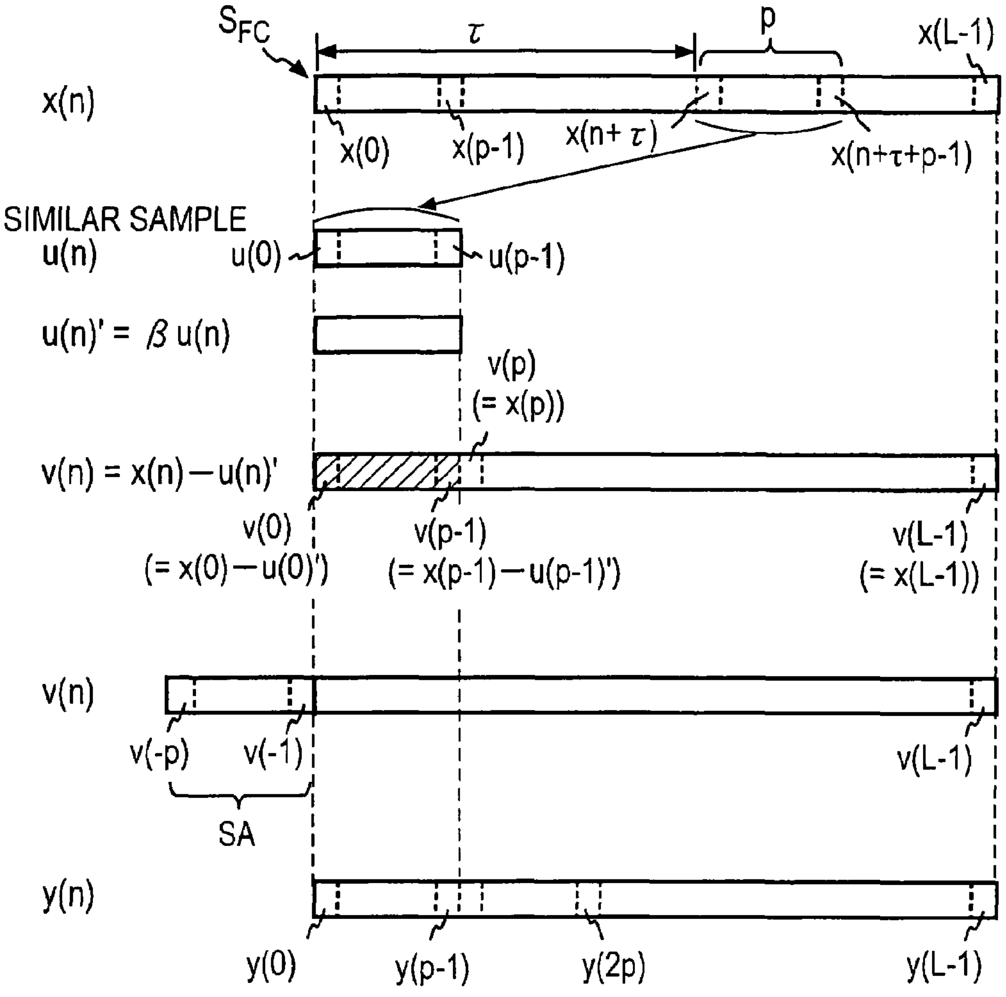
FIG. 12 is a diagram showing examples of respective signals in the processing in Embodiment 4.
Figure 13:
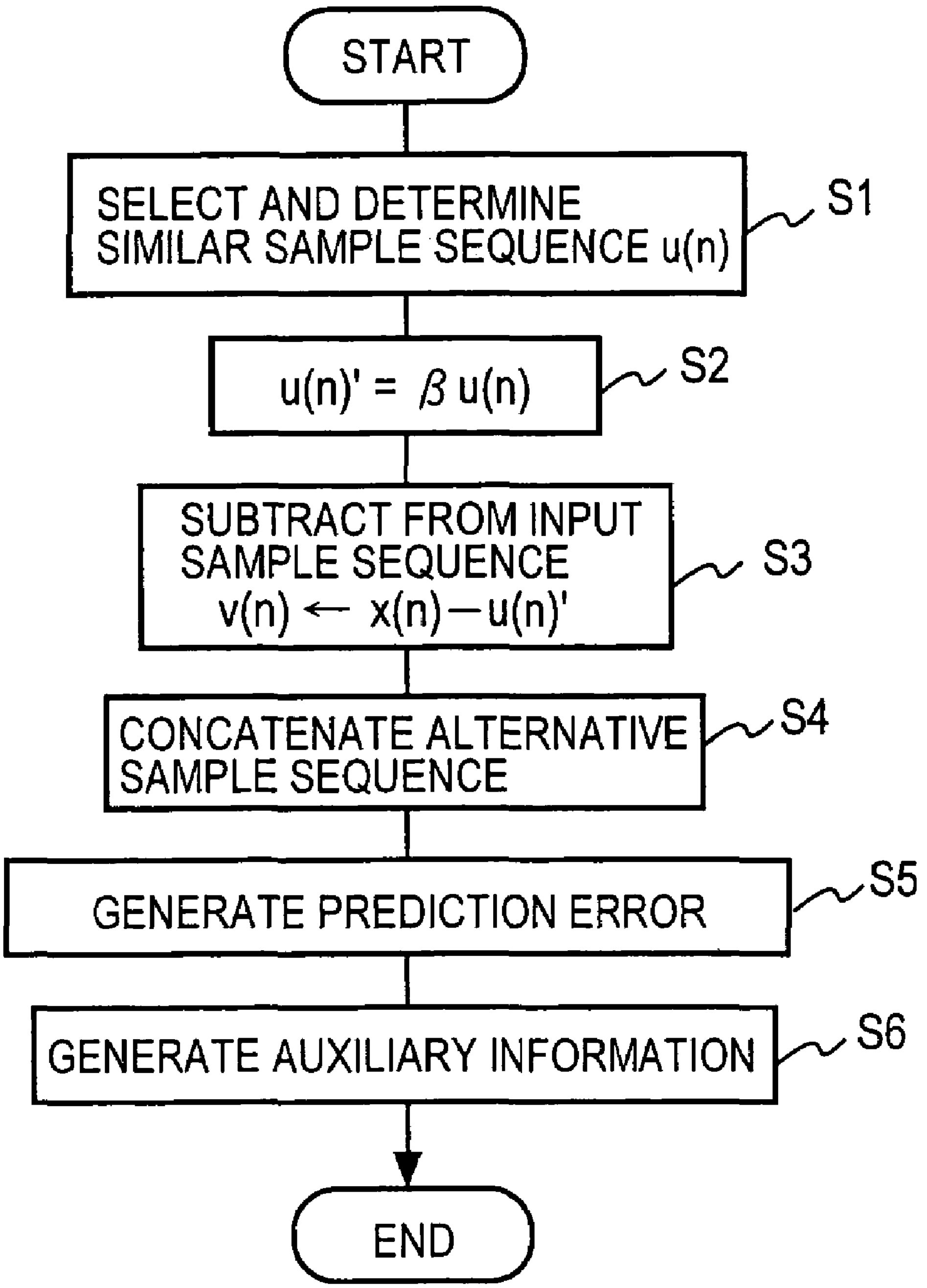
FIG. 13 is a flowchart showing an example of the procedure of the digital signal processing method of Embodiment 4.

The digital signal (sample sequence) $S_{FC}=\{x(0), \ldots, x(L-1)\}$ of one frame FC to be processed is prestored in the buffer 100 in FIG. 11, for instance, and a sample sequence $x(n+\tau), \ldots, (n+\tau+p-1)$ similar to the leading sample sequence $x(0), \ldots, x(p-1)$ in the frame FC is read out by a similar sample sequence select part 210 from the sample sequence $S_{FC}$ of the frame FC in the buffer 100 (S1). The similar sample sequence $x(n+\tau), \ldots, (n+\tau+p-1)$ is shifted as a similar sample sequence $u(0), \ldots, u(p-1)$ to the front position in the frame FC as shown in FIG. 12, then the similar sample sequence u(n) is multiplied by a gain $\beta(0<\beta\leqq 1)$ in a gain multiplying part 220 to provide a sample sequence $u(n)'=\beta u(n)$ (S2), and the sample sequence u(n)' is subtracted in an subtracting part 230 from the sample sequence $x(0), \ldots, x(L-1)$ to obtain a sample sequence $v(0), \ldots, v(L-1)$ as shown in FIG. 12 (S3). That is, $$\text{For } n=0, \ldots, p-1\text{: } v(n)=x(n)-u(n)'$$

$$\text{For } n=p, \ldots, L-1\text{: } v(n)=x(n)$$

The sample sequence $x(n+\tau), \ldots, x(n+\tau+p-1)$ may be multiplied by the gain β before it is shifted to the front position in the frame to form the sample sequence u(n)'.

An alternative sample sequence $v(-p, \ldots, v(-1)$ consisting of p (number of prediction orders) is concatenated to the front of the lead sample v(0) in an alternative sample sequence concatenating part 240 as shown in FIG. 12 (S4). The alternative sample sequence $v(-p), \ldots, v(-1)$ may also be a sample sequence consisting of p samples $0, \ldots, 0$, fixed values $d, \ldots, d$, or a sample sequence obtained by the same scheme used to obtain the alternative sample sequence AS in the first mode of working.

The sample sequence $v(-p), \ldots, v(L-1)$ with the alternative sample concatenated thereto is input to the prediction error generating part 51, which generates a prediction error signal $y(0), \ldots, y(L-1)$ by autoregressive prediction (S5).

The position τ of the similar sample sequence $x(n+\tau), \ldots, x(n+\tau+p-1)$ and the gain β are determined such that, for example, the power of the prediction error signal $y(0), \ldots, y(L-1)$ becomes minimum. In this instance, τ and β are determined using the power of the prediction error signal from y(0) to y(2p) because once the calculation of the prediction value comes to use p samples subsequent to v(p) the prediction error power is not related to the part in the in the current frame from where the similar sample sequence $x(n+\tau), \ldots, x(n+\tau+p-1)$ is derived. The method of this determination is the same as the alternative sample sequence AS determining method described previously with reference to FIG. 10. In this case, upon each change of τ the error power is calculated in an error power calculating part 250 (FIG. 11), and when the calculated value is smaller than the minimum value $P_{EM}$ obtained until then, the latter is updated with the newly calculated value, which is stored as the minimum value $P_{EM}$ in a memory 265, and the similar sample sequence obtained at that time is also stored in the memory 265, updating the previous sequence stored therein. Then τ is changed to the next τ, that is, $\tau\leftarrow\tau+1$, and the error power is calculated, and if the error power is not smaller than the previous one, the similar sample sequence at that time is stored in the memory 265, updating the previous sample sequence stored therein; the similar sample sequence stored at the time of completion of changing τ from 1 to $L-1-p$ is adopted. Next, β is changed on a stepwise basis for the adopted similar sample sequence; each time it is change, the error power is calculated, and β is adopted corresponding to the minimum power of prediction error. The determination of τ and β is made under the control of the selection/determination control part 260 (FIG. 11).

A prediction error signal for the sample sequence $v(-p), \ldots, v(L-1)$ generated using τ and β determined as described above is generated, and the auxiliary information AI indicating τ and β used therefor is generated in an auxiliary information generating part 270 (S6), and if necessary, the auxiliary information AI is coded by an auxiliary information coding part 280 into a code $C_{AI}$. The auxiliary information AI or code $C_{AI}$ is added to a part of a code of the input digital signal of the frame FC encoded by the coder.

In the above, the value of τ may preferably be greater than the prediction order p, and it is advisable to determine τ such that the sum, $\Delta U+\tau$, of the length ΔU of the similar sample sequence u(n) and τ is smaller than $L-1$, that is, $x(\tau+\Delta U)$ falls within the scope of the frame FC concerned. The length ΔU of the similar sample sequence u(n) needs only to be equal to or smaller than τ and is not related to the prediction order p; it may be equal to or smaller or larger than p but may preferably be equal to or greater than p/2. Moreover, the front position of the similar sample sequence u(n) need not always be aligned with the front position in the frame FC, that is, u(n) may be set with $n=3, \ldots, 3+\Delta U$, for instance. The gain β, by which the similar sample sequence u(n) is multiplied, may be assigned a weight depending on the sample, that is, the sample sequence u(n) may be multiplied by a predetermined window function ω(n), in which case the auxiliary information needs only to indicate τ.

Embodiment 5

Figure 14:
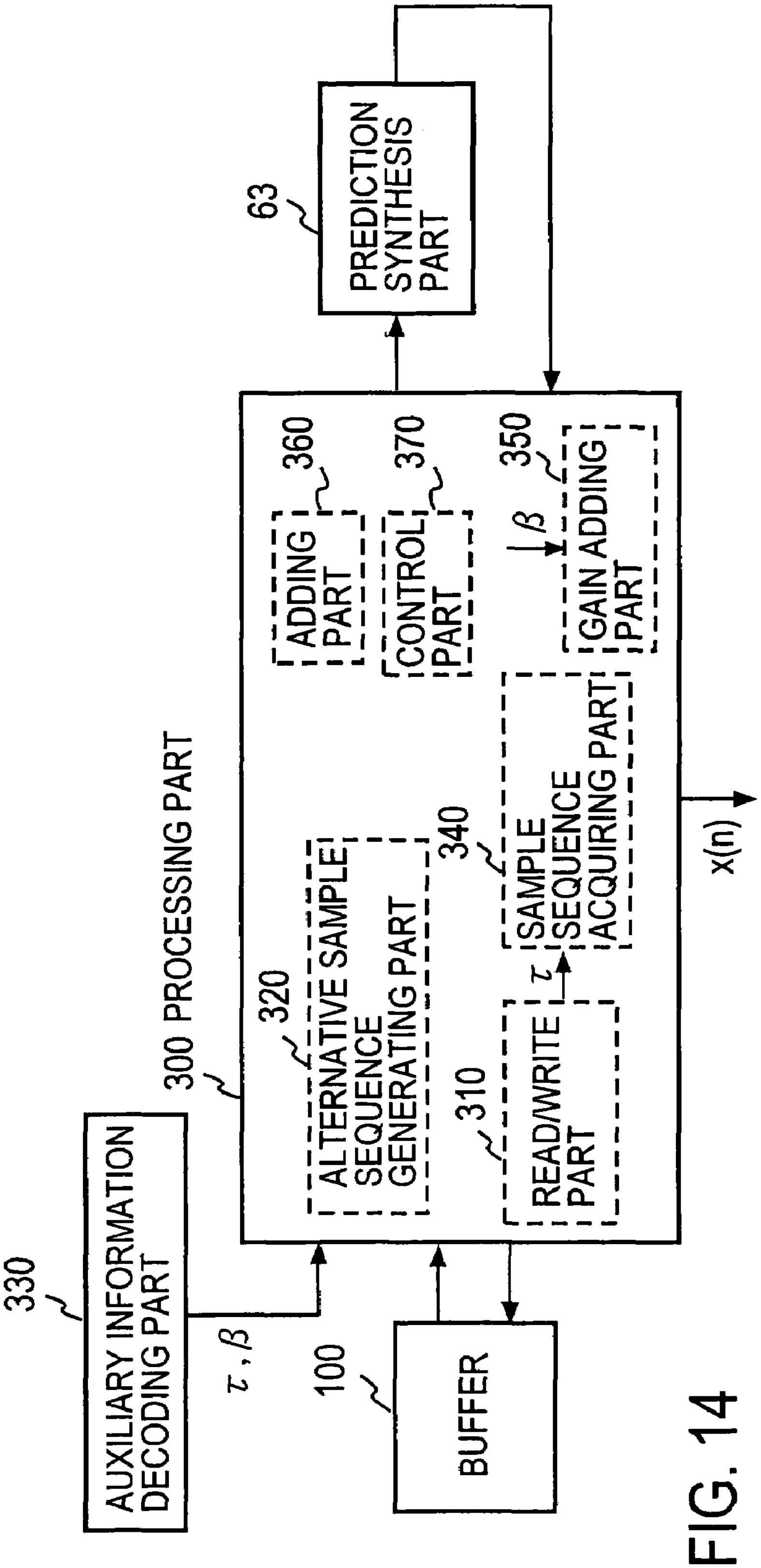
FIG. 14 is a block diagram illustrating an example of the functional configuration of Embodiment 5.
Figure 15:
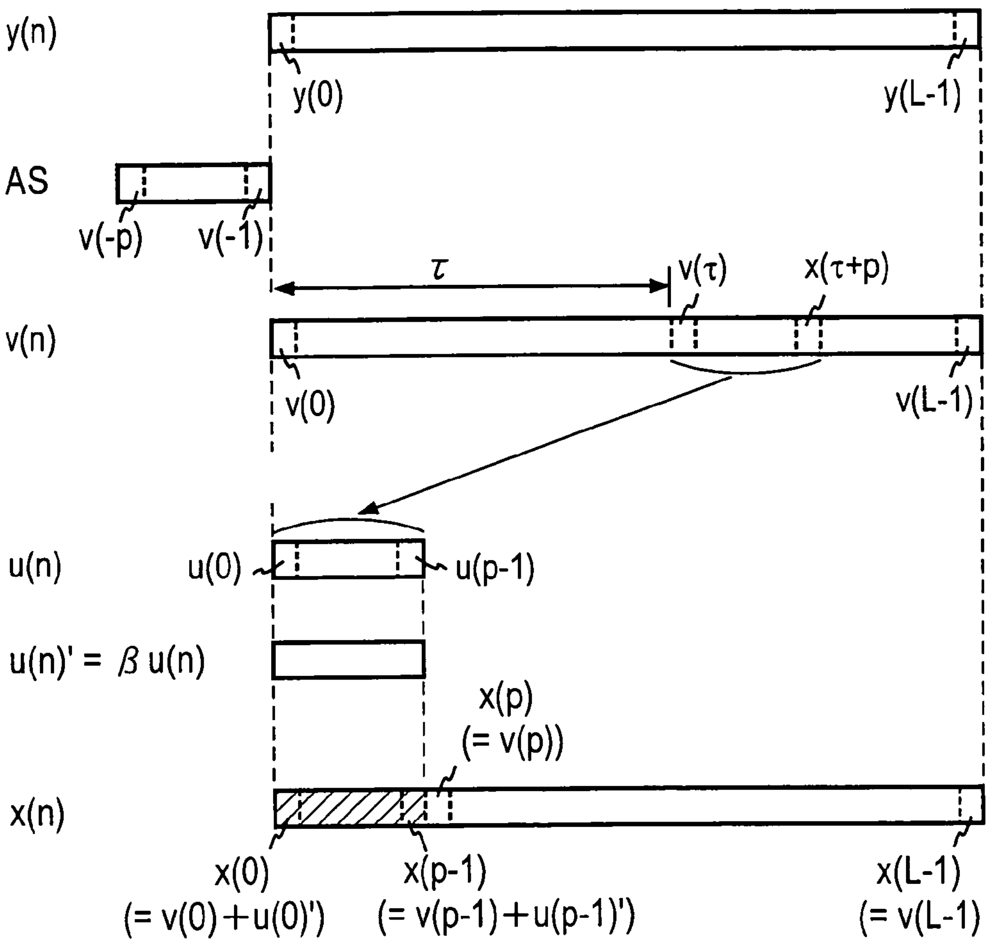
FIG. 15 is a flowchart showing an example of the procedure of the digital signal processing method of Embodiment 5.
Figure 16:
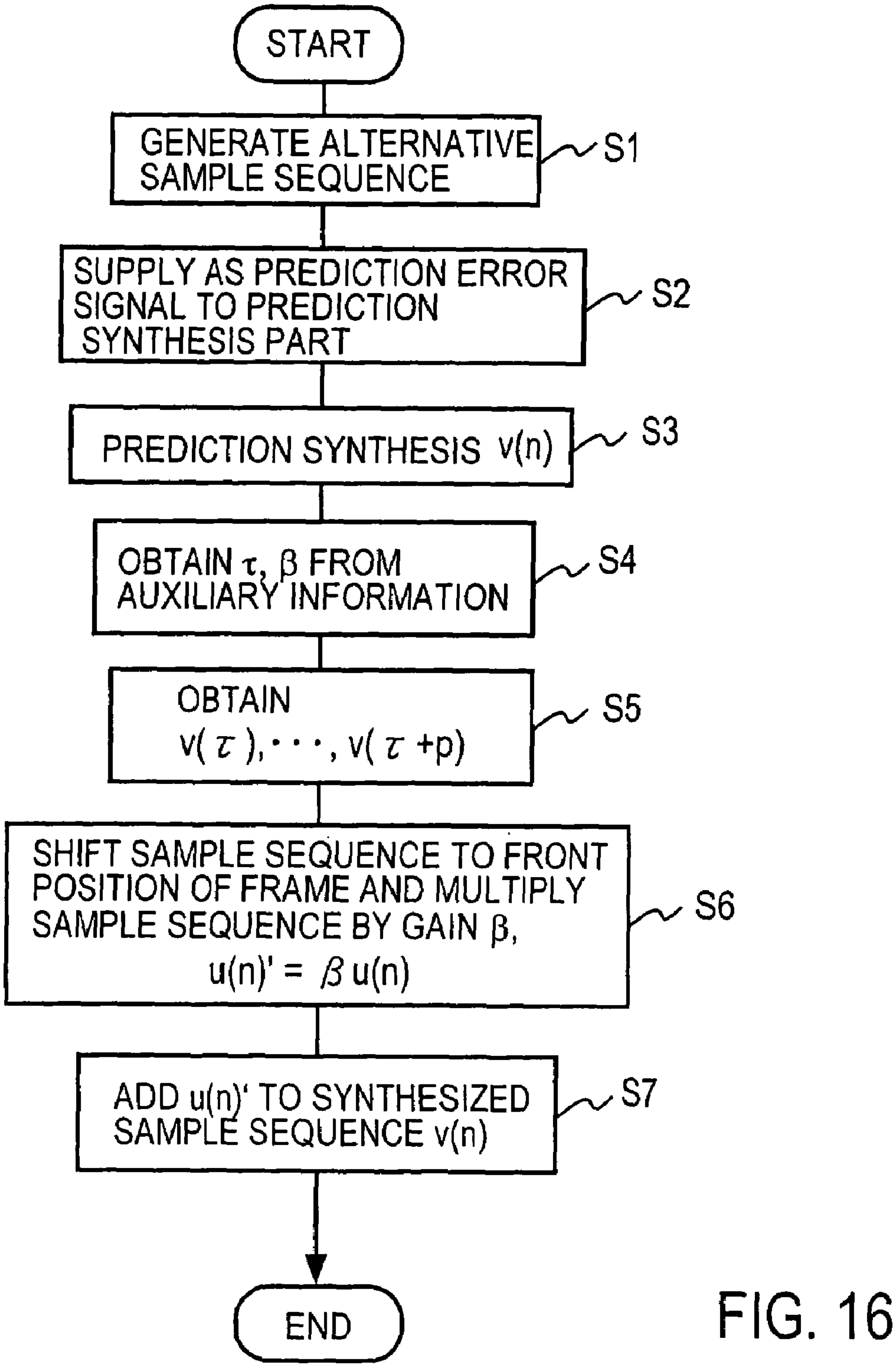
FIG. 16 is a flowchart showing an example of the procedure of the digital signal processing method of Embodiment 5.

The embodiment of the prediction synthesis processing method corresponding to Embodiment 4 will be described as Embodiment 5. This prediction synthesis processing method is used in the decoding of the code of the digital signal encoded frame by frame, for example, in the prediction synthesis part 63 in the decoder 30 shown in FIG. 1; especially, in the case of decoding the digital signal from a given frame, it is possible to obtain a decoded signal of high continuity and quality. FIG. 14 illustrates an example of the functional configuration of Embodiment 5, FIG. 15 examples of sample sequences during processing, and FIG. 16 an example of the procedure of this embodiment.

For example, in the buffer 100 there is stored a sample sequence y(0), . . . , y(L−1) of the current frame FC of the digital signal (a prediction error signal) to be subjected to prediction synthesis by the autoregressive prediction scheme, and the sample sequence y(0), . . . , y(L−1) is read out by a read/write part 310.

On the other hand, an alternative sample sequence AS={v(−p), . . . , v(−1)} of the length p equal to the prediction order p is generated in an alternative sample sequence generating part 320 (S1). The alternative sample sequence used in this case is a predetermined sample sequence consisting of samples 0, . . . , 0, fixed values d, . . . , d, or other predetermined sample sequence. The samples of the alternative sample sequence v(−p), . . . , v(−1) are sequentially fed to the prediction synthesis part 63 with the lead sample v(−p) at the head, as substitutes for the last p samples of the prediction error signal of the frame immediately preceding the current frame FC, to the prediction synthesis part 63 (S2), after which the samples of the sample sequence y(0), . . . , y(L−1) to be subjected to prediction synthesis are sequentially fed to the prediction synthesis part 63 with the lead sample at the head, and prediction synthesis processing is carried out to generate a prediction synthesis signal v(n) (where n=0, . . . , L−1) (S3). The prediction synthesis signal v(n)' thus obtained is temporarily stored in the buffer 100.

The auxiliary information decoding part 330 decodes the auxiliary code $C_{AI}$ forming part of the code of the current frame FC to obtain auxiliary information, from which τ and β are obtained (S4). The auxiliary information decoding part 330 may sometimes be supplied with the auxiliary information itself. In a sample sequence acquiring part 340, τ is used to replicate from the synthesis signal (sample) sequence a sample sequence v(τ), . . . , v(τ+p) consisting of a predetermined number p of consecutive samples in this case, that is, the prediction synthesis signal sequence v(n) is obtained intact as the replicated sample sequence v(τ), . . . , v(τ+p) (S5), then this sample sequence is so shifted as to bring its forefront to the front position of the frame FC to provide the sample sequence u(n), which is multiplied by the gain β from the auxiliary information in a gain multiplying part 350 to generate a corrected sample sequence u(n)'=βu(n) (S6).

This corrected sample sequence u(n)' is added to the prediction synthesis sample (signal) sequence v(n) to provide a normal prediction synthesis signal x(n) (where n=0, . . . , L−1)(S7). The prediction synthesis sample sequence x(n) is as follows:

$$n=0, \ldots, p-1: x(n)=v(n)+u(n)'$$

$$n=p, \ldots, L-1: x(n)=v(n)$$

A control part 370 of the processing part 300 controls the respective parts to perform their processing.

In the way described above, a prediction synthesis signal of excellent continuity and quality can be obtained from only the frame FC. Since Embodiment 5 corresponds to Embodiment 4, the length ΔU of the corrected sample sequence u(n)' is not limited specifically to p, that is, it is not related to the prediction order but predetermined; and the position of the lead sample of the corrected sample sequence u(n)' need not be the same as the position of the lead sample v(0) of the synthesis signal v(n) but this is also predetermined. Moreover, in some cases the gain β is not contained in the auxiliary information and it is weighted by a predetermined window function ω(m) for each sample u(n).

Second Mode of Working

In the second mode of working of the present invention, the digital signal of the frame concerned is processed using a filter tap number or prediction order dependent only on usable samples (in the frame concerned), instead of using the samples x(1), x(2), . . . preceding (past) the lead sample of the frame concerned or the samples x(L), x(L+1), . . . succeeding the last sample x(L−1) of the frame concerned.

Embodiment 6

Figure 17:
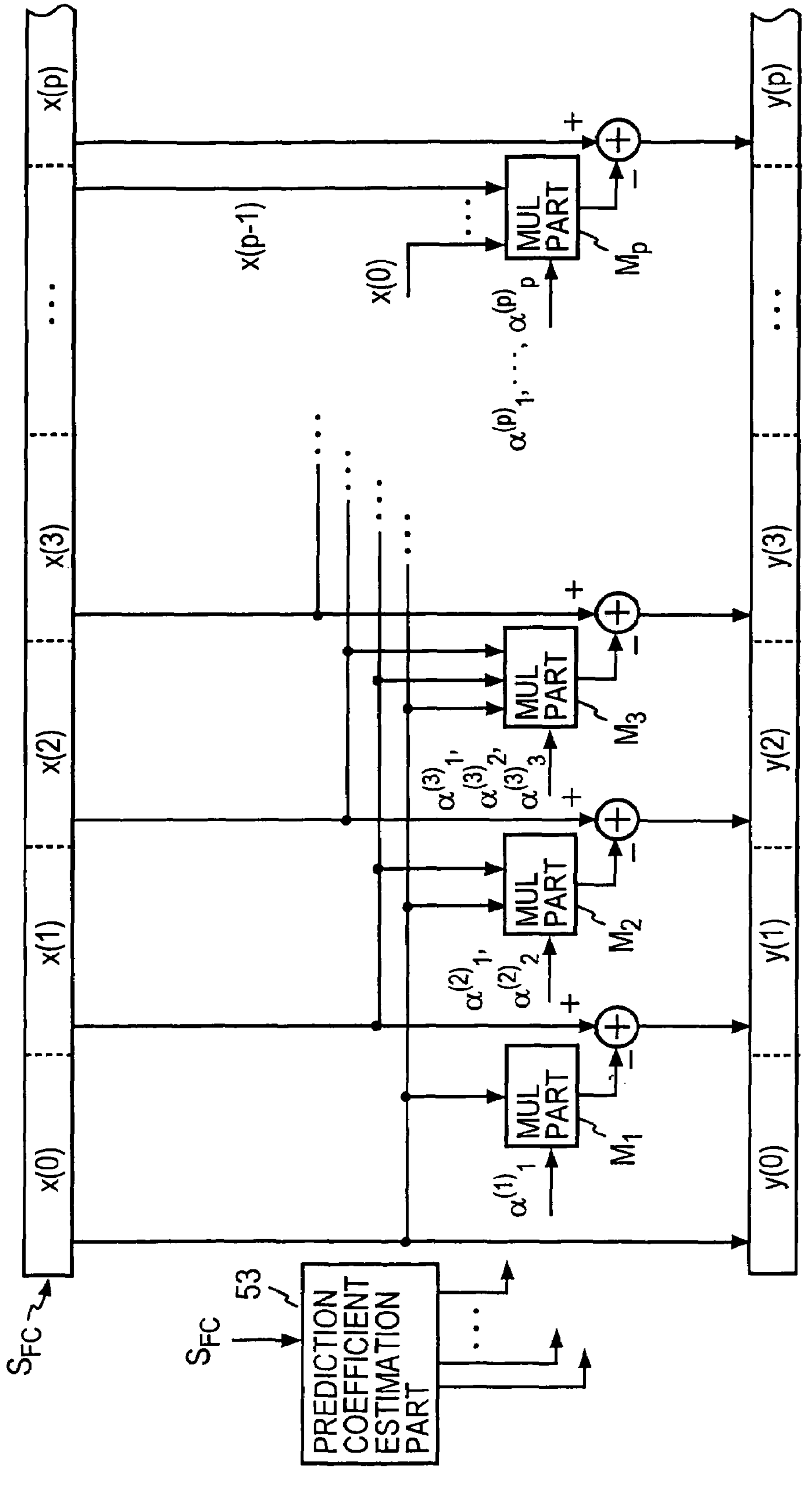
FIG. 17 is a diagram explanatory of Embodiment 6.

A description will be given of Embodiment 6 in which the second mode of working is applied to the case of making the autoregressive prediction. With reference to FIG. 17, Embodiment 6 will be described as being applied to the FIG. 3A processing for generating the prediction error.

A prediction coefficient estimating part 53 pre-calculates a 1st-order prediction coefficient $\{\alpha^{(1)}_1\}$, a 2nd-order prediction coefficient $\{\alpha^{(2)}_1, \alpha^{(2)}_2\}, \ldots,$ a pth-order prediction coefficient $\{\alpha^{(p)}_1, \ldots, \alpha^{(p)}_p\}$, using the samples x(0), . . . , x(L−1) of the current frame in the buffer.

The lead sample x(0) of the current frame FC is output intact as the prediction error signal y(0).

With respect to the next sample x(1), the product of the 1st-order prediction coefficient $\alpha^{(1)}_1$, from the prediction coefficient estimating part 53 and x(0) is calculated in a multiplying part $M_1$ to obtain a prediction value, and the prediction value is subtracted from x(1) to obtain the prediction error signal y(1).

Upon input of the next sample x(2), a convolution, $\alpha^{(2)}_1x(1)+\alpha^{(2)}_2x(0)$, of the 2nd-order prediction coefficients $\alpha^{(2)}_1, \alpha^{(2)}_2$ from the prediction coefficient estimating part 53 and x(0), x(1) is performed in a multiplying part $M_2$ to obtain a prediction value, and this prediction value is subtracted from x(2) to obtain the prediction error signal y(2).

Similar prediction (prediction with progressive order) is continued. Namely, upon each input of a sample a convolution is carried out between a prediction coefficient of the prediction order increased one by one and the preceding samples to obtain a prediction value, and the prediction value is subtracted from the input sample at that time to obtain a prediction error signal.

That is, at the coding side (at the transmitting side), despite the presence of the frame FB preceding the current frame FC, no sample of the preceding frame is used; for the first (n=0) sample x(0) of the current frame FC, no linear prediction is made, and hence the prediction value y(0)=x(0) output. For the second to pth samples x(1) to x(p−1), convolutions are carried out between the samples x(0) to x(n) (where n=1, . . . , p−1) and nth-order prediction coefficients $\alpha^{(n)}_1, \ldots, \alpha^{(n)}_n$ to obtain prediction values x(n)'. For the samples subsequent to the (p+1)th sample, p samples x(n−p), . . . , x(n−1) (where n=p+1, p+2, . . . , L−1) are convoluted with pth-order prediction coefficients $\alpha^{(p)}_1, \ldots, \alpha^{(p)}_p$ to obtain prediction values x(n)'. In other words, the prediction values are obtained by the same scheme as used in the past. Incidentally, the pth-order prediction coefficients $\alpha^{(p)}_1, \ldots, \alpha^{(p)}_p$ in step S7 may be calculated in step S0 indicated by the broken-line block, and in step S4 the nth-order prediction coefficients $\alpha^{(n)}_1, \ldots, \alpha^{(n)}_n$ may be calculated from the pth-order prediction coefficients. Alternatively, in the course of calculating the pth-order prediction coefficients in step S0 the nth-order (where n=1, . . . , p−1) prediction coefficients may be calculated, respectively. The pth-order prediction coefficients are coded and set as auxiliary information to the receiving side.

Figure 18:
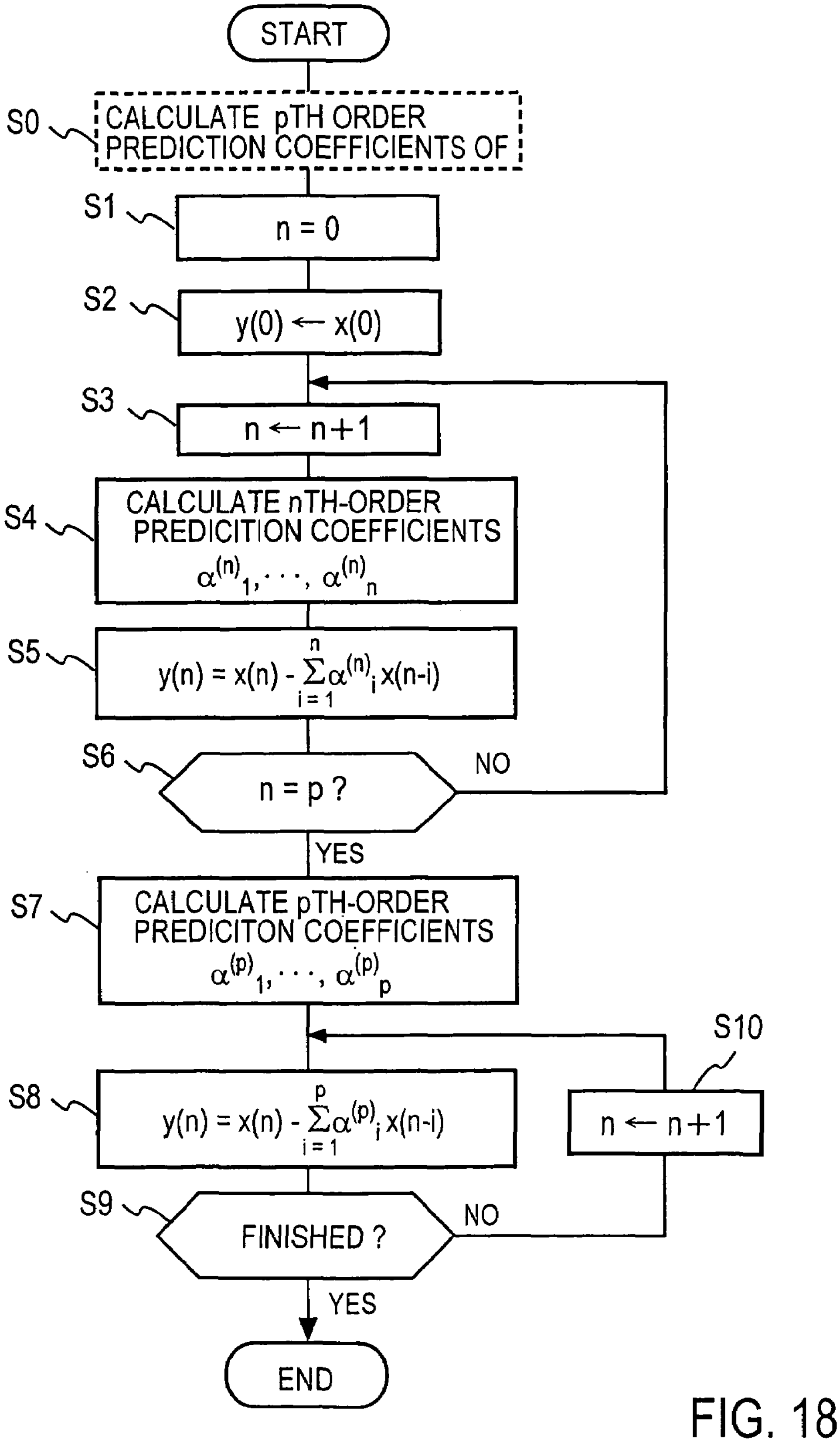
FIG. 18 is a flowchart showing an example of the procedure of the digital signal processing method of Embodiment 6.

An example of the procedure described above is shown in FIG. 18. In the first place, n is initialized to 0 (S1), then the sample x(0) is rendered into the prediction error signal y(0) (S2), then n is incremented by one (S3), then the nth-order prediction coefficients $\alpha^{(n)}_1, \ldots, \alpha^{(n)}_n$ are calculated (S4), then the past samples x(0), . . . , x(n−1) are convoluted with the prediction coefficients to obtain prediction values, then the prediction values are each subtracted from the input current sample x(n) to obtain the prediction error signal y(n) (S5). That is, the following calculation is conducted.

$$y(n) = x(n) - \sum_{i-1}^{n} \alpha_i^{(n)} x(n-i)$$

A check is made to see if n is p(S6), and if not, then the procedure returns to step S3, and if n=p, then the pth-order prediction coefficients $\alpha^{(p)}_1, \ldots, \alpha^{(p)}_p$ are calculated from all the samples x(0), . . . , x(L−1) (S7), then a convolution is carried out between the prediction coefficients and the immediately preceding p past samples x(n−p), . . . , x(n−1) to obtain a prediction value, and the prediction value is subtracted from the current sample x(n) to obtain the prediction error signal y(n) (S8). In other words, Eq. (2) is calculated. A check is made to see if processing of all required samples is completed (S9), and if not, then n is incremented by one and the procedure returns to step S8 (S10); if completed, the processing ends.

Figure 3A:
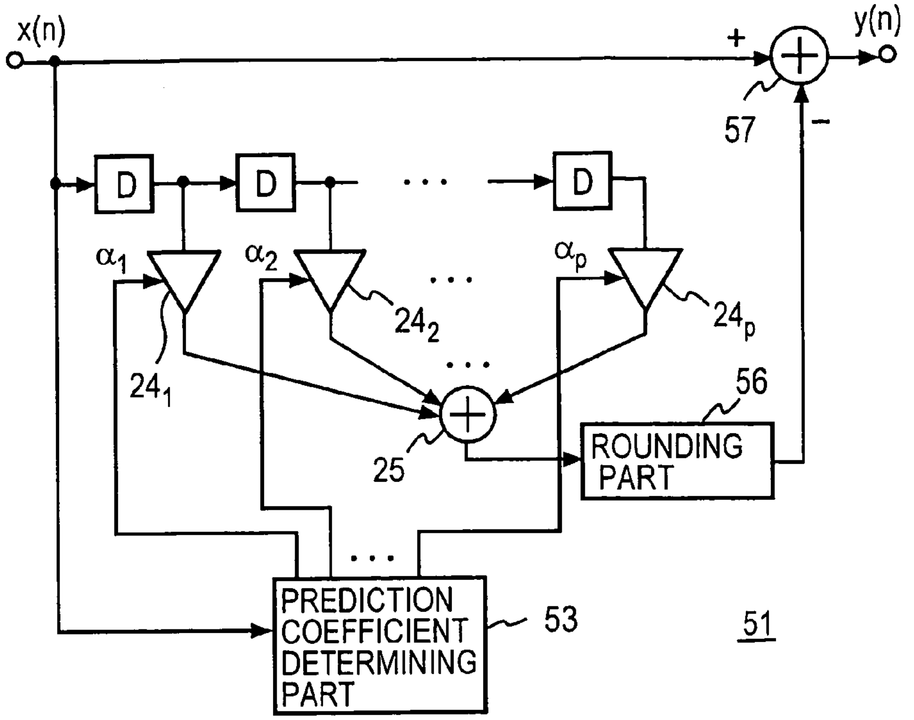
FIG. 3A is a block diagram showing an example of the functional configuration of an autoregressive prediction error generating part.

FIG. 19 presents in tabular form the prediction coefficients $\alpha^{(n)}_1, \ldots, \alpha^{(n)}_n$ that are generated for each sample number n=0, . . . , L−1 of the current frame in the case of applying Embodiment 6 to the prediction error generation in FIG. 3A. No prediction is made for the sample x(0) of the first sample number n=0 of the current frame. For the respective samples x(n) of the next sample number n=1 to n=p−1, the nth-order prediction coefficients $\alpha^{(n)}_1, \ldots, \alpha^{(n)}_n$ are sets, and the remaining (p−n) coefficients are set to $\alpha^{(n)}_{n+1}=\alpha^{(n)}_{n+2}, \ldots =\alpha^{(n)}_p=0$. For each sample x(n), where n=p, . . . , L−1, the pth-order prediction coefficients $\alpha^{(p)}_1, \ldots, \alpha^{(p)}_p$ are calculated and set.

Since the pth-order linear prediction requires past p samples, the prediction for the leading samples x(0), . . . , x(p−1) of the current frame calls for rear-end samples of the preceding frame, but as in Embodiment 6, by sequentially increasing the prediction order progressively from 0 to p−1(progressive order) for the samples of sample numbers n=0 to n=p−1 and by performing the pth-order prediction for the samples after the sample number n=p, (consequently, by performing the prediction without using samples of the preceding frame), it is possible to reduce discontinuity of the prediction signal between the preceding and current frames.

Embodiment 7

Figure 4A:
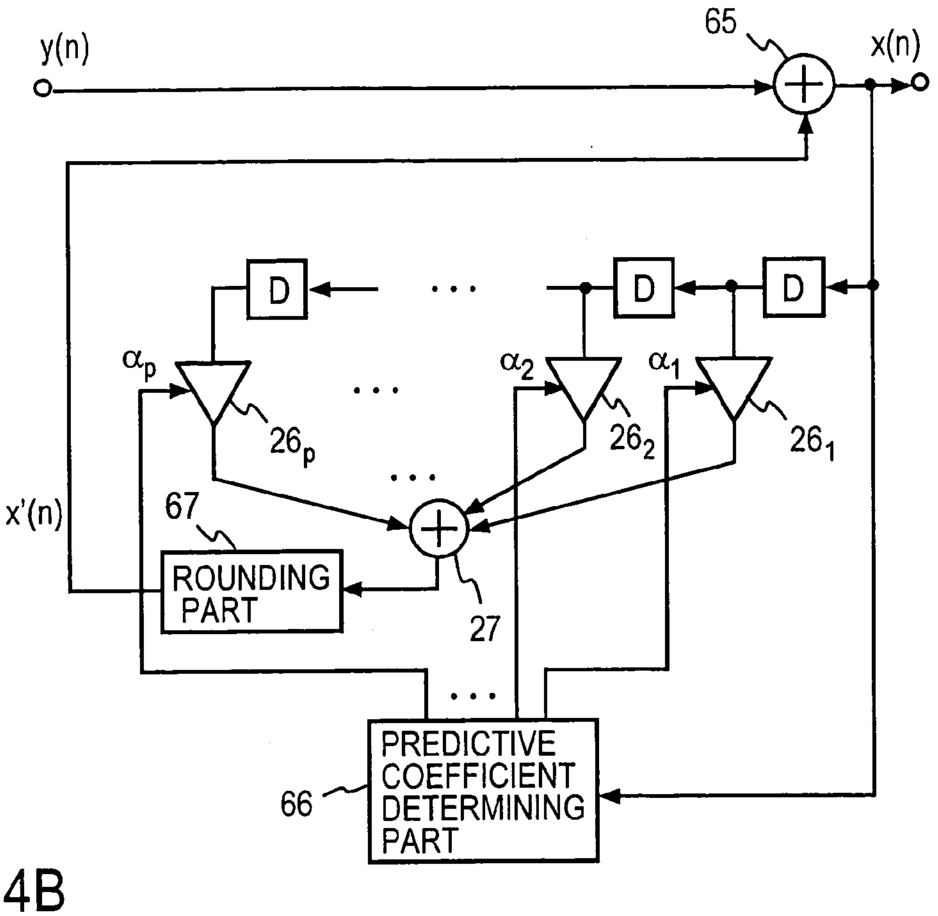
FIG. 4A is a block diagram showing an example of the functional configuration of an autoregressive prediction synthesis part.
Figure 20:
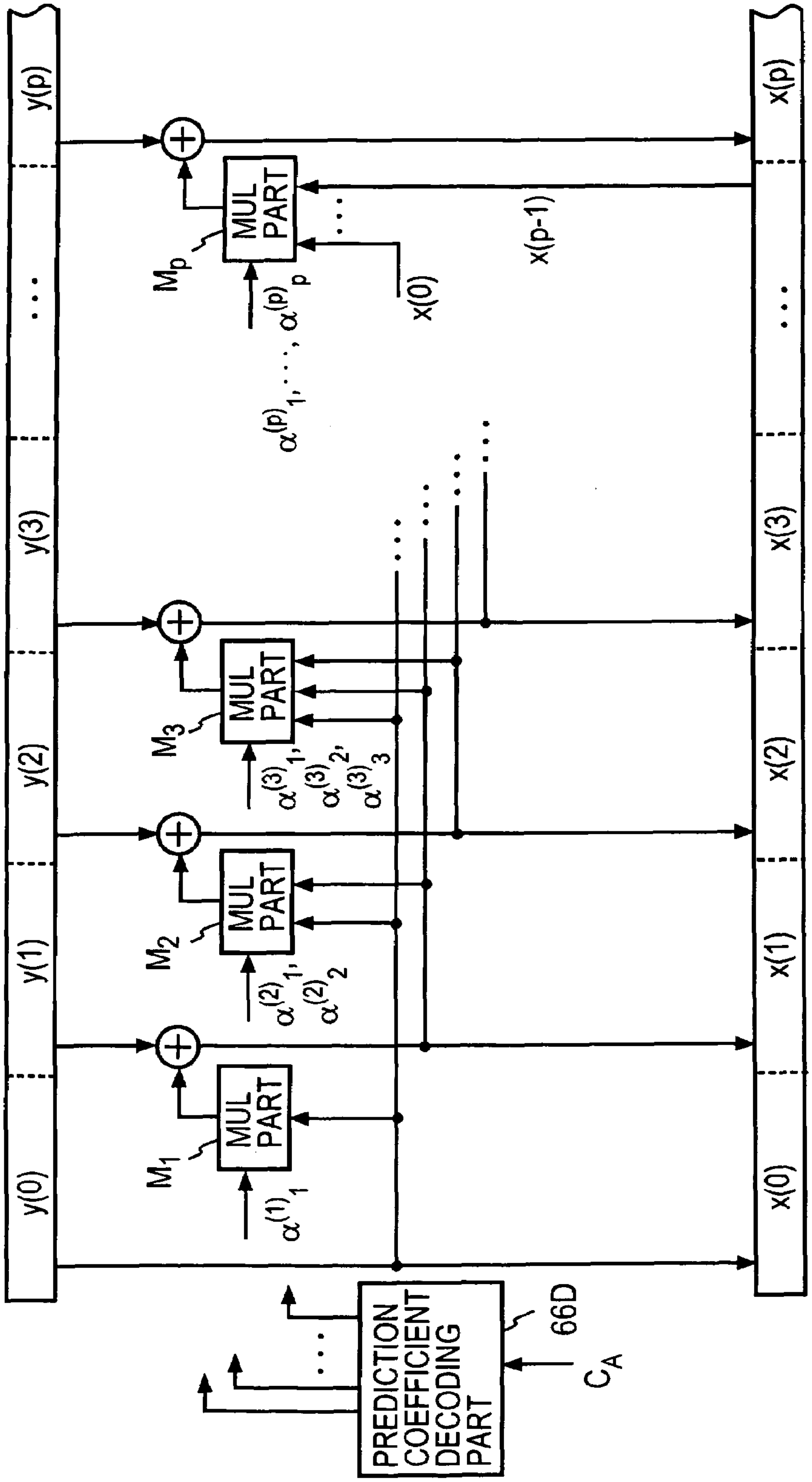
FIG. 20 is a diagram explanatory of Embodiment 7.

FIG. 20 illustrates Embodiment 7 of the prediction synthesis processing (applied to Embodiment 6 of FIG. 4A) corresponding to FIG. 17. A prediction coefficient decoding part 66D decodes pth-order prediction coefficients from its received auxiliary information, and calculates nth-prediction coefficients (n=1, . . . , p−1) from the pth-prediction coefficients. Upon input of the first one y(0) of the prediction error signals y(0), . . . , y(L−1) of the current frame FC, it is out put intact as a prediction synthesis signal x(0). Upon input of the next prediction error signal y(1), a convolution, $\alpha^{(1)}_1$x(0), is conducted in the multiplying part $M_1$ between the 1st-order prediction coefficient $\alpha^{(1)}_1$ obtained from the prediction coefficient decoding part 66D and the x(0) to obtain a prediction value, which is added to y(1) to obtain a synthesis signal x(1).

Upon input of the next prediction error signal y(2), a convolution is conducted in the multiplying part $M_2$ between the 2nd-order prediction coefficients $\alpha^{(2)}_1$, $\alpha^{(2)}_2$ from the prediction coefficient decoding part 66D and x(0), x(1) to obtain a prediction value, which is added to y(2) to obtain a synthesis signal x(2). Thereafter, upon input of y(n) until n=p, x(0), . . . , x(n−1)are convoluted with the nth-order prediction coefficients $\alpha^{(n)}_1, \ldots, \alpha^{(n)}_n$ by the following calculation to obtain a prediction value:

$$\sum_{i=1}^{n} \alpha_i^{(n)} y(n-1)$$

The prediction value is added to y(n) to generate a prediction synthesis signal x(n). After n=p, as is the case with the prior art, the immediately preceding p reconstructed signals x(n−p), . . . , x(n−1) are convoluted with the pth order prediction coefficient to obtain a prediction value, which is added to y(n) to obtain a prediction synthesis signal x(n). In this prediction synthesis, too, by setting the prediction coefficients to the values shown in the FIG. 19 table for the current-frame samples y(n), where n=0, . . . , L−1, it is possible to achieve the prediction synthesis in the current frame without extending over the preceding and succeeding frames.

Embodiment 8

In the linear prediction coefficients, an ith coefficient $\alpha^{(q)}_i$ of an order q takes a different value in accordance with the value of the order q. Accordingly, in Embodiment 6 described above, it is necessary that the prediction coefficient values by which the past samples are multiplied in the multiplying parts $\mathbf{24}_1, \ldots, \mathbf{24}_p$ be changed for each input of the sample x(n) in such a manner that, for example, in FIG. 3A, the 1st-order prediction coefficient $\alpha^{(1)}_1$ is used as a prediction coefficient $\alpha_1$ for the input sample x(1), the 2nd-order prediction coefficients $\alpha^{(2)}_1$, $\alpha^{(2)}_2$ (other αs being 0) are used as prediction coefficients $\alpha_1$, $\alpha_2$ for the input sample x(2), the 3rd-order prediction coefficients $\alpha^{(3)}_1$, $\alpha^{(3)}_2$, $\alpha^{(3)}_3$(other αs being 0) are used as prediction coefficients $\alpha_1$, $\alpha_2$, $\alpha_3$ for an input sample x(3).

On the other hand, in PARCOR coefficients an ith coefficient remains unchanged even if the value of the order q changes. That is, PARCOR coefficients $k_1, k_2, \ldots, k_p$, do not depend on the order. It is well-known that the PARCOR coefficient and the linear prediction coefficient are reversibly transformed to each other. Accordingly, it is possible to calculate the PARCOR coefficients $k_1, k_2, \ldots, k_p$ from the input sample, the 1st-order prediction coefficient $\alpha^{(1)}_1$ from the coefficient $k_1$, and the 2nd-order prediction coefficients $\alpha^{(2)}_1$, $\alpha^{(2)}_2$ from the coefficients $k_1$, $k_2$; thereafter, (p−1)th-order prediction coefficients $\alpha^{(p-1)}_1, \ldots, \alpha^{(p-1)}_{p-1}$ can similarly be obtained from the coefficients $k_1, \ldots, k_{p-1}$. This calculation can be expressed as follows:

For i=1: $\alpha^{(1)}_1=k_1$

For i=2, . . . , p; $\alpha^{(i)}_i=-k_1$ $\alpha^{(i)}_j=\alpha^{(i-1)}_j-k\alpha^i(i-\mathbf{1})_{i-j}$, j=1, . . . , i−1

This calculation can be conducted in a shorter time and hence more effectively than in the case of calculating $\{\alpha^{(1)}_1\}$, $\{\alpha^{(2)}_1, \alpha^{(2)}_2\}$, $\{\alpha^{(3)}_1, \alpha^{(3)}_2, \alpha^{(3)}_3\}, \ldots, \{\alpha^{(p-1)}_1, \alpha^{(p-1)}_2, \ldots, \alpha^{(p-1)}_{p-1}\}$ by linear prediction for the sample number n=1, . . . , p−1 as described previously with reference to Embodiment 6 and 7.

Then Embodiment 8 uses the linear prediction coefficients $\alpha_1, \ldots, \alpha_p$ that are calculated from the PARCOR coefficients in the prediction coefficient determining part 53 in FIG. 3A.

The prediction coefficient determining part 53 calculates pth-order PARCOR coefficients $k_1, k_2, \ldots, k_p$ by linear prediction analysis from all the sample $S_{FC}=\{x(0), \ldots, x(L-1)\}$ of the current frame, which coefficients are separately coded and sent as the auxiliary information $C_A$.

For the input sample x(0), the prediction coefficient determining part 53 outputs it intact as y(0).

Upon input of x(2), the prediction coefficient determining part 53 calculates 2nd-order prediction coefficients $\alpha^{(2)}_1$, $\alpha^{(2)}_2$ from $k_1$ and $k_2$, and sets them in the corresponding multiplier, from which is output a 2nd-order prediction error $y(2)=x(2)-[\alpha^{(2)}_2x(0)+\alpha^{(2)}_1x(1)]$.

Upon input of x(2), the prediction coefficient determining part 53 calculates 2nd-order prediction coefficients $\alpha^{(2)}_1$, $\alpha^{(2)}_2$ from $k_1$ and $k_2$, and sets them in the corresponding multiplier, from which is output a 2nd-order prediction error $y(2)=x(2)-[\alpha^{(2)}_1x(0)+\alpha^{(2)}_2x(1)]$.

Upon input of x(3), the prediction coefficient determining part 53 calculates 3rd-order prediction coefficients $\alpha^{(3)}_1$, $\alpha^{(3)}_2$, $\alpha^{(3)}_3$ from $k_1$ $k_2$ and $k_3$, and sets them in the corresponding multiplier, from which is output a 3rd-order prediction error $y(3)=x(3)-[\alpha^{(3)}_3x(0)+\alpha^{(3)}_2x(1)+\alpha^{(3)}_1x(2)]$.

Similarly, until the sample x(p) is reached, the prediction order is increased in a sequential order, and thereafter pth-order prediction coefficients $\alpha^{(p)}_1, \ldots, \alpha^{(p)}_p$ are used.

Embodiment 9

Figures 21A, 21B:
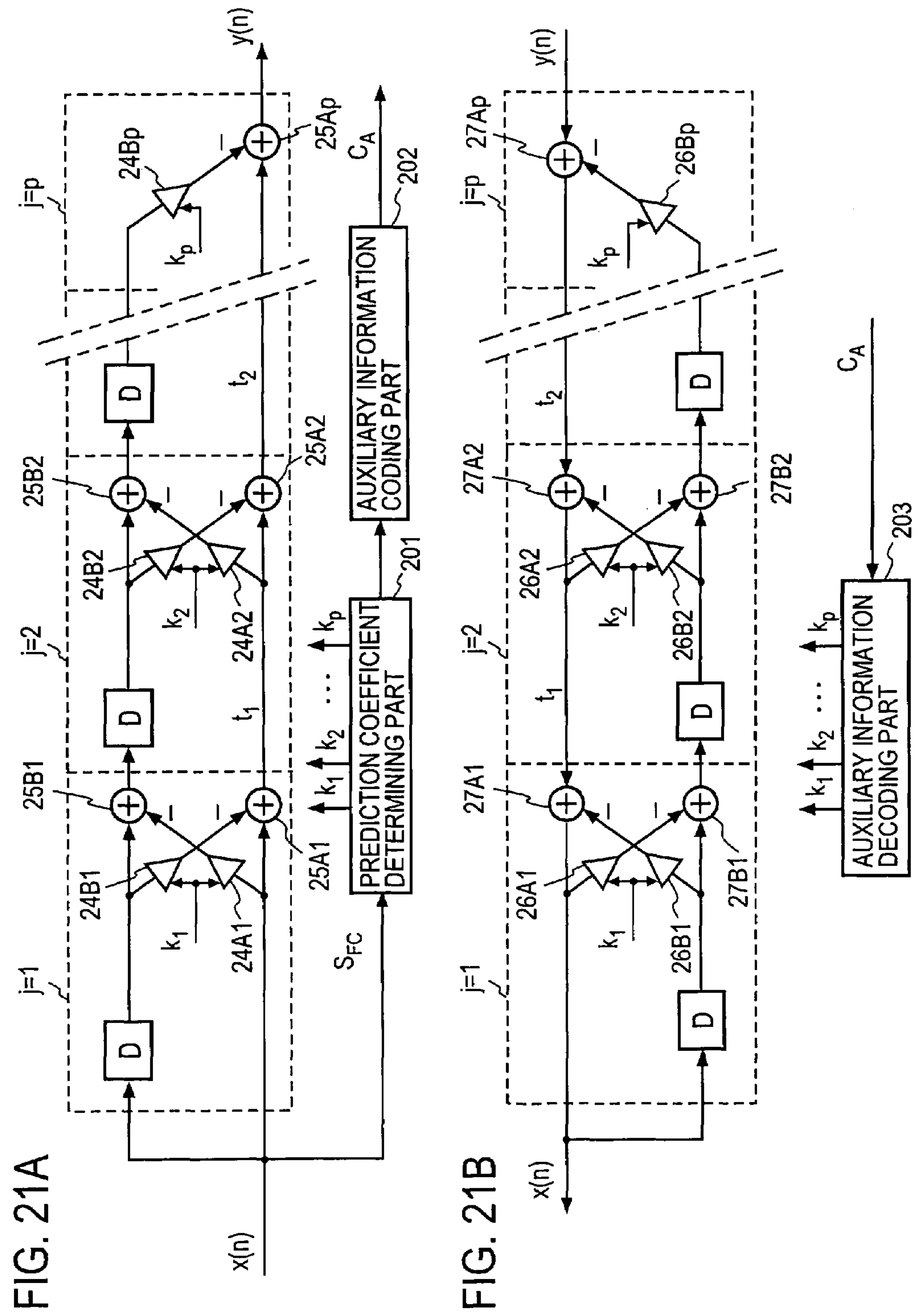
FIG. 21A is a block diagram showing the configuration of a filter for prediction error signal generating processing in Embodiment 9.
FIG. 21B is a block diagram showing the configuration of a filter for prediction synthesis processing that corresponds to the processing in FIG. 21A.

In Embodiment 8 the invention has been described as being applied to the case of using, as the prediction error generating part 51, the autoregressive linear predictor shown in FIG. 3A and calculating the linear prediction coefficients from the PARCOR coefficients; FIG. 21A illustrates the configuration that uses a PARCOR filter as the prediction error generating part 51, for example, in FIG. 1. As depicted in FIG. 21A, the pth-order PARCOR filter is configured by a p-stage cascade connection of basic lattice circuit structures as well-known in the art. A jth basic lattice circuit is composed of: a delay part; a multiplier 24Bj that multiplies the delayed output by a PARCOR coefficient $k_j$ to generate a forward prediction signal; a subtractor 25Aj that subtracts the forward prediction signal from the input signal from the preceding stage and outputs a forward prediction error signal; a multiplier 24Aj that multiplies the input signal and the PARCOR coefficient $k_j$ to generate a backward prediction signal; and a subtractor 25Bj that subtracts the backward prediction signal from the delayed output and outputs a backward prediction error signal. The forward and backward prediction error signals are applied to the next stage. From the subtractor 25Ap of the last-stage (pth stage) is output a prediction error signal y(n) by the pth-order PARCOR. A coefficient determining part 201 calculates the PARCOR coefficients $k_1, \ldots, k_p$ from the input sample sequence x(n), and sets them in the multipliers 24A1, . . . , 24Ap and 24B1 to 24Bj. These PARCOR coefficients are coded in an auxiliary information coding part 202 and output therefrom as the auxiliary information $C_A$.

FIG. 22 presents in tabular form the coefficients k that are set in the pth-order PARCOR filter shown in FIG. 21A in such a manner as to implement prediction based only on the samples of the current frame. As is evident from the table, for each input sample number n from n=0 to n=p, n coefficients $k_1, \ldots, k_n$ are set as is the case with FIG. 19 and the remaining coefficients are set to $k_{n+1}=k_{n+2}, \ldots, =k_p=0$. It is to be noted here that only the coefficient $k_n$ needs to be newly calculated for each sample x(n) in the above-mentioned range and that already calculated coefficients can be used as the coefficients $k_0, k_1, \ldots k_{n-1}$.

In such pth-order PARCOR filtering that uses the PARCOR coefficient k, too, it is possible to reduce the discontinuity of the prediction error signals of the preceding and current frame by sequentially increasing the prediction order from 0 to p−1 for the sample numbers n=0 to n=p−1 and performing the pth-order prediction after the sample number n=p.

FIG. 21B illustrates a configuration that uses a PARCOR filter to implement the prediction synthesis corresponding to the prediction error generation processing described above with reference to FIG. 21A. The filter of this example is formed by a p-stage cascade connection of basic lattice circuit structures as is the case with the filter of FIG. 21A. A jth basic lattice circuit structure is made up of: a delay part D; a multiplier 26Bj that multiplies the output from the delay part D by a coefficient $k_j$ to generate a prediction signal; an adder 27Aj that adds the prediction signal with a prediction synthesis signal from the preceding stage (j+1) and outputs an updated prediction synthesis signal; a multiplier 26Aj that multiplies the updated prediction synthesis signal by the coefficient $k_j$ to obtain a prediction value; and a subtractor 27Bj that subtracts the prediction value from the output from the delay part D and provides a prediction error to the delay part D of the preceding stage (j+1). An auxiliary information decoding part 203 decodes the input auxiliary information $C_A$ to obtain PARCOR coefficients $k_1, \ldots, k_p$ and provides them to the corresponding multipliers 26A1, . . . , 26Ap and 26B1, . . . , 26Bp, respectively.

The prediction error samples y(n) are sequentially input to the adder 27Ap of the first stage (j=p) and are processed using the preset PARCOR coefficients $k_1, \ldots, k_p$, by which the prediction synthesis signal sample x(n) are provided at the output of the adder 27A1 of the last stage (J=1). In this embodiment that performs the prediction synthesis using the PARCOR filter, too, the PARCOR coefficients $k_1, \ldots, k_p$ may be those shown in FIG. 22.

A description will be given below of the procedure for performing the FIG. 21A filtering by calculation.

The first sample x(0) is used intact as the prediction error signal sample y(0).

$$y(0)\leftarrow x(0)$$

Upon input of the second sample x(1), the error signal y(1) is calculated by the 1st-order prediction alone.

$$y(1)\leftarrow x(1)-k_1x(0)$$

$$x(0)\leftarrow x(0)-k_1x(1)$$

Upon input of the third sample x(2), the prediction error signal y(2) is obtained by the following calculation. But x(1) is used to calculate y(3) in the next step.

$$t_1\leftarrow x(2)-k_1x(1)$$

$$y(2)\leftarrow t_1-k_2x(0)$$

$$x(0)\leftarrow x(0)-k_2t_1$$

$$x(1)\leftarrow x(1)-k_1x(2)$$

Upon input of the fourth sample x(3), y(3) is obtained by the following calculation. But x(1) and x(2) are used to calculate y(4) in the next step.

$t_1 \leftarrow x(3) - k_1 x(2)$ $t_2 \leftarrow t_1 - k_2 x(1)$ $y(3) \leftarrow t_2 - k_3 x(0)$ $x(0) \leftarrow x(0) - k_3 t_2$ $x(1) \leftarrow x(1) - k_2 t_1$ $x(2) \leftarrow x(2) - k_1 x(3)$ Thereafter similar calculations are conducted. In this way, prediction processing can be started with the samples of the current frame. Furthermore, until p+1 samples x(n) are input, the k parameter remains unchanged, and another parameter is newly calculated and the order is incremented by one; once p coefficients are determined, the coefficients need only to be updated one by one upon each input of sample.

Similarly, prediction synthesis processing by the PARCOR filter shown in FIG. 21B can be carried out by calculation as described below. This processing is the reverse of the above-described prediction error generation processing at the coding side.

As the first synthesis sample x(0) the input prediction error sample y(0) is used intact.

$x(0) \leftarrow y(0)$

The second prediction synthesis sample x(1) is synthesized only by a 1st-order prediction.

$x(1) \leftarrow y(1) + k_1 x(0)$ $x(0) \leftarrow x(0) - k_1 x(1)$

The third prediction synthesis sample x(2) is obtained by the following calculation. But x(0) and x(1) are used to calculate x(3) in the next step, and they are not output.

$t_1 \leftarrow y(2) + k_2 x(0)$ $x(2) \leftarrow t_1 + k_1 x(1)$ $x(0) \leftarrow x(0) - k_2 t_1$ $x(1) \leftarrow x(1) - k_1 x(2)$ x(3) is obtained by the following calculation. But x(0), x(1) and x(2) are used to calculate x(4) in the next step, and they are not output.

$t_2 \leftarrow x(3) + k_3 x(0)$ $t_1 \leftarrow t_2 + k_2 x(1)$ $x(3) \leftarrow t_1 - k_1 x(2)$ $x(0) \leftarrow x(0) - k_3 t_2$ $x(1) \leftarrow x(1) - k_2 t_1$ $x(2) \leftarrow x(2) - k_1 x(3)$ Thereafter similar calculations are carried out.

FIGS. 21A and 21B illustrate examples of the PARCOR filter configuration for linear prediction processing at the coding side and the PARCOR filter configuration for prediction synthesis processing at the decoding side that is the reverse of the linear prediction processing; but many other PARCOR filters can be used which perform processing equivalent to the above as described below. As referred to previously, however, the linear prediction processing and the prediction synthesis processing are revere processing of each other, and the PARCOR filters are of symmetrical configuration; hence, an example of the PARCOR filter at the decoding side will be described below.

Figure 23:
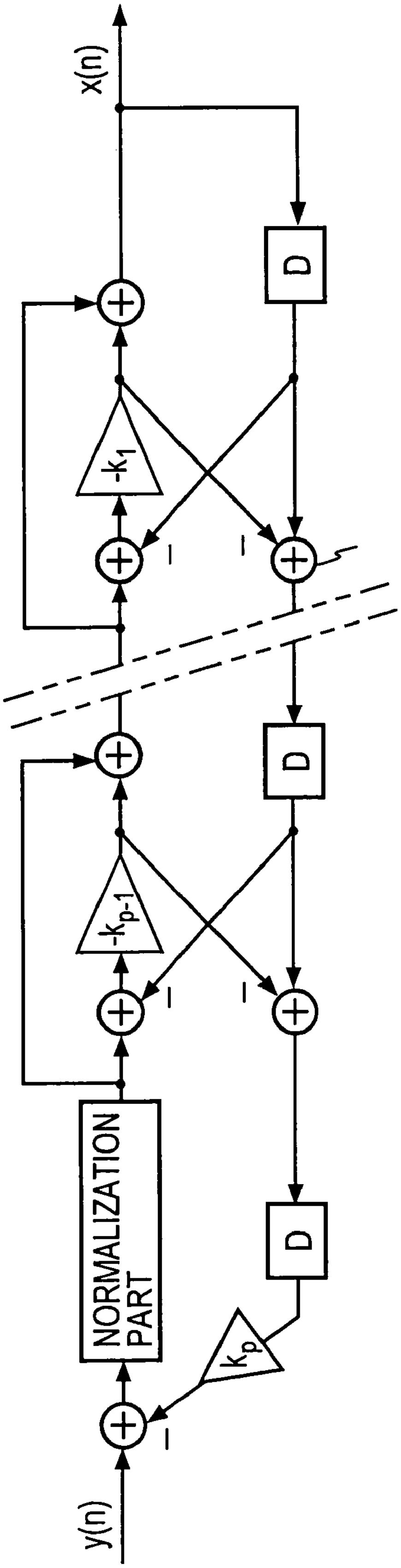
FIG. 23 is a diagram showing another configuration of the filter.

In the PARCOR filter of FIG. 23, no coefficient multiplier is not proivded between signal forward and backward lines and coefficient multipliers are inserted in the forward line.

Figure 24:
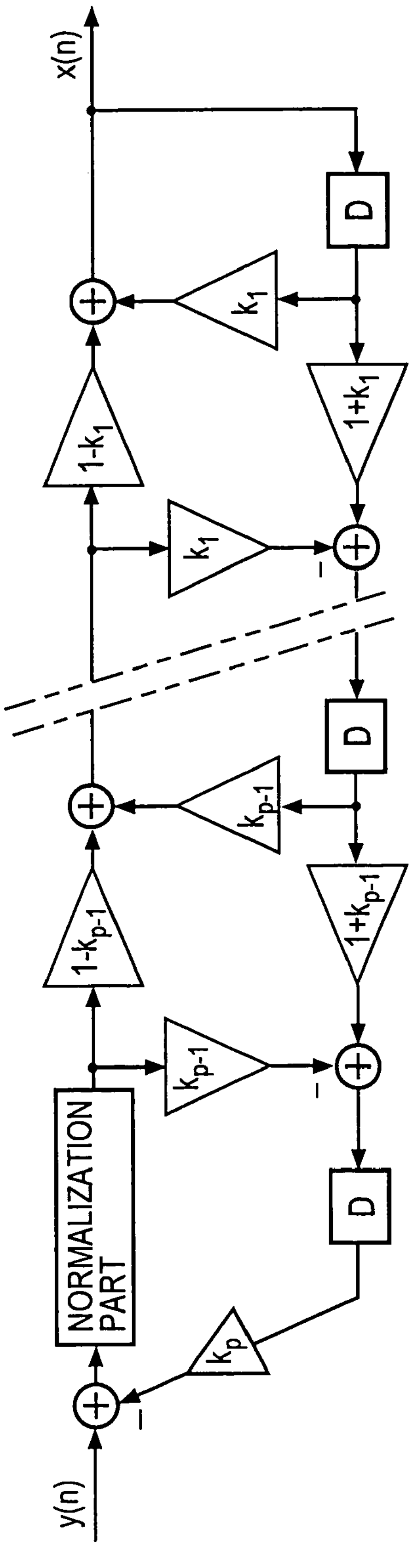
FIG. 24 is a diagram showing another configuration of the filter.

In the PARCOR filter of FIG. 24, coefficient multipliers are inserted in the forward and backward lines of each stage and coefficient multipliers are also inserted between the forward and backward lines.

Figure 25:
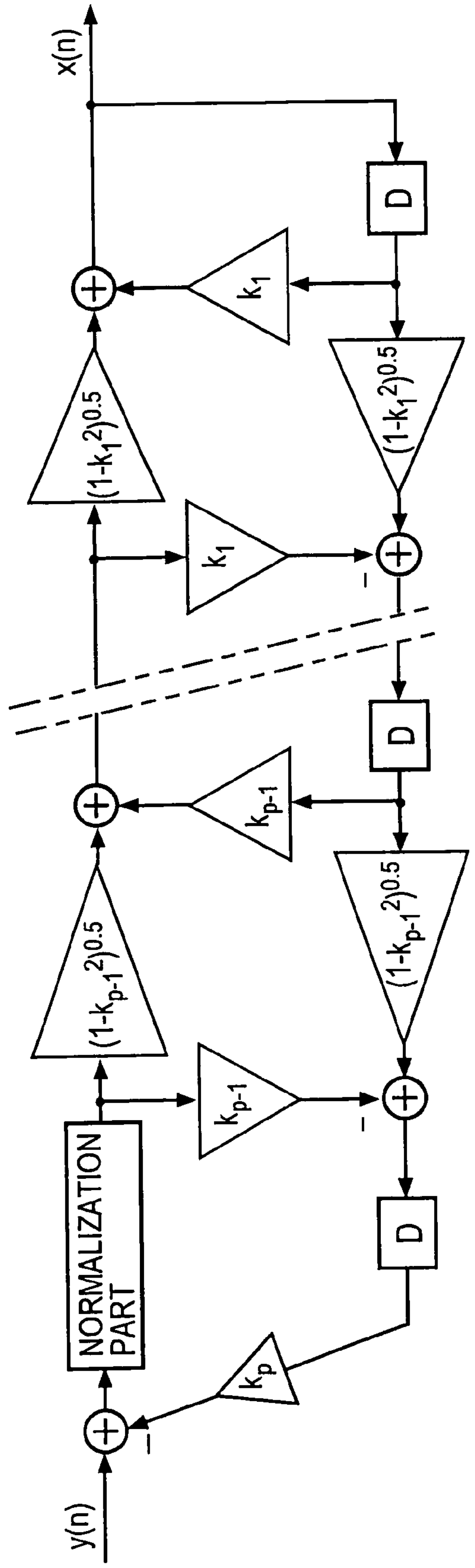
FIG. 25 is a diagram showing still another configuration of the filter.

The PARCOR filter of FIG. 25 is identical in configuration to the filter of FIG. 24 but differs therefrom in the setting of coefficients.

Figure 26:
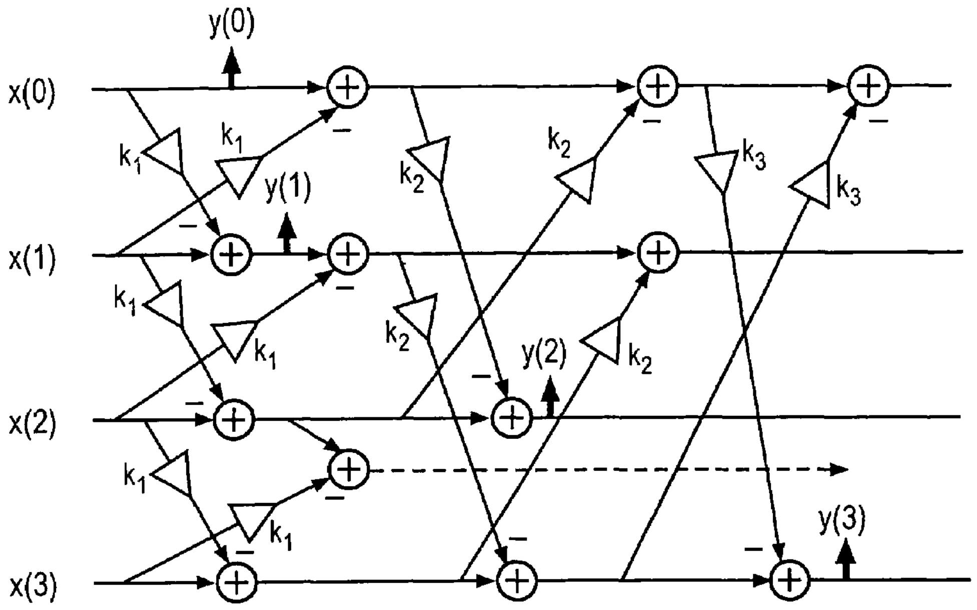
FIG. 26 is a diagram showing the configuration of a filter that does not use delay parts.

FIG. 26 shows an example of a PARCOR filter configured without using delay parts D and adapted to obtain signal errors between parallel forward lines by subtractors inserted in the lines, respectively.

Figure 27:
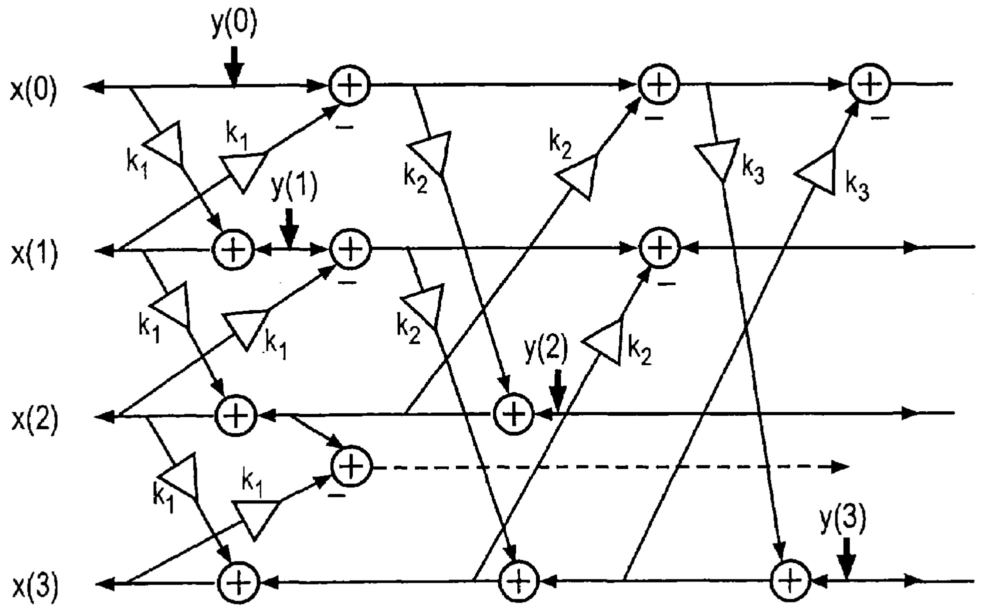
FIG. 27 is a diagram showing the configuration of a filter that performs processing inverse to that of the filter shown in FIG. 26.

FIG. 27 illustrates a PARCOR filter configuration that performs reverse processing corresponding to FIG. 26.

Embodiment 10

Embodiment 9 described above shows the case in which the autoregressive linear prediction filter processing does not use samples of the past frame but instead sequentially increases the order of linear prediction from the starting sample of the current frame to a predetermined number of samples; Embodiment 10 described below does not use samples of the past frame, either, in FIR filter processing and sequentially increases the tap number.

Figures 28A, 28B:
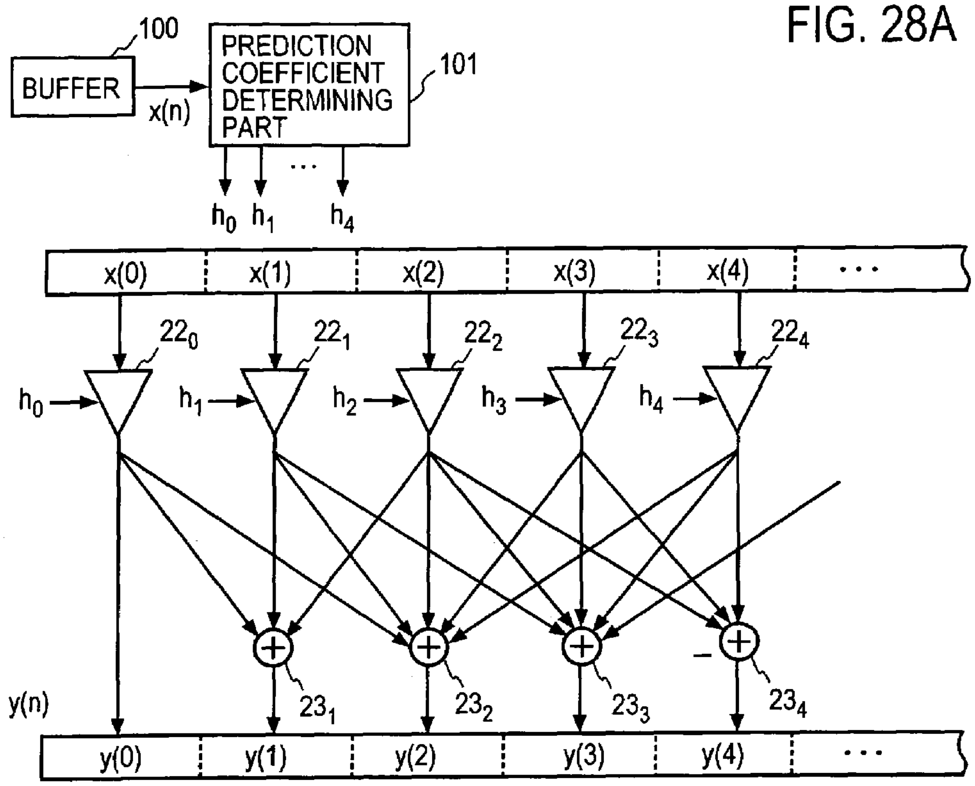
FIG. 28A is a diagram explanatory of Embodiment 10.
FIG. 28B is a table showing setting of filter coefficients in Embodiment 10.

FIG. 28A illustrates an embodiment of the present invention as being applied, for example, to the FIR filtering in the up-sampling part 16 in FIG. 1. In the buffer 100 there are stored samples x(0), . . . , x(L−1)of the current frame FC. As described previously with reference to FIGS. 2A, 2B and 2C, in the case of FIR filtering, a convolution is usually carried out, for the sample x(n) at each point in time n, between that sample and T preceding and succeeding samples, i.e. a total of 2T+1 samples, and coefficients $h_1, \ldots, h_{2T+1}$, but in the case of applying the present invention to the FIR filtering, no samples of the preceding frame are not used, but instead, as shown in the table of FIG. 28B, the tap number of the FIR filter is increased for each sample from the first sample x(0) to the sample x(T) in the current frame, and after the sample x(T) filtering with a predetermined tap number is performed.

FIGS. 28A and 28B exemplify filtering in the case of T=2 for the sake of brevity. A prediction coefficient determining part 101 is supplied with samples x(0), x(1), . . . and, based on them, calculates prediction coefficients h0, h1, . . . for each sample number n as shown in the table of FIG. 28B. The sample x(0) of the current frame, read out of the buffer 100, is multiplied by a multiplier $\mathbf{22}_0$ by the coefficient $h_0$ to obtain an output sample y(0). Then a convolution is carried out, by multipliers $\mathbf{22}_0$, $\mathbf{22}_1$, $\mathbf{22}_2$ and an adder $\mathbf{23}_1$, between samples x(0), x(1), x(2) and the coefficients $h_0$, $h_1$, $h_2$ to obtain an output y(1). Then a convolution is carried out, by multipliers $\mathbf{22}_0, \ldots, \mathbf{22}_4$ and an adder $\mathbf{23}_2$, between samples x(0), . . . , x(4) and the coefficients $h_0, \ldots, h_4$ to obtain an output y(2). Thereafter until n=L−1 is reached, a convolution is carried out between the sample x(n) and four samples preceding and succeeding it, i.e., a total of five samples and the coefficients $h_0, \ldots, h_4$ to obtain the output y(n). After this, since the number of remaining samples of the current frame is smaller than T, the tap number of filtering is decreased one by one.

As described above, in the FIG. 28B example the coefficients $h_0$, $h_1$, $h_2$ are used for the sample number L−2 at the frame terminating side in symmetrical relation to the frame starting side, and for the sample number L−1 only the coefficient $h_0$ is used. However, the frame starting and terminating sides need not always be symmetrical in the use of coefficients. Moreover, in this example, since the samples to be subjected to filtering are each sample x(n) and preceding and succeeding samples of the same number selected symmetrically with respect to said each sample, the tap number of filtering is increased from 1 to 3, 5, . . . , 2T+1 one by one for each of the samples x(0) to x(T). However, the samples to be subjected to filtering need not always be selected symmetrically with respect to the sample x(n).

Figure 29:
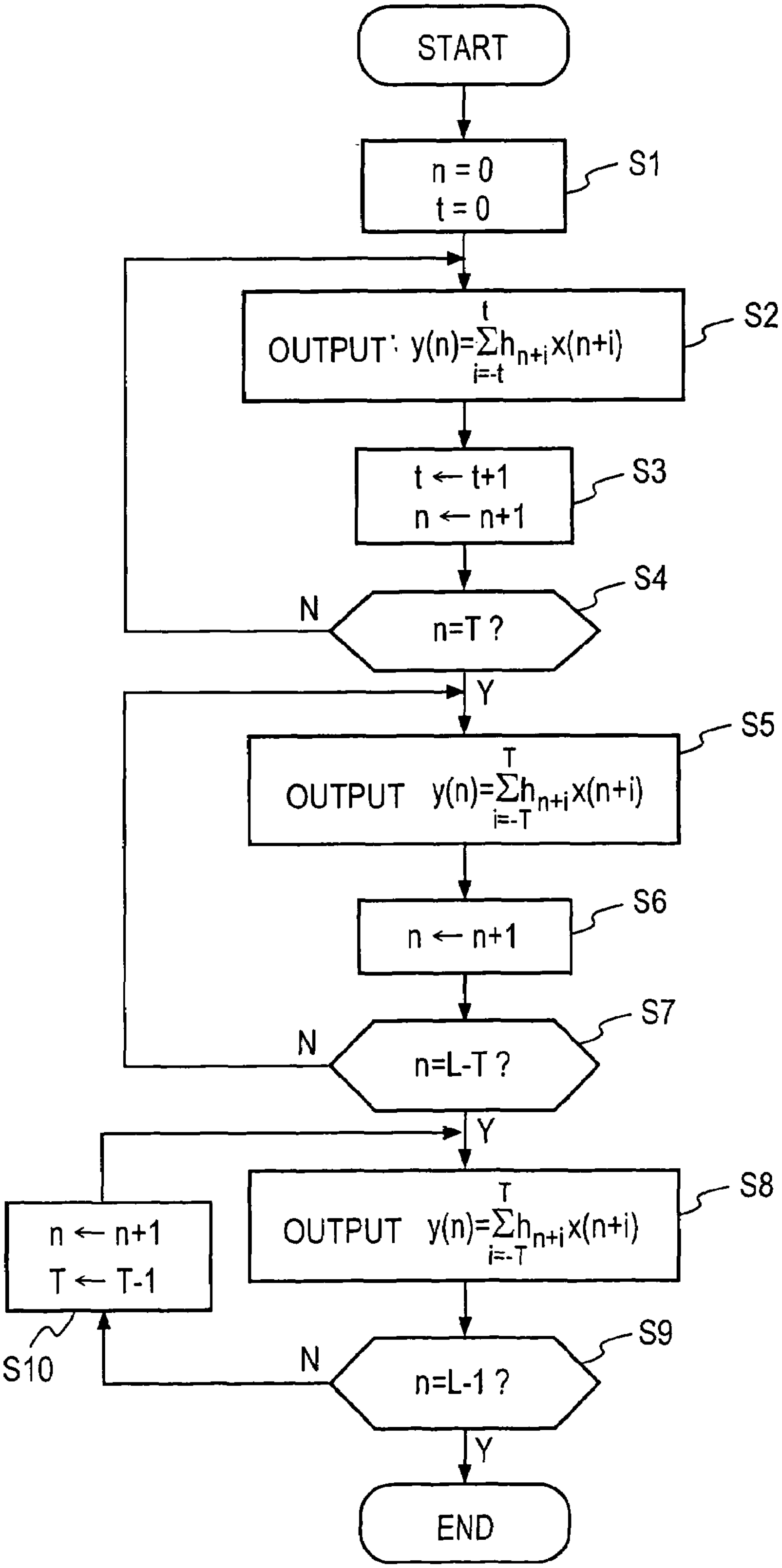
FIG. 29 is a flowchart showing the procedure of Embodiment 10.

FIG. 29 shows the FIR filtering procedure of Embodiment 10 described above.

Step 1: Initialize the sample number n and a variable t to zeros.

Step S2: Perform a convolution for the input sample by the following calculation to output the y(n).

$$y(n) = \sum_{i=-1}^{t} h_{n+i}x(n+i)$$

Step S3: Increment t and n by one, respectively.

Step S4: Make a check to see if n=T, and if not, return to step S2 and perform steps S2, S3 and S4. As a result, a convolution is carried out with the tap number increased with an increase of n.

Step S5: If n=T, perform convolution by the following calculation to output y(n).

$$y(n) = \sum_{i=-T}^{T} h_{n+i}x(n+i)$$

Step S6: Increment n by one.

Step S7: Make a check to see if n=L−T, and if so, return to step S5 and perform steps S5, S6 and S7 again. As a result, filtering is repeatedly carried out with a tap number 2T+1 until n=L−T is reached.

Step S8: If n=L−T, perform a convolution by the following calculation to output y(n).

$$y(n) = \sum_{i=-T}^{T} h_{n+i}x(n+i)$$

Step S9: Make a check to see if n=L−1, and if not, end filtering.

Step 10: If not n=L−T, increment n by one and decrement T by one, then return to step S8 and perform step S8 and S9 again. As a result, filtering is carried out with the tap number gradually decreased with an increase of n toward the rear end of the frame.

Embodiment 11

Embodiment 11 utilizes the scheme of gradually increasing the prediction order by Embodiment 10 without using the alternative sample sequence in Embodiment 4. This embodiment will be described below with reference to FIGS. 30, 31 and 32.

Figure 30:
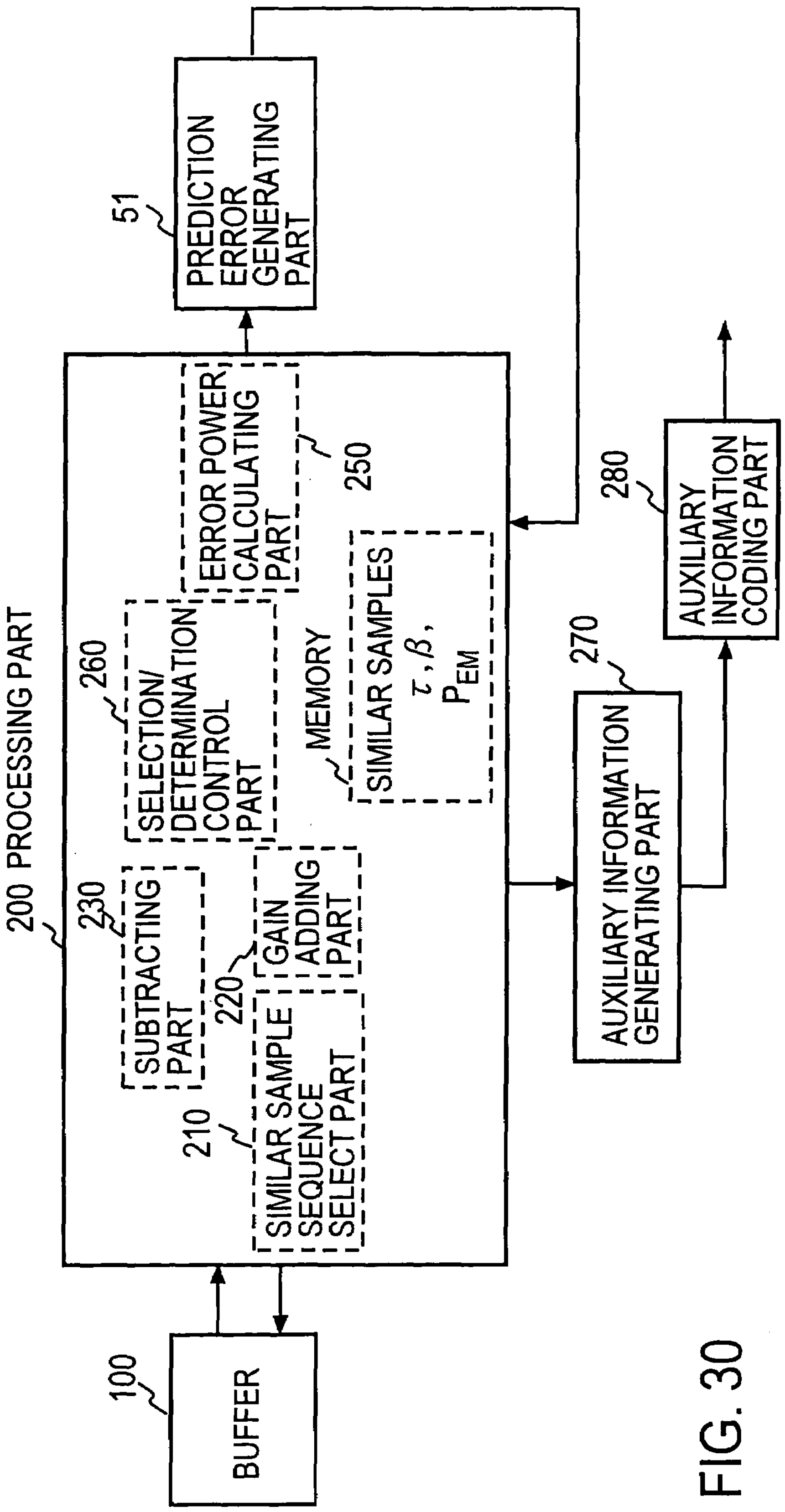
FIG. 30 is a block diagram explanatory of Embodiment 11.

As depicted in FIG. 30, the processing part 200 is identical in configuration to the processing part shown in FIG. 11 except that the former does not use the alternative sample sequence concatenating part 240 in the latter. The prediction error generating part 51 performs the prediction error generation described previously with reference to FIG. 17, 18, or 21A.

Figure 31:
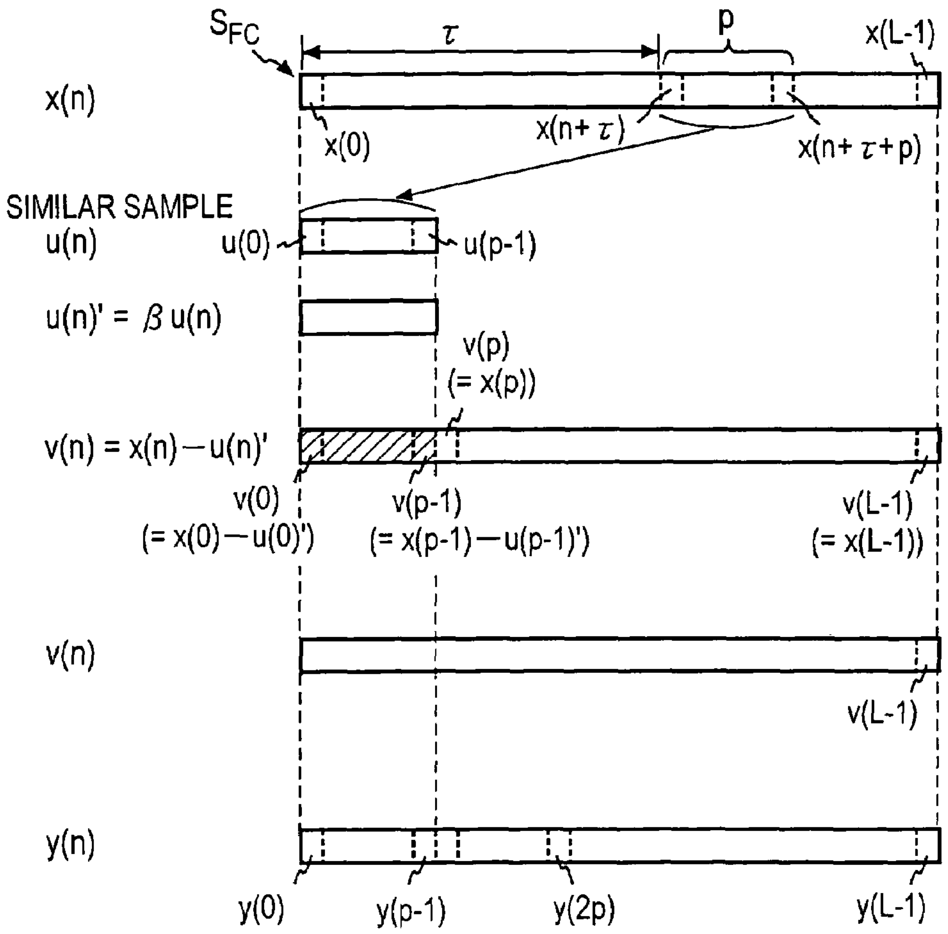
FIG. 31 is a diagram for explaining processing of Embodiment 11.
Figure 32:
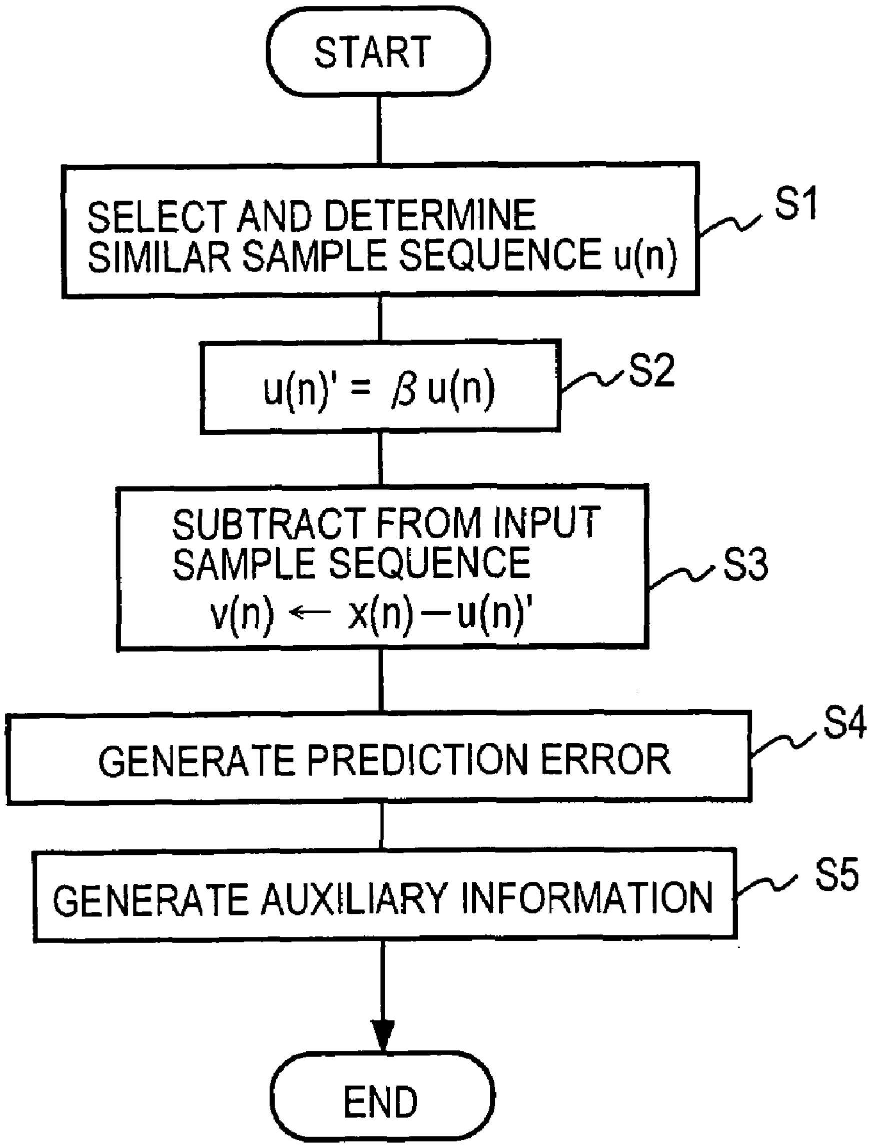
FIG. 32 is a flowchart showing the procedure of Embodiment 11.

As described previously in respect of FIGS. 11, 12 and 13, the digital signal (sample sequence) $S_{FC}$(=[x(0), . . . , x(L−1)1) of one frame FC to be processed is stored, for example, in the buffer 100, and a sample sequence x(n+τ), . . . , x(n+τ+p−1) similar to the leading sample sequence x(0), . . . , x(p−1) in the frame FC is read out by a similar sample sequence select part 210 from the sample sequence $S_{FC}$ of the frame FC in the buffer 100 (S1). The similar sample sequence x(n+τ), . . . , x(n+τ+p−1) is shifted to the front position in the frame FC to form a similar sample sequence u(0), . . . , u(p−1) as shown in FIG. 31, then the similar sample sequence u(n) is multiplied by a gain β (where 0<β≦1) in the gain multiplying part 220 to obtain a sample sequence u(n)'=βu(n) (S2), and the sample sequence u(n)' is subtracted from the sample sequence x(0), . . . , x(L−1) of the current frame FC in the subtracting part 230 to provide such a sample sequence v(0), . . . , v(L−1) as depicted in FIG. 12 (S3). That is, For n=0, . . . , p−1: v(n)=x(n)−u(n)'

For n=p, . . . , L−1: v(n)=x(n)

After multiplication of the sample sequence x(n+τ), . . . , x(n+τ+p−1) the multiplied sample sequence may be displaced to the front position in the frame to form the sample sequence u(n)'.

The sample sequence v(0), . . . ., v(L−1) is input to the prediction error generating part 51, wherein it is subjected to the autoregressive prediction, described previously with reference to FIG. 17, 18 or 21A to generate the prediction error signal y(0), . . . , y(L−1) (S5).

The position τ and the gain β of the similar sample sequence x(n+τ), . . . , x(n+τ+p−1) are determined under the control of the selection/determination control part 260 as described previously with reference to Embodiment 4.

A prediction error signal is generated for the sample sequence v(p), . . . , v(L−1) generated using the τ and β determined as described above (S4), then the auxiliary information AI indicating the τ and β used at that time is generated in the auxiliary information generating pat 270, and if necessary, the auxiliary information AI is coded into the code $C_{AI}$ in the auxiliary information coding part 28. The auxiliary information AI or code $C_{AI}$ is added to as part of the encoding code of the input digital signal of the frame FC by the coder.

In the above, the value τ may preferably be larger than the prediction order p, and the value τ needs only to be determined such that the sum, ΔU+τ, of the length ΔU of the similar sample sequence u(n) and τ is equal to or smaller than L−1, that is, x(τ+ΔU) falls within the range of the current frame FC. The length ΔU of the similar sample sequence u(n) needs only to be equal to or smaller than τ, is not related to the prediction order p and may be equal to or smaller or larger than p, but it may preferably be equal to or greater than p/2. The front position of the similar sample sequence u(n) need not be brought into agreement with the front position in the frame FC, that is, the sample sequence u(n) may be shifted to such a position that n=3, . . . , 3+ΔU, for instance. The gain β for multiplying the similar sample sequence u(n) may also be weighted in dependence on the sample, that is, the sample sequence u(n) may be multiplied by a predetermined window function ω(n), in which the auxiliary information is enough to indicate τ alone.

Embodiment 12

Figure 34:
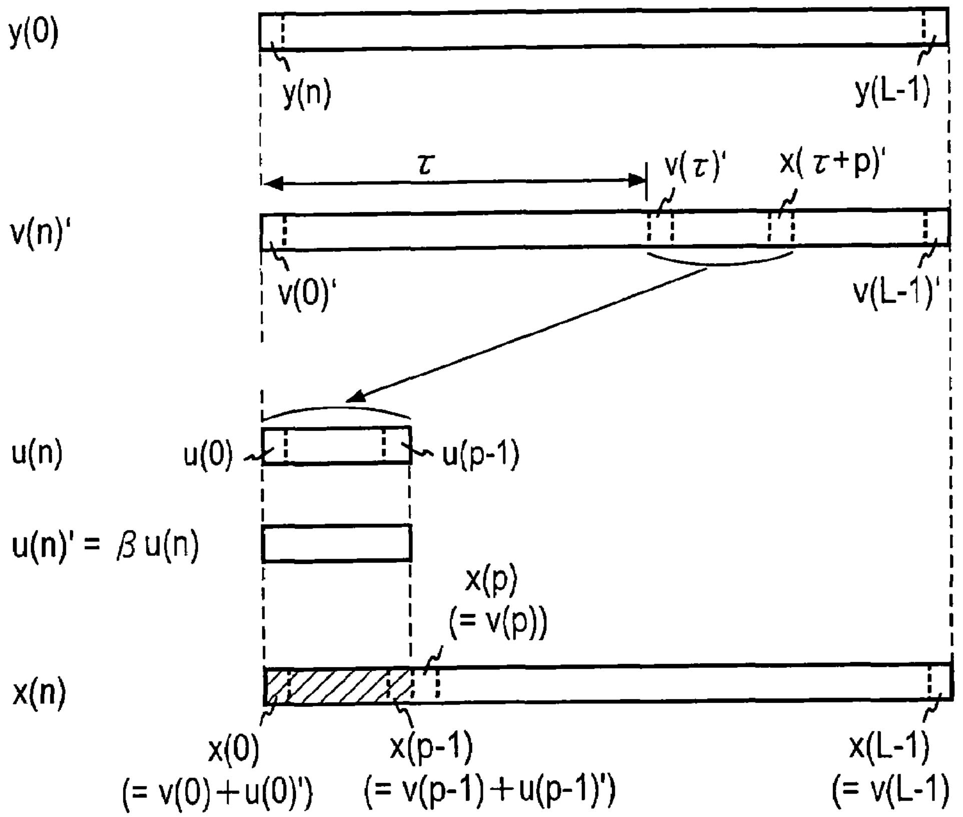
FIG. 34 is a diagram for explaining processing of Embodiment 12.
Figure 35:
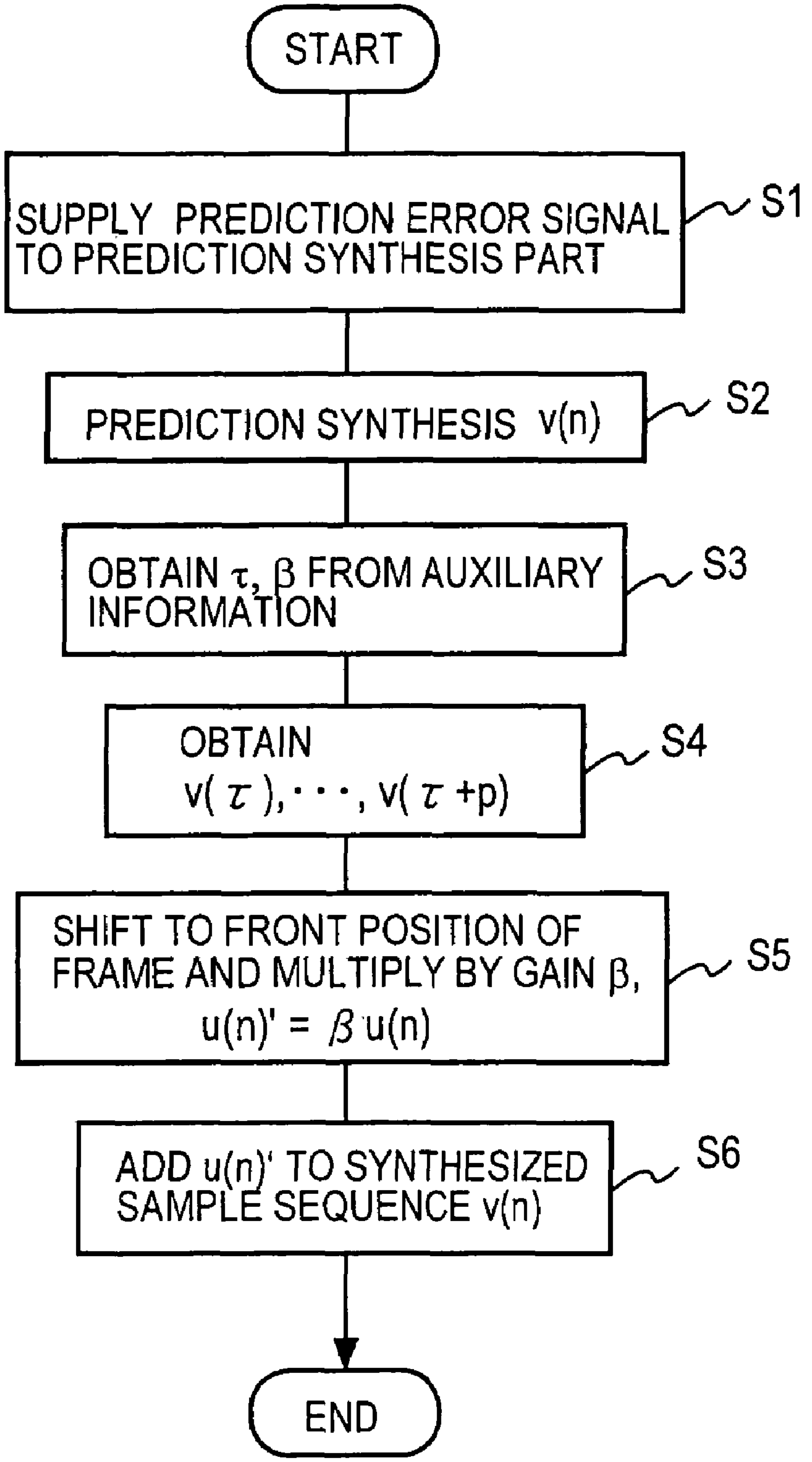
FIG. 35 is a flowchart showing the procedure of Embodiment 12.

A description will be given, with reference to FIGS. 33, 34 and 35, of an embodiment of the prediction synthesis processing method corresponding to Embodiment 11. As is the case with Embodiment 4 described previously in respect of FIGS. 14, 15 and 16, this prediction synthesis processing method is used, for instance in the prediction synthesis part 63 in the decoder 30 in FIG. 1, and provides a decoded signal of excellent continuity and quality particularly in the case of starting decoding from an intermediate frame.

Figure 33:
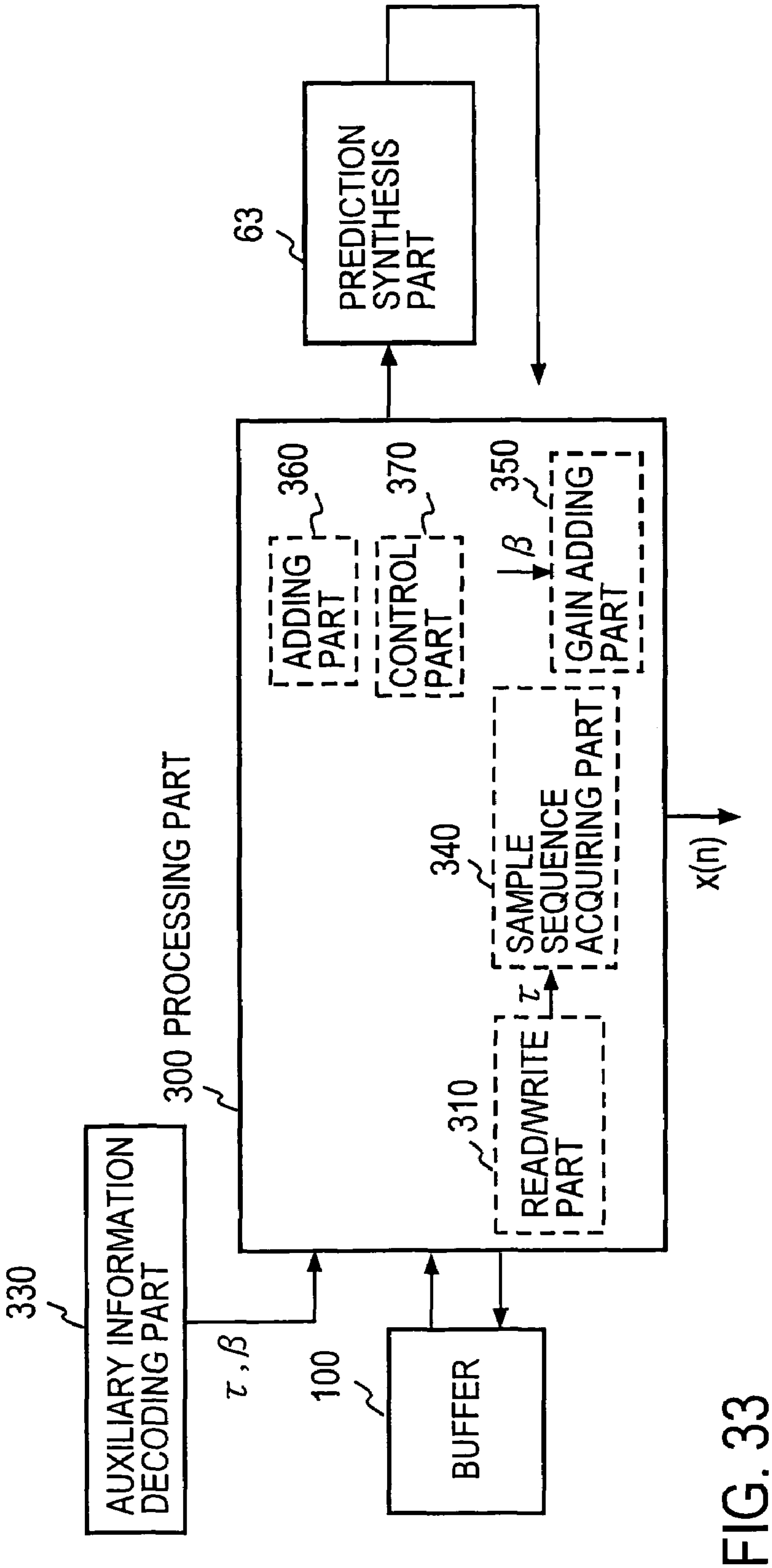
FIG. 33 is a block diagram explanatory of Embodiment 12.

The example of the functional configuration of FIG. 33 is identical to that of FIG. 14 except that the alternative sample generating part 320 in the processing part 300 is removed. However, the prediction synthesis part 63 performs the same prediction synthesis processing as described previously with respect to Embodiment 4 in FIG. 20 or 21B.

The sample sequence y(0), . . . , y(L−1) of the current frame FC of the digital signal (a prediction error signal) to be subjected to prediction synthesis processing by the autoregressive prediction scheme is prestored, for example, in the buffer 100, from which the sample sequence y(0), . . . , y)L−1) is read out by the read/write part 310.

The sample sequence y(0), . . . , y(L−1) is fed to the prediction synthesis part 63, with the first sample in the head (S1). The sample sequence is subjected to the prediction synthesis processing to generate a prediction synthesis signal v(n)' (where n=0, . . . , L−1) (S2). The prediction synthesis signal v(n)' is temporarily stored in the buffer 100. This prediction synthesis utilizes the scheme described previously with reference to FIG. 20 or 21B.

In the auxiliary information decoding part 330 the auxiliary code CAI, which forms part of the code of the current frame FC, is decoded into auxiliary information, from which τ and β are obtained (S3). In some cases, the auxiliary information itself is input to the auxiliary information decoding 330. In the sample sequence acquiring part 340 a sample sequence v(τ), . . . , v(τ+p) consisting of a predetermined number p, in this example, of consecutive samples, is replicated from the synthesis signal (sample) sequence v(n) by use of τ, that is, the sample sequence v(τ), . . . , v(τ+p) is acquired with the prediction synthesis signal sequence v(n) unchanged (S4), and this sample sequence is shifted to bring its forefront to the front position in the frame FC to obtain a sample sequence u(n), which is multiplied in the gain multiplying part 350 by the gain β obtained from the auxiliary information, thereby generating a corrected sample sequence u(n)'=βu(n) (S5).

This corrected sample sequence u(n)' is added to the prediction synthesis sample (signal) sequence v(n) to obtain a normal prediction synthesis signal x(n) (where n=0, . . . , L−1) (S6). The prediction synthesis sample sequence x(n) is:

For n=0, . . . , p−1: x(n)=v(n)+u(n)'

For n=p . . . , L−1: x(n)=v(n)

Since Embodiment 12 corresponds to Embodiment 11, the length ΔU of the corrected sample sequence u(n)' is not limited-specifically to p, that is, it is not related to the prediction order but is predetermined; and the position of the lead sample of the corrected sample sequence u(n)' need not always be brought into agreement with the lead sample v(0) of the synthesis signal v(n) and this also predetermined. Moreover, in some cases the gain β is not contained in the auxiliary information but instead it is weighted by a predetermined window function ω(n) for each sample u(n).

Third Mode of Working

In the third mode of working of the present invention, for example, in the case where frame-wise coding of the original digital signal includes processing for generating an autoregressive prediction error signal or interpolation filter processing, the last sample sequence of the (past) frame immediately preceding the current frame or the leading sample sequence of the current frame is coded separately, and the code (auxiliary code) is added to a part of the encoded code of the current frame of the original digital signal. At the time of subjecting the above-mentioned prediction synthesis or interpolation filter processing at the decoding side, when there is no code of the (past) frame preceding the current frame, the auxiliary code is decoded, and decoded sample sequence is used as a rear-end synthesis signal of the preceding frame in the prediction synthesis of the current frame.

Embodiment 13

Figure 3B:
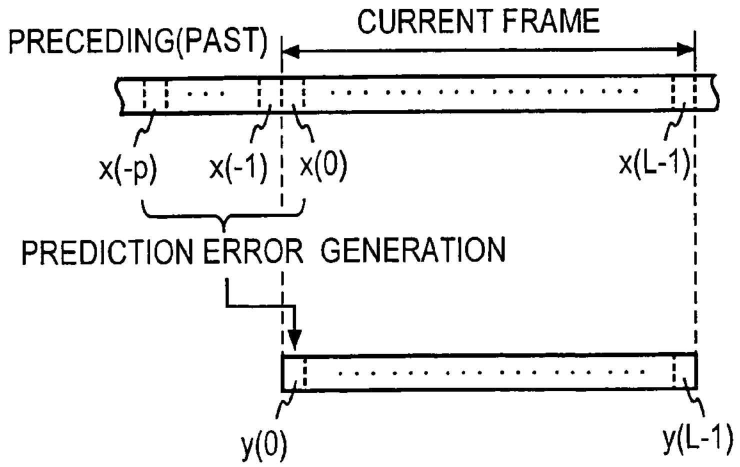
FIG. 3B is a diagram explanatory of its processing.
Figure 36:
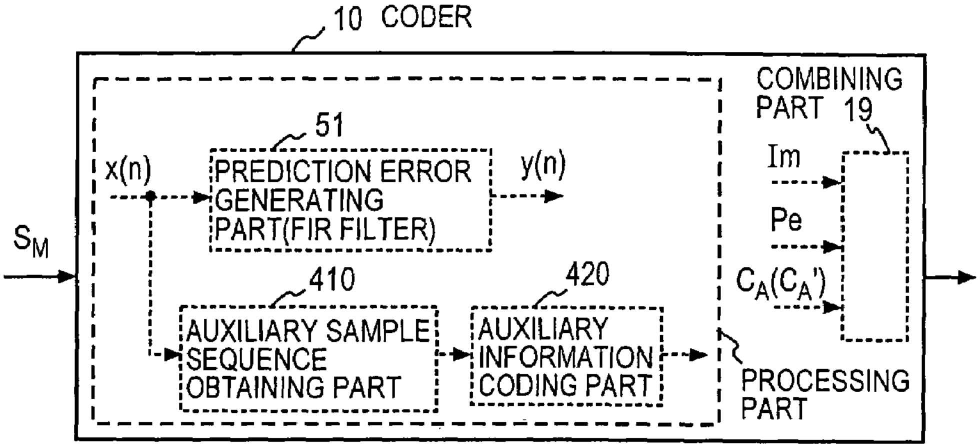
FIG. 36 is a diagram illustrating an example of the functional configuration of Embodiment 13.

A description will be given, with reference to FIGS. 36 and 37, of Embodiment 13 of the third mode of working of the invention. Embodiment 13 is an application of the third mode of working to the prediction error generating part 51 in the coder 10 in FIG. 1, for instance. The original digital signal $S_M$ is coded by the coder 10 on a frame-by-frame basis, and a code is output for each frame. The prediction error generating part 51, which performs a portion of the coding processing, makes an autoregressive prediction of the input sample sequence x(n) to generate the prediction error signal y(n) and output it for each frame as described previously with reference to FIGS. 3A and 3B, for instance.

The input sample sequence x(n) is branched into two, one of which is provided to an auxiliary sample sequence obtaining part 410, wherein the rear-end samples x(−p), . . . , x(−1) of the (past) frame immediately preceding the current frame FC are obtained by a number equal to the prediction order p in the prediction error generating part 51, and the samples thus obtained are provided as an auxiliary sample sequence. The auxiliary sample sequence x(−p), . . . , x(−1) is coded in an auxiliary information coding part 420 to generate an auxiliary code $C_A$, and this auxiliary code $C_A$ is used as a part of the encoded code of the original digital signal of the current frame FC. In this example, the main code Im, the error code Pe and the auxiliary code CA are combined in the combining part 19, from which they are output as a set of codes of the current frame FC, which is transmitted or recorded.

The auxiliary information coding part 420 does not always encode the auxiliary sample sequence x(−p), . . . , x(−1) (which is usually a PCM code) but instead may outputs the sample sequence after adding thereto a code indicating that it is an auxiliary sample sequence. Preferably, the auxiliary sample sequence is subjected to compression coding, for example, by a differential PCM code, prediction code (prediction error+prediction coefficient) or vector quantization code.

Figure 37:
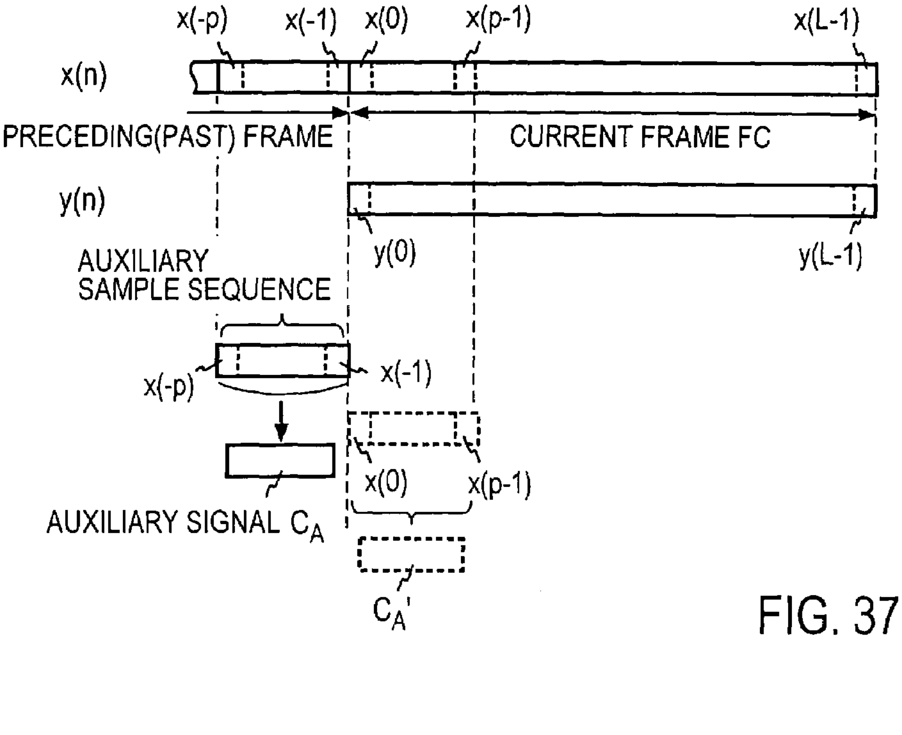
FIG. 37 is a diagram explanatory of Embodiment 13.

As indicated by the broken lines in FIG. 37, leading samples x(0), . . . , x(p−1) in the current frame corresponding in number to the prediction order may also be obtained in the auxiliary sample sequence obtaining part 410 without using the rear-end samples of the preceding frame. The auxiliary code in this case is indicated by $C_A'$ in FIG. 37.

Embodiment 14

Figure 4B:
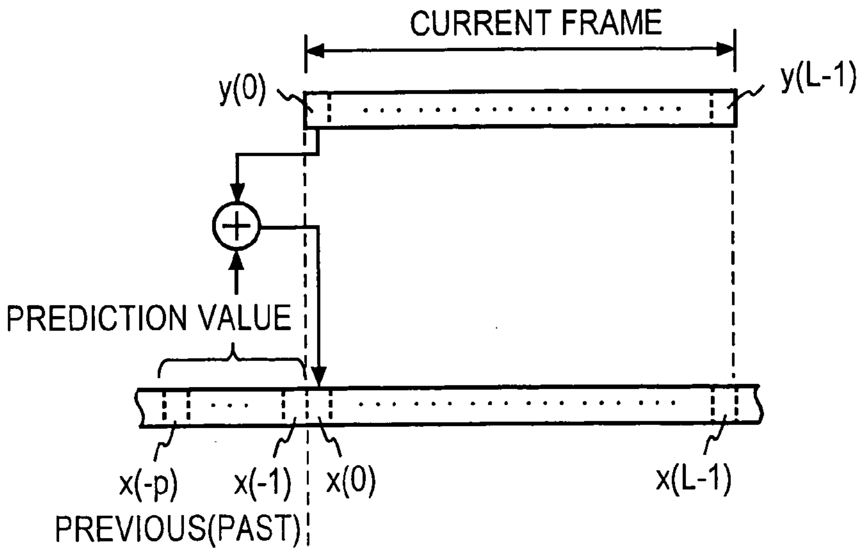
FIG. 4B is a diagram explanatory of its processing.

A description will be given, with reference to FIGS. 38 and 39, of Embodiment 14 that performs the prediction synthesis corresponding to the prediction error generation in Embodiment 13. Sets of codes, into which the original digital signal SB was encoded frame by frame, are input to, for example, the decoder 30 in FIG. 1 in such a manner as to permit identification of each frame. In the decoder 30 sets of codes for each frame are separated into respective codes, which are used to perform decoding. As one portion of the decoding processing, digital processing is carried out for autoregressive prediction synthesis of the prediction error signal y(n) in the prediction synthesis part 63. This prediction synthesis is performed in the manner described previously in respect to FIGS. 4A and 4B, for instance. In other words, the prediction synthesis of the leading portion y(0), . . . , y(p−1) calls for the rear-end samples x(−p), . . . , x(−1) in the prediction synthesis signal of the preceding (past) frame.

In the absence of the code set of the preceding (past) frame, for example, when the code set (Im, Pe, $C_A$) of the preceding frame is not available due to packet dropout during transmission, or when decoding is started from the code set of an intermediate one of a plurality of consecutive frames for random access, the absence of the code set of the preceding frame is detected in a dropout detecting part 450, then the auxiliary code $C_A$ (or $C_A'$) (the auxiliary code CA or CA' described previously with reference to Embodiment 13) separated in the separating part 32 is decoded in an auxiliary information decoding part 460 into the auxiliary sample sequence x(−p), . . . , x(−1) (or x(0), . . . , c(p−1)), then this auxiliary sample sequence is input as a prediction-synthesis rear-end sample sequence x(−p), . . . , c(−1) to the prediction synthesis part 63, then the prediction error signals y(0), . . . , y(L−1) of the current frame are sequentially input to the prediction synthesis part 63, which performs prediction synthesis to generate the synthesis signal x( ), . . . , x(L−1). The auxiliary code $C_A$ ($C_A'$) is double and hence is redundant, but a prediction synthesis signal of excellent continuity and quality can be obtained. The decoding scheme in the auxiliary information decoding part 460 is a scheme corresponding to the coding scheme in the auxiliary information coding part 420 in FIG. 36.

Figure 2A:
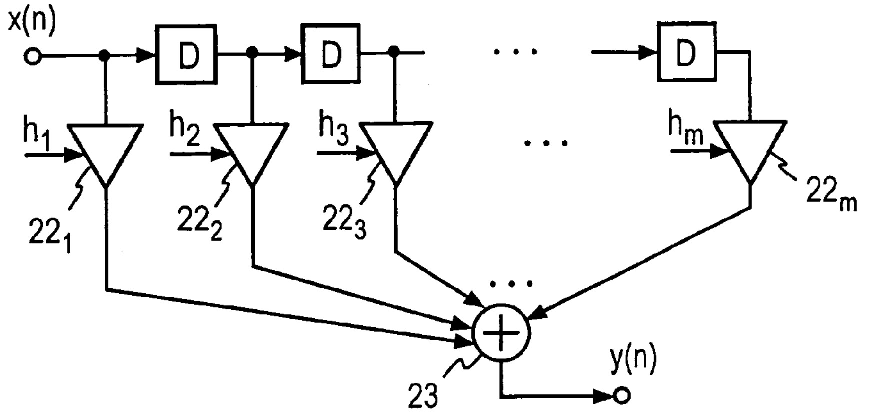
FIG. 2A is a diagram showing an example of the functional configuration of a filter for processing that extends over preceding through succeeding frames.
Figure 2B:
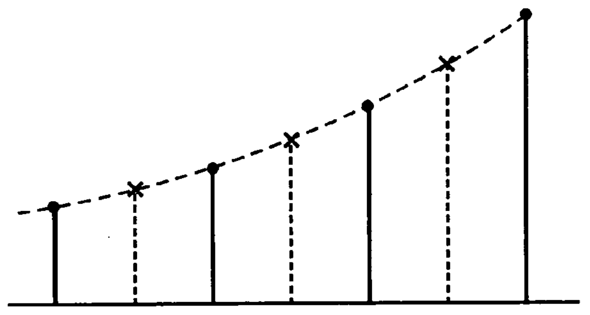
FIG. 2B is a diagram showing an example of processing by an interpolation filter.
Figure 2C:
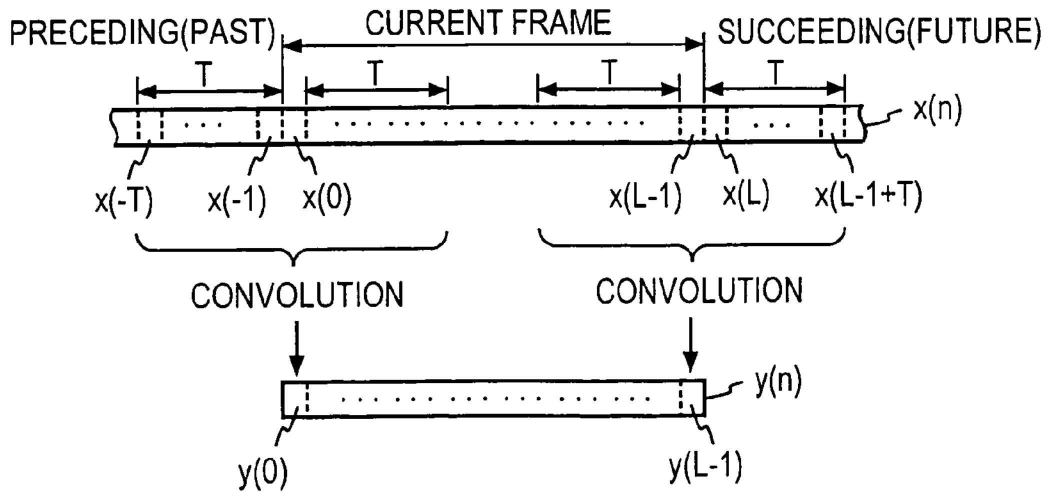
FIG. 2C is a diagram explanatory of processing that extends over preceding through succeeding frames.
Figure 38:
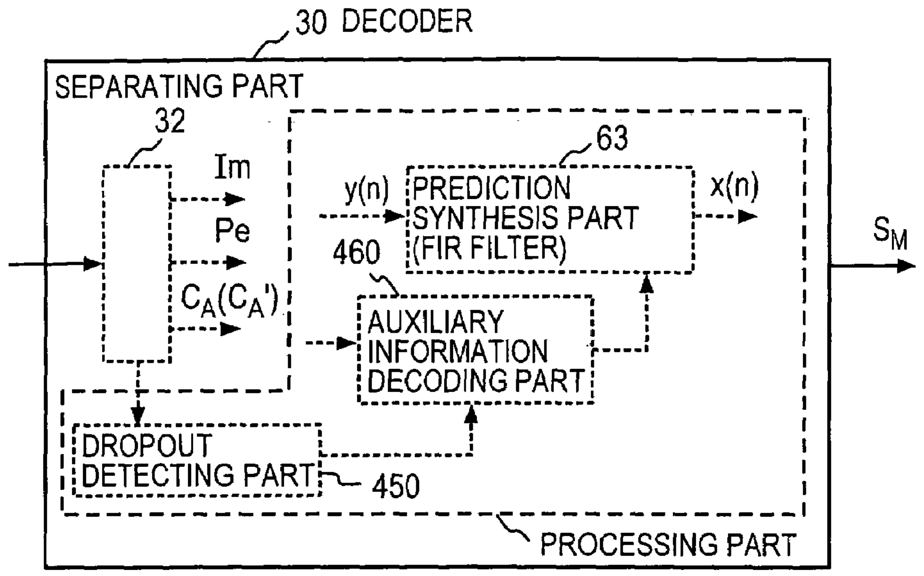
FIG. 38 is a diagram illustrating an example of the functional configuration of Embodiment 14.
Figure 39:
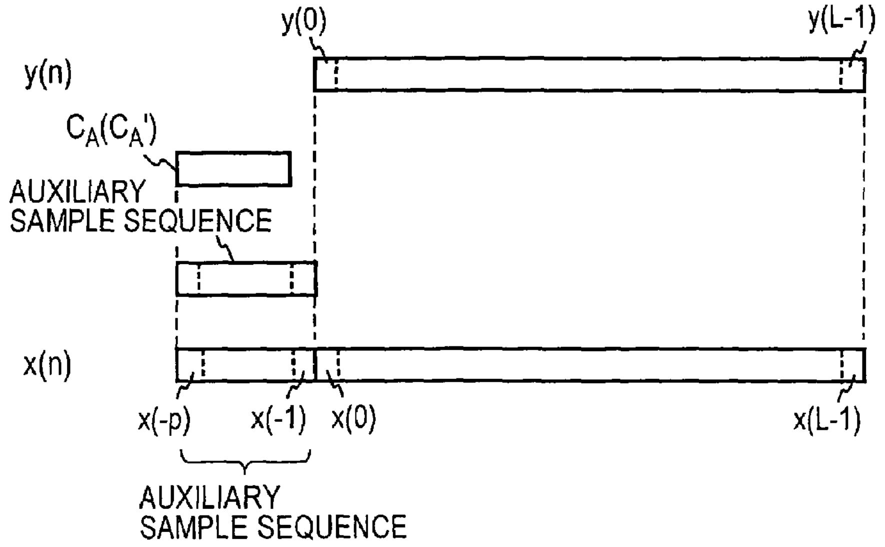
FIG. 39 is a diagram explanatory of Embodiment 14.

In the above there has been described, with reference to FIGS. 36 to 39, the digital signal processing associated with, for example, the prediction error generating part 51 in the coder 10 and the prediction synthesis part 63 in the decoder in FIG. 1, but the same scheme as described above is also applicable to the digital signal processing associated with the FIR filter of FIG. 2A which is used in the up-sampling parts 16 and 34 in FIG. 1. In such a case, the prediction error generating part 51 in FIG. 36 and the prediction synthesis part 63 in FIG. 38 are each substituted with the FIR filter of FIG. 2A as indicated in the parentheses. The procedure for signal processing is exactly the same as described previously with respect to FIGS. 36 to 39.

The most outstanding feature of the embodiments of FIGS. 36 to 39 is such as described below. That is, in the coding and decoding system in FIG. 1, the rear-end sample sequence of the preceding frame (or the leading sample sequence of the current frame) of an error signal, that is, the input signal, for example, to the prediction error generating part 51 which is a signal at the intermediate stage of coding process, is sent out as the auxiliary code $C_A$ of the current frame together with the other codes Im and Pe; accordingly, at the receiving side, if a frame dropout is detected, the prediction synthesis can be started immediately in the next frame in the prediction synthesis part 63 by adding to the head of the error signal of the current frame the sample sequence obtained from the auxiliary code available in the current frame.

Various codes can be used as the auxiliary code as referred to previously, but since the auxiliary sample sequence consists of a very small number of samples nearly equal to the prediction order, for instance, if a PCM code of the sample sequence, for example, is used as the auxiliary code $C_A$, the auxiliary code CA of the current frame can be used intact as raw auxiliary sample sequence data after detection of the frame dropout at the decoding side, and hence decoding can be started at once. The application of this scheme to the RIF filter of the up-converting part also produces the same effects as mentioned above.

Practical Embodiment 1

Figure 40:
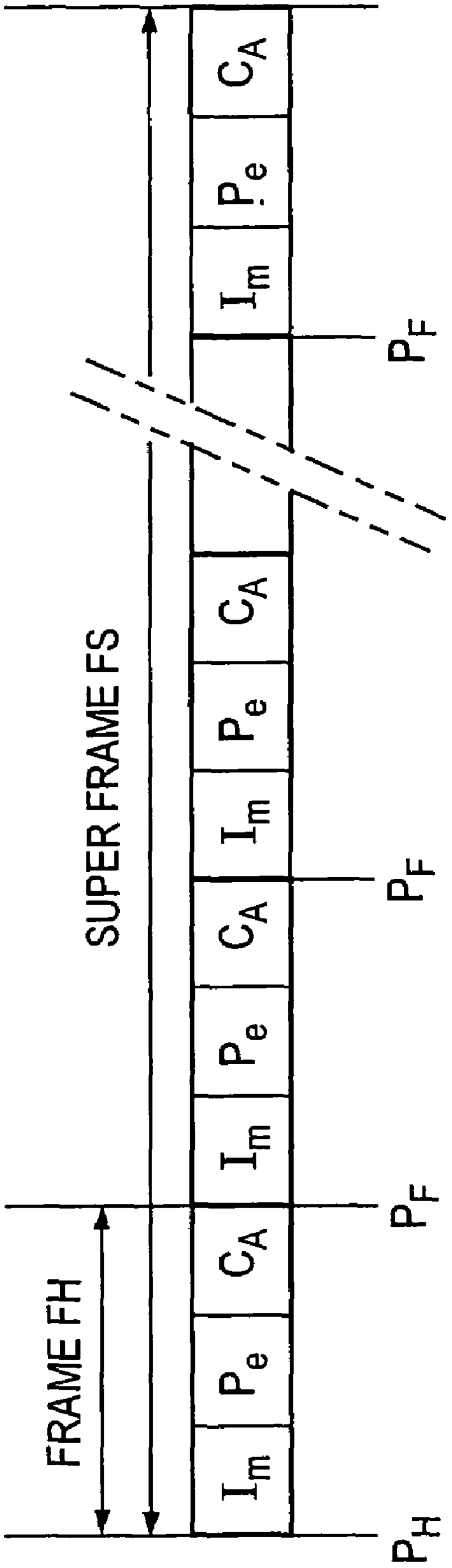
FIG. 40 is a diagrams showing an example of a transmission signal frame configuration.

In the case of receiving video, audio or like information being delivered over the Internet, users cannot make random access at any frame and, in general, they are allowed to make random access only at the head $P_H$ of a first frame FH of a frame sequence forming a super frame SF shown in FIG. 40. In each frame there are inserted the main code IM and the auxiliary code $C_A$ in addition to the prediction error code Pe of the prediction error signal subjected to the afore-mentioned digital signal processing, and the super frame FS composed of such frames is transmitted in packetized form.

At the point in time the receiving side makes random access to the first frame, it has no information on the preceding frame, and hence it concludes processing only with samples in the first frame. In such an instance, too, if the frame concerned is subjected to the digital signal processing by the present invention described above in its embodiments, it is possible to increase the accuracy of linear prediction immediately after random access and hence start high-quality reception in a short time.

For only the random-access starting frame, the digital processing is concluded with only samples in that frame without using samples of the preceding frame. This permits implementation of either of forward linear prediction and backward linear prediction. On the other hand, at each frame boundary $P_F$ it is possible to start linear prediction processing that utilizes samples of the immediately preceding frame.

Figure 41A:
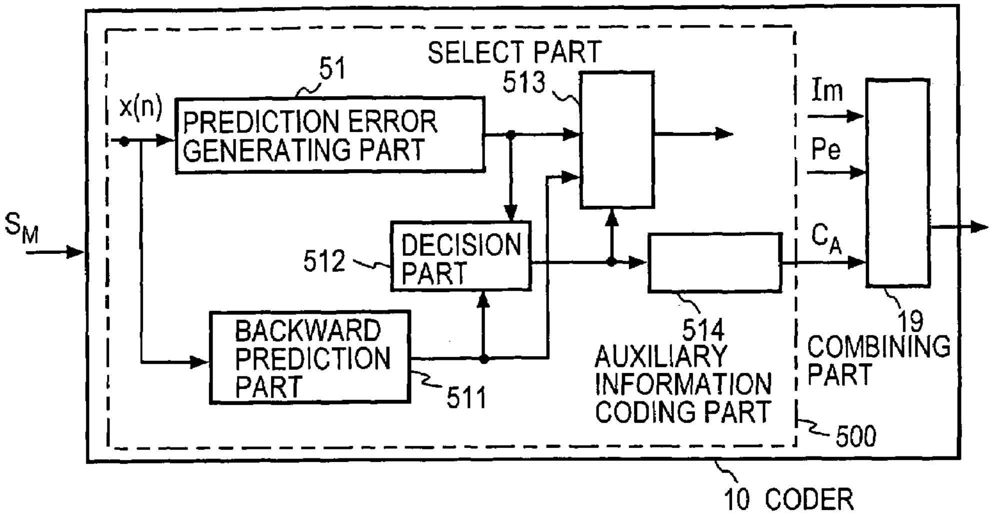
FIG. 41A is a diagram for explaining a coding-side processing part in Practical Embodiment 1.

FIG. 41A illustrates an embodiment of the coder configuration applicable to the embodiments described previously with reference to FIGS. 17, 21A and 30. In this embodiment a processing part 500 of the coder 10 has the prediction error generating part 51, a backward prediction part 511, a decision part 512, a select part 513, and an auxiliary information coding part 514. Though not shown, the coder 10 further includes a coder for generating the main code and a coder for coding the prediction error signal y(n) into the prediction error code Pe. The codes Im, Pe and $C_A$ are packetized in the combining part and output therefrom.

In this practical embodiment the backward prediction part 511 performs linear prediction backward of the header symbol of the random-access starting frame. The prediction error generating part 51 performs forward linear prediction for the samples of frames. The decision part 512 encodes the prediction error obtained by the forward linear prediction of the samples of the random-access starting frame by the prediction error generating part 51 and encodes the prediction error obtained by the backward linear prediction of the samples of the starting frame by the backward linear prediction part 511, then compares the amounts of codes, and provides select information SL for selecting the code of the smaller amount to a select part 513. The select part 513 selects and outputs the prediction error signal y(n) of the smaller amount of code for the random-access starting frame, and for the subsequent frames the select part selects the output from the prediction error generating par 51. The select information SL is coded in the auxiliary information coding part 514 and output therefrom as the auxiliary code $C_A$.

Figure 41B:
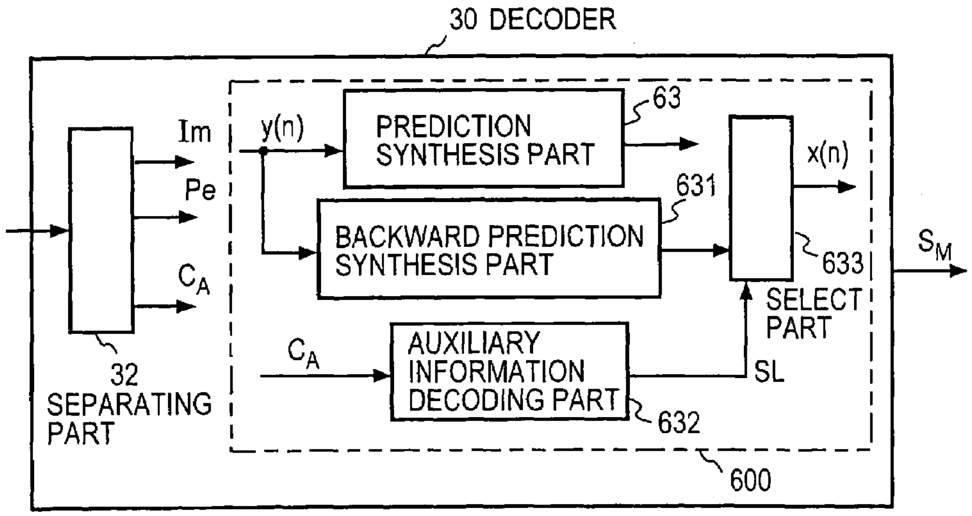
FIG. 41B is a diagram for explaining a decoding-side processing part corresponding to FIG. 41A.

FIG. 41B illustrates the decoder 30 corresponding to the coder 10 of FIG. 41A, and the decoder is applicable to the embodiments of FIGS. 20, 21B and 33. The main code Im and the prediction error code Pe, separated from the packet in the separating part 32, are decoded by decoders not shown. A processing part 600 has the prediction synthesis part 63, a backward prediction synthesis part 63, an auxiliary information decoding part 632, and a select part 633. The prediction error signal y(n) decoded from the prediction error code Pe is subjected to prediction synthesis in the prediction synthesis part 63 for the samples of all frames. On the other hand, the backward prediction synthesis part 631 performs backward prediction synthesis only for the random-access starting frame. In the auxiliary information decoding part 632 the auxiliary information $C_A$ is decoded to obtain the select information, which is used to control the select part 633 to select, for the random-access starting frame, the output from the prediction synthesis part 63 or the output from the backward prediction synthesis part 631. For all the subsequent frames, the output from the prediction synthesis part 63 is selected.

Practical Embodiment 2

Figure 42A:
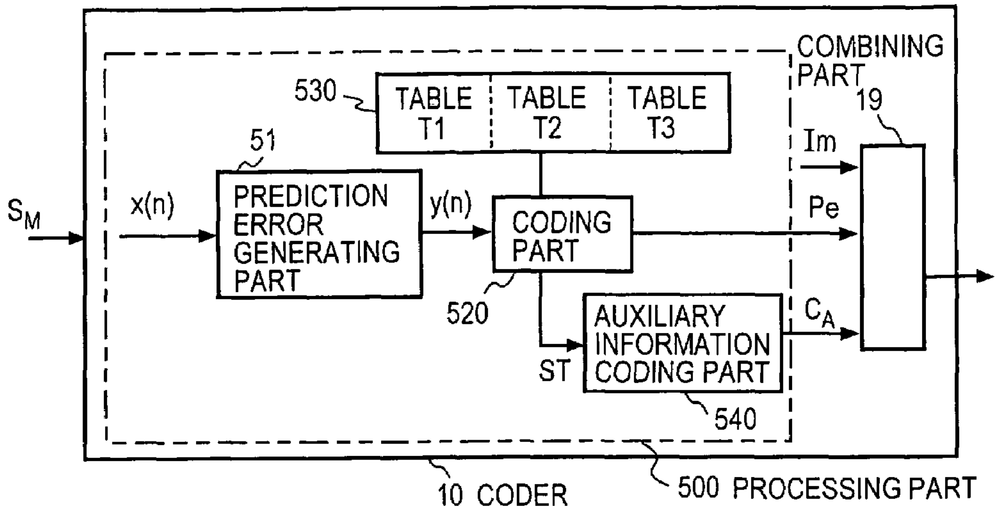
FIG. 42A is a diagram for explaining a coding-side processing part in Practical Embodiment 2.

As described previously, in the prediction error generation processing of the sample sequence at the coding side in the embodiments of FIGS. 17 and of the sample sequence at the coding side in the embodiments of FIGS. 17 and 21A, the first sample x(0) of the frame is output intact as the prediction error sample y(0), and the subsequent samples x(1), x(2), . . . , c(p−1) are subjected to 1st-, 2nd-, . . . , pth-order prediction processing, respectively. That is, the first sample of the random-access starting frame has the same amplitude as that of the original sample x(0), and as the prediction order increases to 2nd, 3rd, . . . , pth order, the prediction accuracy increases and the amplitude of the prediction error decreases. By utilizing this to adjust parameters of entropy coding, the amount of codes can be reduced. FIG. 42A illustrates a coder 10 capable of adjusting the entropy coding parameter and the processing part 500 therefor, and FIG. 42B illustrates the decoder 30 and its processing part 600 corresponding to those in FIG. 42A.

As shown in FIG. 42A, the processing part 500 includes the prediction error generating part 51, a coding part 520, a coding table 530, and an auxiliary information coding part 540. The prediction error generating part 51 performs, for the sample x(n), the prediction error generation processing described previously in respect of FIG. 17 or 21A, and the prediction error signal sample y(n). The coding part 520 performs Huffman coding by reference to the coding table 530, for instance. In this example, with respect to the first sample x(0) and the second sample x(1) large in amplitude, a dedicated table T1 is used to code them, and with respect to the third and subsequent samples x(2), x(3), . . . , the maximum amplitude is detected for each predetermined number of samples, then one of a plurality of tables, two tables T2 and T3 in this example, is selected according to the detected maximum amplitude value, and the plurality of samples is coded into the error code Pe. And, a select information ST indicating which coding table was selected for each plurality of samples is output. The select information ST is coded by the auxiliary information coding part 54 into the auxiliary information $C_A$. The codes Pe and $C_A$ of the plurality of frames are packetized together with the main code Im and sent out.

Figure 42B:
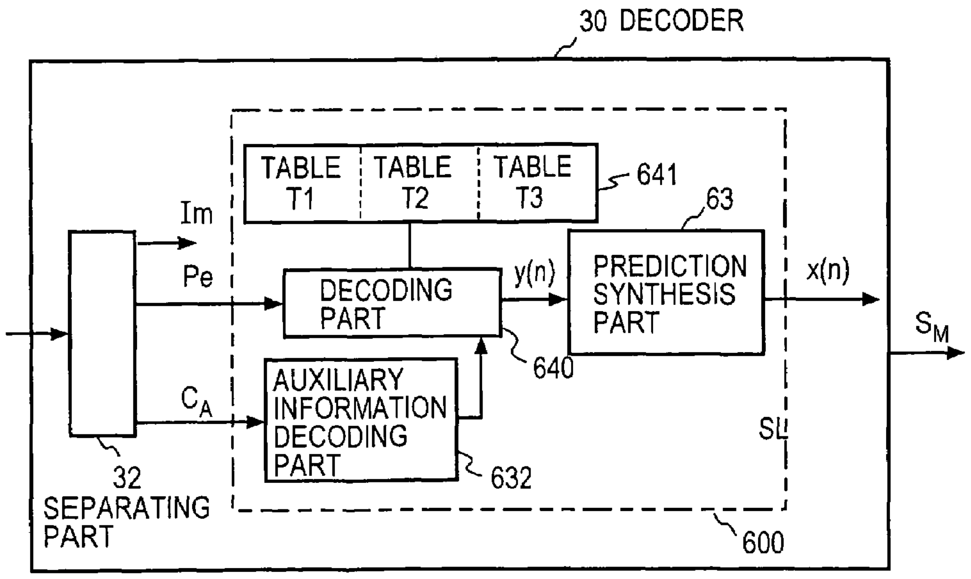
FIG. 42B is a diagram for explaining a decoding-side processing part corresponding to FIG. 42A.

As depicted in FIG. 42B, the processing part 600 of the decoder 30 includes an auxiliary information decoding part 632, a decoding part 640, a decoding table 641, and the prediction synthesis part 63. The auxiliary information decoding part 632 decodes the auxiliary code CA from the separating part 32, and provides the select information ST to the decoding part 640. The decoding table 641 uses the same table as the coding table 530 in the coder 10 of FIG. 42A. The decoding part 640 decodes two prediction error codes Pe for the first and second samples of the random-access starting frame by use of the decoding table T1, and outputs the prediction error signal samples y(0) and y(1). The error code decoding part decodes the subsequent prediction error codes Pe by using the table T2 or T3 specified by the select information ST for each plurality of codes mentioned above, and outputs the prediction error signals ample y(n). The prediction synthesis part 63 performs the prediction synthesis processing described previously with reference to FIG. 20 or 21, and carries out the prediction synthesis processing of the prediction error signal y(n) and outputs the prediction synthesis signal x(n).

Other Modifications

The second and third modes of working are applicable not only to the case of using the autoregressive filter but also generally to FIR filtering or the like as is the case with the first mode of working of the invention. Furthermore, in each of the above-described embodiments the alternative sample sequences AS and AS' may be replaced with high-order bits of the sample sequences, or the alternative samples sequences AS and AS' may be obtained by using only high-order bits of samples of the sample sequences ΔS and ΔS' extracted from the current frame to form the samples sequences AS and AS'.

While in the above the processing of the current frame utilizes the sample sequence in the current frame as a substitute for sample sequences of the preceding or/and succeeding frames, provision may be made to conclude the processing with samples only in the current frame without using such a substitute sample sequence.

Figure 43:
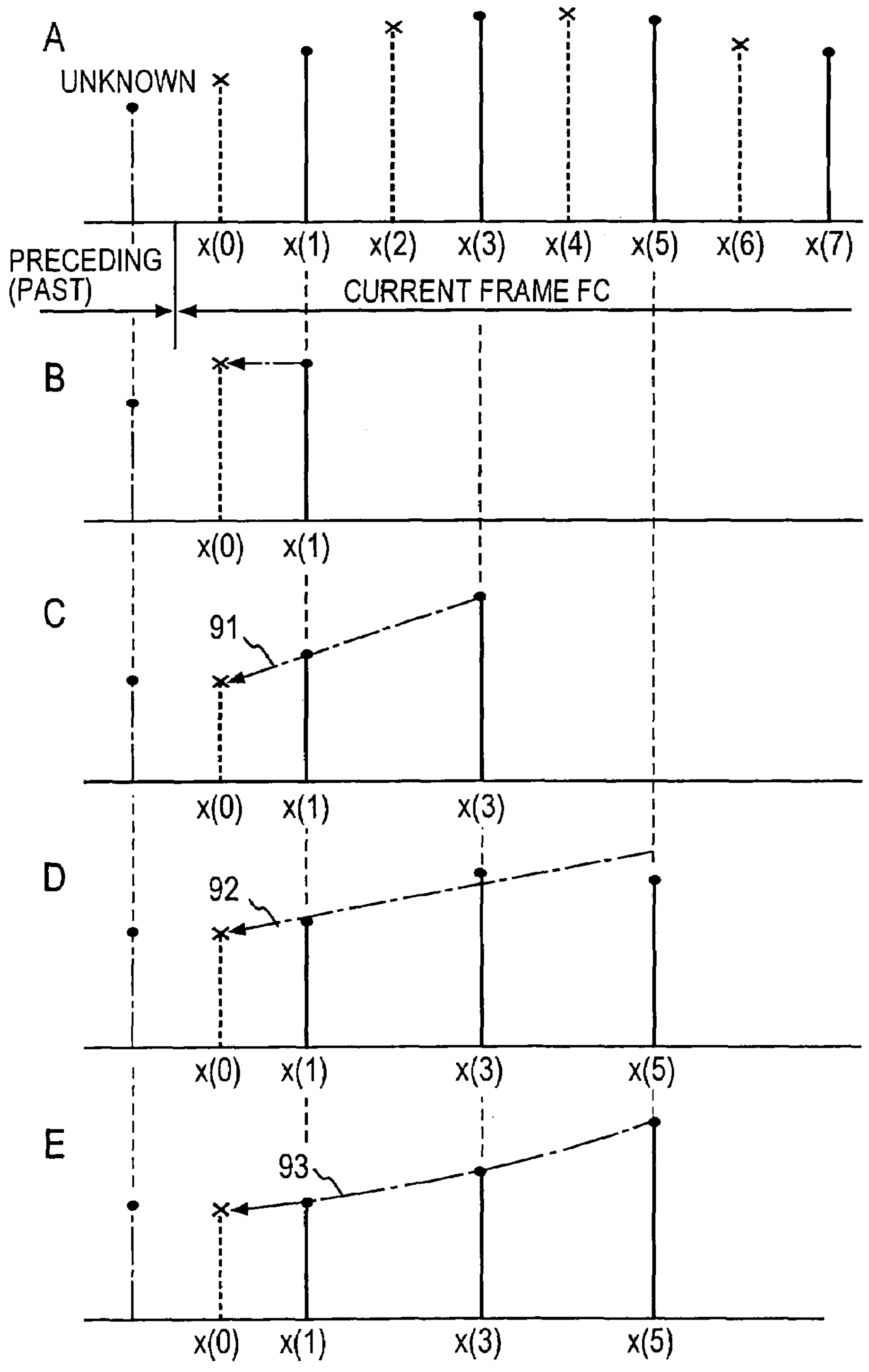
FIG. 43 is a diagram for explaining another embodiment of the present invention.
Figure 44:
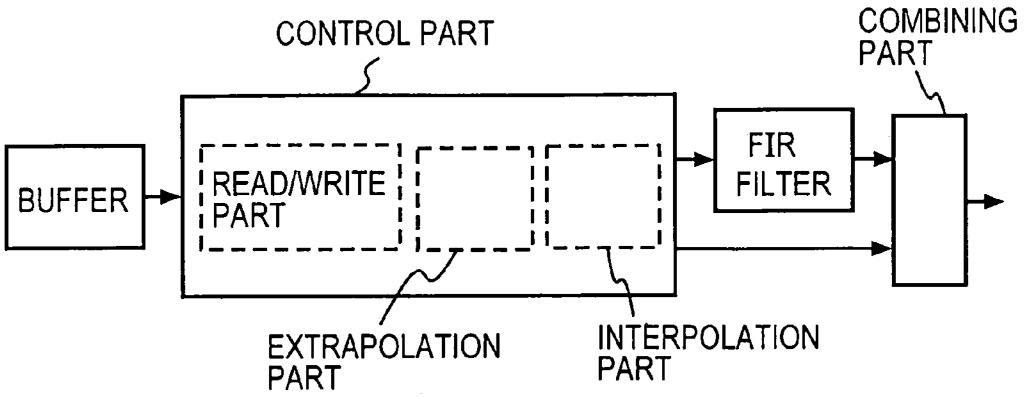
FIG. 44 is a block diagram illustrating the functional configuration of the FIG. 43 embodiment.

For example, in a short filter of a small tap number, a simple extrapolation can be made in the case of smoothing or interpolating a sample value after up-sampling, for instance. For example, in FIGS. 43 and 44, the sample sequence SFC (=x(1), x(3), x(5), . . . ) of the current frame is stored in the buffer; in the case of up-sampling the sample sequence to a twice higher frequency, the processing is carried out as shown in FIG. 43A under control of the control part, that is, the first sample x(0) of the current frame FC is extrapolated by an extrapolation part with the samples x(1) and x(3) neighboring the first sample in the current frame FC, then x(2) is obtained by an interpolation part (by interpolating) as an average value of the samples x(1) and x(3) adjacent thereto on both sides, and the sample x(4) and the subsequent ones are extrapolated by filtering. For example, the sample x(4) is estimated by a 7-tap FIR filter from x(1), x(3), x(5) and x(7). In this instance, the tap coefficients (filter coefficients) of three alternate taps are set to zeros. These estimated samples x(0), x(2) and the input samples x(1), x(3) are combined in a combining part to the filter output to provide the sample sequence shown in FIG. 43A.

For the extrapolation of the sample x(0) the sample x(1) closest thereto is used intact as shown in FIG. 43B. Alternatively, as shown in FIG. 43C, a straight line 91 joining the two neighboring samples x(1) and x(3) is extended and the value at the point of the sample x(0) is used as the value of the sample x(0) (two-point straight-line extrapolation). Alternatively, as shown in FIG. 43D, a straight line (a minimum squares straight line) 92 close to the three neighboring samples x(1), x(3) and x(5) is extended and the value at the sample x(0) is used as the sample x(0) (three-point straight-line extrapolation). Alternatively, as shown in FIG. 43E, a quadratic curve close to the three neighboring samples x(1), x(3) and x(5) is extended and the value at the point of the sample x(0) is used as the sample x(0) (three-point quadratic function extrapolation).

The digital signal to be processed in the above is processed usually on the frame-wise basis, but nay signals can be used as long as they require filtering over the frame preceding or/succeeding the current frame; conversely speaking, the present invention is intended for processing that calls for such filtering, and it is not limited specifically to coding and decoding processing, and in the case of coding and decoding, it is applicable to any of reversible coding, reversible decoding and irreversible coding, irreversible decoding.

The digital processor (identified as processing part in some of the accompanying drawings) of the present invention described above can be implemented by executing programs by a computer. That is, programs for causing the computer to performs respective steps of the above-described various digital signal processing methods of the present invention recorded on a recording medium such as a CD-ROM or magnetic disk, or installed via a communication line into the computer for execution.

According to the embodiments of the present invention described above, it can be said that the digital signal processing method has such a configuration mentioned below.

(A) The digital signal processing method is a processing method using a filter that is used in a coding method for frame-wise coding of a digital signal, and in which the current sample and either of at least p (where p is an integer equal to or greater than 1) immediately preceding samples and Q (where Q is an integer equal to or greater than 1) immediately succeeding samples are linearly coupled, and the sample mentioned herein may be an input signal or an intermediate signal such as a prediction error.

The method is characterized in that:

According to the embodiments of the present invention described above, it can be said that the digital signal processing method has such a configuration mentioned below.

(A) The digital signal processing method is a processing method by a filter which is used in a coding method for coding a digital signal on a frame-wise basis, and in which the current sample and either of at least p (where p is an integer equal to or greater than 1) immediately preceding samples and Q (where Q is an integer equal to or greater than 1) immediately succeeding samples are linearly coupled, and the sample mentioned herein may be an input signal or an intermediate signal such as a prediction error.

The processing method is characterized in that:

an alternative p-sample sequence, which consists of p consecutive samples forming part of the current frame is disposed as the p samples immediately preceding the first sample of the current frame;

the first sample and at least one portion of said immediately preceding alternative sample sequence are linearly coupled by said filter, or an alternative Q-sample sequence, which consists of Q consecutive samples forming part of the current frame, is disposed as the Q samples immediately succeeding the last sample of the current frame; and the last sample and at least one portion of the immediately succeeding alternative samples are linearly coupled by said filter.

Furthermore, it can be said that the digital signal processing method for decoding, for instance, has such a configuration mentioned below.

(B) The method is a processing method using a filter that is used in a decoding method for frame-wise reconstruction of a digital signal by use of a filter, in which the current sample and either of at least p (where p is an integer equal to or greater than 1) immediately preceding samples and Q (where Q is an integer equal to or greater than 1) immediately succeeding samples are linearly coupled, and the sample mentioned herein is an intermediate signal such as a prediction error;

characterized in that:

in the absence of the immediately succeeding frame:

p consecutive samples, which form part of the current frame, are used as the p alternative samples immediately preceding the first sample of the current frame, and the first sample and at least some of the alternative samples are linearly coupled by said filter; and in the absence of the immediately succeeding frame:

Q consecutive samples, which form part of the current frame, are used as Q alternative samples immediately succeeding the last sample of the current frame, and the last sample and at least some of the alternative samples are linearly coupled.

EFFECT OF THE INVENTION

As described above, according to the present invention, processing can be concluded in the frame concerned while maintaining substantially unchanged the continuity and coding efficiency of reconstructed signal that are obtainable in the presence of the immediately preceding or/and succeeding frames. This provides increased performance when random access is required on a frame-by-frame basis or when a packet loss occurs.

The invention claimed is:

1. A digital signal processing method that performs filter or prediction processing of a digital signal on a frame-wise basis, comprising the steps of:

(a-1) at least one of steps of: processing said digital signal while increasing a tap number or prediction order progressively in correspondence to samples from the front position of said frame to a predetermined first position; and decreasing said tap number or prediction order progressively for each sample from a predetermined second position behind said first position to the last position; and (a-2) processing said digital signal while maintaining the tap number or prediction order unchanged for samples that are not subjected to the processing by said step (a-1).

2. The digital signal processing method of claim 1, wherein said processing is FIR filter processing.

3. The digital signal processing method of claim 1, wherein said processing is autoregressive linear prediction error generation processing.

4. The digital signal processing method of claim 3, wherein said autoregressive linear prediction error generation processing is an operation using PARCOR coefficients.

* * * * *